(12) United States Patent
Zhang et al.

(10) Patent No.: US 11,251,164 B2
(45) Date of Patent: Feb. 15, 2022

(54) MULTI-LAYER CONVERSION MATERIAL FOR DOWN CONVERSION IN SOLID STATE LIGHTING

(71) Applicant: CreeLED, Inc., Durham, NC (US)

(72) Inventors: Fan Zhang, Goleta, CA (US); James Ibbetson, Santa Barbara, CA (US); Bernd Keller, Santa Barbara, CA (US); Thodore Lowes, Lompoc, CA (US); Antony Van De Ven, Sai Kung (HK); Deborah Kircher, Santa Barbara, CA (US); Tao Feng Gilbert, Goleta, CA (US); Peter Andrews, Durham, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 14/453,482

(22) Filed: Aug. 6, 2014

(65) Prior Publication Data

US 2014/0367713 A1 Dec. 18, 2014
US 2021/0366880 A9 Nov. 25, 2021

Related U.S. Application Data

(63) Continuation-in-part of application No. 13/028,863, filed on Feb. 16, 2011, now Pat. No. 9,275,979, which
(Continued)

(51) Int. Cl.
*H01L 25/075* (2006.01)
*H01L 33/54* (2010.01)
(Continued)

(52) U.S. Cl.
CPC .......... *H01L 25/0753* (2013.01); *F21K 9/232* (2016.08); *F21K 9/64* (2016.08);
(Continued)

(58) Field of Classification Search
CPC .......... F21K 9/56; F21K 9/64; H01L 33/504; H01L 25/0753; H01L 33/502;
(Continued)

(56) References Cited

U.S. PATENT DOCUMENTS 2,394,992 A 2/1946 Franck ..................... 362/311.12
3,143,592 A 8/1964 August ........................ 174/16.3
(Continued)

FOREIGN PATENT DOCUMENTS

CN 1425117 6/2003
CN 1465106 A 12/2003
(Continued)

OTHER PUBLICATIONS

Noriyasu, Tanimoto, Japenese Patent Application 2007-173397, Jul. 2007, machine translation.*
(Continued)

*Primary Examiner* — Tracie Y Green
(74) *Attorney, Agent, or Firm* — Withrow + Terranova, P.L.L.C.

(57) ABSTRACT

Light emitting diodes are disclosed that utilize multiple conversion materials in the conversion process in order to achieve the desired emission color point. Different embodiments of the present invention can comprise different phosphor types in separate layers on, above or around one or a plurality of LED chips to achieve the desired light conversion. The LEDs can then emit a desired combination of light from the LED chips and conversion material. In some embodiments, conversion materials can be applied as layers of different phosphor types in order of longest emission wavelength phosphor first, followed by shorter emission phosphors in sequence as opposed to applying in a homogeneously mixed phosphor converter. The conversion material layers can be applied as a blanket over the LED chips
(Continued)

and the area surrounding the chip, such as the surface of a submount holding the LED chips.

27 Claims, 8 Drawing Sheets

Related U.S. Application Data is a continuation-in-part of application No. 13/649,052, filed on Oct. 10, 2012, now Pat. No. 9,048,396.

(51) Int. Cl.

| | |
|---|---|
| *H01L 33/60* | (2010.01) |
| *H01L 33/50* | (2010.01) |
| *F21V 3/12* | (2018.01) |
| *F21V 3/02* | (2006.01) |
| *F21K 9/64* | (2016.01) |
| *F21K 9/232* | (2016.01) |
| *F21Y 113/13* | (2016.01) |
| *F21Y 115/10* | (2016.01) |
| *F21Y 113/00* | (2016.01) |

(52) U.S. Cl.
CPC .............. *F21V 3/02* (2013.01); *F21V 3/12* (2018.02); *H01L 33/504* (2013.01); *H01L 33/507* (2013.01); *H01L 33/54* (2013.01); *H01L 33/60* (2013.01); *F21Y 2113/005* (2013.01); *F21Y 2113/13* (2016.08); *F21Y 2115/10* (2016.08); *H01L 2224/32245* (2013.01); *H01L 2224/48091* (2013.01); *H01L 2224/48227* (2013.01); *H01L 2224/48247* (2013.01); *H01L 2224/73265* (2013.01); *H01L 2924/0002* (2013.01); *H01L 2924/181* (2013.01)

(58) Field of Classification Search
CPC .......... H01L 33/507; H01L 2924/0002; H05B 33/10; H05B 33/14
USPC .................................. 313/498–512
See application file for complete search history.

(56) References Cited

U.S. PATENT DOCUMENTS

| | | | |
|---|---|---|---|
| 3,581,162 A | 5/1971 | Wheatley | 317/234 |
| 3,805,937 A | 4/1974 | Hatanaka et al. | |
| 3,875,456 A | 4/1975 | Kano et al. | |
| 3,927,290 A | 12/1975 | Denley | |
| 4,120,026 A | 10/1978 | Tsuchihashi et al. | |
| 4,204,246 A | 5/1980 | Arii et al. | 361/699 |
| 4,219,871 A | 8/1980 | Larrimore | 362/264 |
| 4,325,146 A | 4/1982 | Lennington | |
| 4,408,157 A | 10/1983 | Beaubien | |
| 4,420,398 A | 12/1983 | Castino | |
| 4,710,699 A | 12/1987 | Miyamoto | |
| 4,727,289 A | 2/1988 | Uchida | |
| 4,772,885 A | 9/1988 | Uehara et al. | |
| 4,918,497 A | 4/1990 | Edmond | 357/17 |
| 4,966,862 A | 10/1990 | Edmond | 437/100 |
| 5,027,168 A | 6/1991 | Edmond | 357/17 |
| 5,087,883 A | 2/1992 | Hoffman | |
| 5,140,220 A | 8/1992 | Hasegawa | |
| 5,166,815 A | 11/1992 | Elderfield | |
| 5,210,051 A | 5/1993 | Carter, Jr. | 437/107 |
| 5,264,997 A | 11/1993 | Hutchinsson et al. | |
| 5,338,944 A | 8/1994 | Edmond et al. | 257/76 |
| 5,393,993 A | 2/1995 | Edmond et al. | 257/77 |
| 5,407,799 A | 4/1995 | Studier | |
| 5,410,519 A | 4/1995 | Hall et al. | |
| 5,416,342 A | 5/1995 | Edmond et al. | 257/76 |
| 5,463,280 A | 10/1995 | Johnson | |
| 5,477,436 A | 12/1995 | Betling et al. | |
| 5,519,596 A | 5/1996 | Woolverton | |
| 5,523,589 A | 6/1996 | Edmond et al. | 257/77 |
| 5,535,230 A | 7/1996 | Abe | |
| 5,561,346 A | 10/1996 | Byrne | 313/512 |
| 5,563,849 A | 10/1996 | Hall et al. | |
| 5,581,683 A | 12/1996 | Bertignoll | |
| 5,585,783 A | 12/1996 | Hall | |
| 5,604,135 A | 2/1997 | Edmond et al. | 437/22 |
| 5,631,190 A | 5/1997 | Negley | 438/33 |
| 5,655,830 A | 8/1997 | Ruskouski | |
| 5,688,042 A | 11/1997 | Madadi | |
| 5,739,554 A | 4/1998 | Edmond et al. | 257/95 |
| 5,779,924 A | 7/1998 | Krames et al. | 216/64 |
| 5,803,579 A | 9/1998 | Turnbull et al. | |
| 5,806,965 A | 9/1998 | Deese | 362/249 |
| 5,838,101 A | 11/1998 | Pappalardo | 313/487 |
| 5,850,126 A | 12/1998 | Kanbar | |
| 5,851,063 A | 12/1998 | Doughty et al. | |
| 5,890,794 A | 4/1999 | Abtahi et al. | |
| 5,912,477 A | 6/1999 | Negley | 257/95 |
| 5,931,570 A | 8/1999 | Yamuro | |
| 5,934,798 A | 8/1999 | Roller et al. | 362/497 |
| 5,947,588 A | 9/1999 | Huang | |
| 5,949,347 A | 9/1999 | Wu | |
| 5,956,106 A | 9/1999 | Petersen | |
| 5,959,316 A | 9/1999 | Lowery | |
| 6,043,509 A | 3/2000 | Kurihara et al. | |
| 6,066,861 A | 5/2000 | Hohn et al. | |
| 6,071,795 A | 6/2000 | Cheung et al. | 438/458 |
| 6,076,936 A | 6/2000 | George | |
| 6,084,250 A | 7/2000 | Justel et al. | |
| 6,095,666 A | 8/2000 | Salam | |
| 6,120,600 A | 9/2000 | Edmond et al. | 117/89 |
| 6,132,072 A | 10/2000 | Turnbull et al. | |
| 6,144,429 A | 11/2000 | Nakai et al. | |
| 6,147,367 A | 11/2000 | Yang et al. | 257/88 |
| 6,187,606 B1 | 2/2001 | Edmond et al. | 438/46 |
| 6,187,735 B1 | 2/2001 | Gambogi et al. | |
| 6,201,262 B1 | 3/2001 | Edmond et al. | 257/77 |
| 6,212,213 B1 | 4/2001 | Weber et al. | |
| 6,218,785 B1 | 4/2001 | Incerti | 315/185 S |
| 6,220,722 B1 | 4/2001 | Begemann | 362/231 |
| 6,220,731 B1 | 4/2001 | Ryan | 362/373 |
| 6,227,679 B1 | 5/2001 | Zhang et al. | |
| 6,234,648 B1 | 5/2001 | Borner et al. | |
| 6,250,774 B1 | 6/2001 | Begemann et al. | |
| 6,252,254 B1 | 6/2001 | Soules et al. | |
| 6,255,670 B1 | 7/2001 | Srivastava et al. | |
| 6,270,722 B1 | 8/2001 | Yang et al. | 422/37 |
| 6,276,822 B1 | 8/2001 | Bedrosian et al. | |
| 6,278,135 B1 | 8/2001 | Srivastava et al. | |
| 6,292,901 B1 | 9/2001 | Lys et al. | |
| 6,294,800 B1 | 9/2001 | Duggal et al. | |
| 6,319,425 B1 | 11/2001 | Tasaki et al. | |
| 6,329,676 B1 | 12/2001 | Takayama et al. | |
| 6,335,538 B1 | 1/2002 | Prutohi et al. | |
| 6,337,536 B1 | 1/2002 | Matsubara et al. | |
| 6,348,766 B1 | 2/2002 | Ohishi et al. | |
| 6,350,041 B1 | 2/2002 | Tarsa et al. | |
| 6,357,889 B1 | 3/2002 | Duggal et al. | |
| 6,373,188 B1 | 4/2002 | Johnson et al. | |
| 6,394,621 B1 | 5/2002 | Hanewinkel | |
| 6,404,131 B1 | 6/2002 | Kawano et al. | 315/82 |
| 6,420,199 B1 | 7/2002 | Coman et al. | 438/22 |
| 6,429,583 B1 | 8/2002 | Levinson et al. | |
| 6,441,558 B1 | 8/2002 | Muthu | |
| 6,465,961 B1 | 10/2002 | Cao | 315/58 |
| 6,480,299 B1 | 11/2002 | Drakopoulos et al. | |
| 6,501,100 B1 | 12/2002 | Srivastava et al. | |
| 6,504,179 B1 | 1/2003 | Ellens et al. | |
| 6,504,180 B1 | 1/2003 | Heremans et al. | 257/98 |
| 6,513,949 B1 | 2/2003 | Marshall et al. | |
| 6,517,221 B1 | 2/2003 | Xie | 362/373 |
| 6,522,065 B1 | 2/2003 | Srivastava et al. | |
| 6,523,978 B1 | 2/2003 | Huang | 362/252 |
| 6,538,371 B1 | 3/2003 | Duggal et al. | |
| 6,547,249 B2 | 4/2003 | Collins, III et al. | |
| 6,550,949 B1 | 4/2003 | Bauer et al. | |

(56) References Cited

U.S. PATENT DOCUMENTS

| | | | |
|---|---|---|---|
| 6,550,953 B1 | 4/2003 | Ichikawa et al. | |
| 6,552,495 B1 | 4/2003 | Chang | |
| 6,559,075 B1 | 5/2003 | Kelly et al. | 438/795 |
| 6,577,073 B2 | 6/2003 | Shimizu et al. | |
| 6,578,986 B2 | 6/2003 | Swaris et al. | |
| 6,592,810 B2 | 7/2003 | Nishida et al. | |
| 6,600,175 B1 | 7/2003 | Baretz et al. | |
| 6,600,324 B2 | 7/2003 | St-Germain | |
| 6,603,258 B1 | 8/2003 | Meuller-Mach et al. | |
| 6,608,485 B2 | 9/2003 | St-Germain | |
| 6,616,862 B2 | 9/2003 | Srivastava et al. | |
| 6,624,350 B2 | 9/2003 | Nixon et al. | |
| 6,634,770 B2 | 10/2003 | Cao | 362/294 |
| 6,635,503 B2 | 10/2003 | Andrews et al. | |
| 6,636,003 B2 | 11/2003 | Rahm et al. | |
| 6,642,666 B1 | 11/2003 | St-Germain | |
| 6,657,236 B1 | 12/2003 | Thibeault et al. | 257/98 |
| 6,659,632 B2 | 12/2003 | Chen | |
| 6,685,852 B2 | 2/2004 | Setlur et al. | |
| 6,686,691 B1 | 2/2004 | Mueller et al. | |
| 6,692,136 B2 | 2/2004 | Marshall et al. | |
| 6,703,173 B2 | 3/2004 | Lu et al. | |
| 6,709,132 B2 | 3/2004 | Ishibashi | |
| 6,712,486 B1 | 3/2004 | Popovich et al. | |
| 6,737,801 B2 | 5/2004 | Ragle | |
| 6,744,194 B2 | 6/2004 | Fukasawa et al. | |
| 6,746,885 B2 | 6/2004 | Cao | 438/26 |
| 6,758,582 B1 | 7/2004 | Hsiao | 362/302 |
| 6,762,563 B2 | 7/2004 | St-Germain | |
| 6,764,202 B1 | 7/2004 | Herring et al. | 362/371 |
| 6,784,463 B2 | 8/2004 | Catnras et al. | |
| 6,791,257 B1 | 9/2004 | Sato et al. | |
| 6,800,500 B2 | 10/2004 | Coman et al. | 438/22 |
| 6,803,607 B1 | 10/2004 | Chan et al. | |
| 6,809,347 B2 | 10/2004 | Tasch et al. | |
| 6,841,804 B1 | 1/2005 | Lung-Chien et al. | |
| 6,848,819 B1 | 2/2005 | Arndt et al. | |
| 6,851,834 B2 | 2/2005 | Leysath | |
| 6,860,620 B2 | 3/2005 | Kuan et al. | 362/294 |
| 6,864,513 B2 | 3/2005 | Lin et al. | |
| 6,880,954 B2 | 4/2005 | Ollett et al. | |
| 6,882,101 B2 | 4/2005 | Ragle | |
| 6,885,035 B2 | 4/2005 | Bhat et al. | |
| 6,910,794 B2 | 6/2005 | Rice | 362/547 |
| 6,914,267 B2 | 7/2005 | Fukasawa et al. | |
| 6,936,857 B2 | 8/2005 | Doxsee et al. | |
| 6,943,380 B2 | 9/2005 | Ota et al. | |
| 6,948,829 B2 | 9/2005 | Verdes et al. | 362/227 |
| 6,957,899 B2 | 10/2005 | Jiang et al. | |
| 6,967,116 B2 | 11/2005 | Negley | |
| 6,980,176 B2 | 12/2005 | Matsumoto et al. | |
| 6,982,518 B2 | 1/2006 | Chou et al. | |
| 6,997,580 B2 | 2/2006 | Wong | 362/311.02 |
| 7,005,679 B2 | 2/2006 | Tarsa et al. | |
| 7,008,078 B2 | 3/2006 | Shimizu et al. | |
| 7,009,199 B2 | 3/2006 | Hall | |
| 7,009,343 B2 | 3/2006 | Lim et al. | |
| 7,014,336 B1 | 3/2006 | Ducharme et al. | |
| 7,023,019 B2 | 4/2006 | Maeda et al. | |
| 7,029,935 B2 | 4/2006 | Negley et al. | |
| 7,048,412 B2 | 5/2006 | Martin et al. | |
| 7,061,454 B2 | 6/2006 | Sasuga et al. | |
| 7,066,623 B2 | 6/2006 | Lee et al. | |
| 7,080,924 B2 | 7/2006 | Tseng et al. | |
| 7,083,302 B2 | 8/2006 | Chen et al. | |
| 7,086,756 B2 | 8/2006 | Maxik | |
| 7,086,767 B2 | 8/2006 | Sidwell et al. | |
| 7,093,958 B2 | 8/2006 | Coushaine | |
| 7,094,362 B2 | 8/2006 | Setlur et al. | 252/301 |
| 7,095,056 B2 | 8/2006 | Vitta | |
| 7,102,172 B2 | 9/2006 | Lynch et al. | |
| 7,116,308 B1 | 10/2006 | Heeks et al. | |
| 7,118,262 B2 | 10/2006 | Negley et al. | |
| 7,125,143 B2 | 10/2006 | Hacker | |
| 7,135,664 B2 | 11/2006 | Vornsand et al. | |
| 7,140,753 B2 | 11/2006 | Wang et al. | 362/294 |
| 7,144,135 B2 | 12/2006 | Martin et al. | |
| 7,160,012 B2 | 1/2007 | Hilscher et al. | 362/555 |
| 7,160,120 B2 | 1/2007 | Zhang et al. | |
| 7,164,231 B2 | 1/2007 | Choi et al. | |
| 7,165,866 B2 | 1/2007 | Li | |
| 7,172,314 B2 | 2/2007 | Currie et al. | |
| 7,195,944 B2 | 3/2007 | Tran et al. | |
| 7,207,691 B2 | 4/2007 | Lee et al. | |
| 7,213,940 B1 | 5/2007 | Van De Ven | |
| 7,213,942 B2 | 5/2007 | Jiang et al. | |
| 7,215,074 B2 | 5/2007 | Shimizu et al. | |
| 7,221,044 B2 | 5/2007 | Fan et al. | |
| 7,232,212 B2 | 6/2007 | Iwase | |
| D546,980 S | 7/2007 | Lo | |
| 7,239,085 B2 | 7/2007 | Kawamura | |
| 7,250,715 B2 | 7/2007 | Meuller et al. | |
| 7,255,457 B2 | 8/2007 | Ducharme et al. | |
| 7,256,557 B2 | 9/2007 | Lim et al. | |
| 7,268,370 B2 | 9/2007 | Ueda | |
| 7,270,446 B2 | 9/2007 | Chang et al. | 362/294 |
| D553,267 S | 10/2007 | Yuen | |
| 7,322,732 B2 | 1/2008 | Negley et al. | |
| 7,329,024 B2 | 2/2008 | Lynch et al. | |
| 7,350,936 B2 | 4/2008 | Ducharme et al. | 362/231 |
| 7,354,174 B1 | 4/2008 | Yan | |
| 7,358,954 B2 | 4/2008 | Negley | |
| 7,365,485 B2 | 4/2008 | Fukasawa et al. | |
| 7,377,674 B2 | 5/2008 | Klinkman et al. | 362/484 |
| 7,387,405 B2 | 6/2008 | Ducharme et al. | |
| 7,396,142 B2 | 7/2008 | Laizure, Jr. et al. | |
| 7,405,857 B2 | 7/2008 | Ma et al. | 359/261 |
| 7,413,325 B2 | 8/2008 | Chen | 362/249.01 |
| 7,420,221 B2 | 9/2008 | Nagai | |
| 7,422,504 B2 | 9/2008 | Maeda et al. | |
| D581,556 S | 11/2008 | To et al. | D26/2 |
| 7,453,195 B2 | 11/2008 | Radkov | |
| 7,474,044 B2 | 1/2009 | Ge | |
| 7,547,124 B2 | 6/2009 | Chang et al. | 362/373 |
| 7,549,782 B2 | 6/2009 | Ng et al. | 362/555 |
| 7,553,047 B2 | 6/2009 | Shin et al. | 362/294 |
| 7,588,351 B2 | 9/2009 | Meyer et al. | 362/294 |
| 7,600,882 B1 | 10/2009 | Morejon et al. | 362/84 |
| 7,607,802 B2 | 10/2009 | Kang et al. | 362/294 |
| 7,614,759 B2 | 11/2009 | Negley | |
| 7,618,157 B1 | 11/2009 | Galvez | |
| 7,663,152 B2 | 2/2010 | Bierhuizen | |
| 7,663,315 B1 | 2/2010 | Hulse | |
| 7,686,478 B1 | 3/2010 | Hulse et al. | |
| 7,710,016 B2 * | 5/2010 | Miki | H01L 33/505 257/98 |
| 7,726,836 B2 | 6/2010 | Chen | |
| 7,740,365 B2 | 6/2010 | Huttner et al. | 362/97 |
| 7,753,568 B2 | 7/2010 | Hu et al. | 362/373 |
| 7,810,954 B2 | 10/2010 | Kolodin | 362/277 |
| 7,824,065 B2 | 11/2010 | Maxik | |
| D629,928 S | 12/2010 | Chen | |
| 7,884,538 B2 | 2/2011 | Mitsuishi et al. | 313/502 |
| 7,909,481 B1 | 3/2011 | Zhang | 362/249.02 |
| 7,976,335 B2 | 7/2011 | Weber et al. | 439/487 |
| 7,989,236 B2 | 8/2011 | Yamaguchi et al. | 438/26 |
| 7,999,283 B2 | 8/2011 | Chakraborty et al. | |
| 8,021,025 B2 | 9/2011 | Lee | |
| 8,183,758 B2 * | 5/2012 | Okishiro | G02F 1/133609 252/301.4 R |
| 8,235,571 B2 | 8/2012 | Park | 362/555 |
| 8,253,316 B2 | 8/2012 | Sun et al. | |
| 8,272,762 B2 | 9/2012 | Maxik et al. | |
| 8,274,241 B2 | 9/2012 | Guest et al. | 315/294 |
| 8,277,082 B2 | 10/2012 | Dassanayake et al. | |
| 8,282,250 B1 | 10/2012 | Dassanayake et al. | |
| 8,292,468 B2 | 10/2012 | Narendran et al. | |
| 8,309,969 B2 | 11/2012 | Suehiro et al. | 257/79 |
| 8,314,537 B2 | 11/2012 | Gielen et al. | 313/46 |
| 8,322,896 B2 | 12/2012 | Falicoff et al. | |
| 8,348,470 B2 | 1/2013 | Liu et al. | 362/294 |
| 8,368,100 B2 | 2/2013 | Donofrio et al. | |
| 8,371,722 B2 | 2/2013 | Carroll | |
| 8,400,051 B2 | 3/2013 | Hakata et al. | |

(56) References Cited

U.S. PATENT DOCUMENTS

| | | |
|---|---|---|
| 8,410,512 B2 | 4/2013 | Andrews .................... 257/99 |
| 8,415,865 B2 | 4/2013 | Liang et al. |
| 8,421,320 B2 | 4/2013 | Chuang |
| 8,421,321 B2 | 4/2013 | Chuang |
| 8,421,322 B2 | 4/2013 | Carroll et al. |
| 8,449,154 B2 | 5/2013 | Uemoto et al. |
| 8,502,468 B2 | 8/2013 | Li et al. |
| 8,558,252 B2 | 9/2013 | Ibbetson et al. |
| 8,564,004 B2 | 10/2013 | Tarsa et al. |
| 8,568,009 B2 | 10/2013 | Chiang et al. ............... 362/563 |
| 8,641,237 B2 | 2/2014 | Chuang |
| 8,653,723 B2 | 2/2014 | Cao et al. |
| 8,696,168 B2 | 4/2014 | Li et al. |
| 8,740,415 B2 | 6/2014 | Wheelock |
| 8,750,671 B1 | 6/2014 | Kelly et al. |
| 8,752,984 B2 | 6/2014 | Lenk et al. |
| 8,760,042 B2 | 6/2014 | Sakai et al. |
| 8,922,106 B2 | 12/2014 | Helbing et al. ............ 313/318.11 |
| 9,316,386 B2 | 4/2016 | Breidenassel |
| 2001/0002049 A1 | 5/2001 | Rech et al. |
| 2002/0006044 A1 | 1/2002 | Harbers et al. |
| 2002/0015013 A1 | 2/2002 | Ragle |
| 2002/0047516 A1 | 4/2002 | Iwasa et al. ................. 313/512 |
| 2002/0068201 A1 | 6/2002 | Vaudo et al. ................. 428/704 |
| 2002/0070681 A1 | 6/2002 | Shimizu et al. |
| 2002/0087532 A1 | 7/2002 | Baratz et al. |
| 2002/0114169 A1 | 8/2002 | Harada et al. ............... 362/558 |
| 2002/0123164 A1 | 9/2002 | Slater, Jr. et al. ............ 438/39 |
| 2002/0149576 A1 | 10/2002 | Tanaka et al. |
| 2003/0006418 A1 | 1/2003 | Emerson et al. ............... 257/79 |
| 2003/0021113 A1 | 1/2003 | Begemann |
| 2003/0026096 A1 | 2/2003 | Ellens et al. |
| 2003/0030063 A1 | 2/2003 | Sosniak et al. |
| 2003/0038291 A1 | 2/2003 | Cao |
| 2003/0042908 A1 | 3/2003 | St-Germain |
| 2003/0042914 A1 | 3/2003 | St-Germain |
| 2003/0067302 A1 | 4/2003 | St-Germain |
| 2003/0067773 A1 | 4/2003 | Marshall et al. |
| 2003/0222268 A1 | 4/2003 | Yocom et al. |
| 2003/0081419 A1 | 5/2003 | Jacob ........................ 362/364 |
| 2003/0089918 A1 | 5/2003 | Hiller et al. |
| 2003/0146411 A1 | 8/2003 | Srivastava et al. |
| 2003/0185005 A1 | 10/2003 | Sommers et al. |
| 2003/0209997 A1 | 11/2003 | St-Germain et al. |
| 2004/0021629 A1 | 2/2004 | Sasuga et al. |
| 2004/0046178 A1 | 3/2004 | Sano |
| 2004/0056260 A1 | 3/2004 | Slater, Jr. et al. ............ 257/79 |
| 2004/0105264 A1 | 6/2004 | Spero |
| 2004/0159846 A1 | 8/2004 | Doxsee |
| 2004/0201990 A1 | 10/2004 | Neyer |
| 2004/0212998 A1 | 10/2004 | Mohacsi |
| 2004/0218387 A1 | 11/2004 | Gerlach |
| 2004/0218388 A1 | 11/2004 | Suzuki |
| 2004/0222735 A1 | 11/2004 | Ragle |
| 2004/0223315 A1 | 11/2004 | Suehiro et al. ................ 362/84 |
| 2004/0239839 A1 | 12/2004 | Hong |
| 2004/0264193 A1 | 12/2004 | Okumura |
| 2004/0264212 A1 | 12/2004 | Chung et al. |
| 2005/0006659 A1 | 1/2005 | Ng et al. |
| 2005/0007306 A1 | 1/2005 | Iisaka et al. |
| 2005/0052378 A1 | 3/2005 | Hacker |
| 2005/0068776 A1 | 3/2005 | Ge ............................. 362/296 |
| 2005/0093004 A1 | 5/2005 | Yoo |
| 2005/0133808 A1 | 6/2005 | Uraya et al. |
| 2005/0151138 A1 | 7/2005 | Slater, Jr. et al. ............ 257/79 |
| 2005/0168990 A1 | 8/2005 | Nagata et al. ............... 362/294 |
| 2005/0174780 A1 | 8/2005 | Park ........................... 362/294 |
| 2005/0184638 A1* | 8/2005 | Mueller ............ C09K 11/0883 313/485 |
| 2005/0190141 A1 | 9/2005 | Roth et al. |
| 2005/0215000 A1 | 9/2005 | Negley ........................ 438/200 |
| 2005/0219060 A1 | 10/2005 | Curran et al. ............ 340/815.45 |
| 2005/0225988 A1 | 10/2005 | Chaves et al. |
| 2005/0227379 A1 | 10/2005 | Donofrio ........................ 438/4 |
| 2005/0231976 A1 | 10/2005 | Keuper et al. |
| 2005/0242711 A1 | 11/2005 | Bloomfield |
| 2005/0243556 A1 | 11/2005 | Lynch |
| 2005/0251698 A1 | 11/2005 | Lynch et al. |
| 2005/0253151 A1 | 11/2005 | Sakai et al. |
| 2005/0253153 A1 | 11/2005 | Harada |
| 2005/0259423 A1 | 11/2005 | Heuser |
| 2005/0274972 A1 | 12/2005 | Roth et al. |
| 2005/0276053 A1 | 12/2005 | Nortrup et al. ............. 362/294 |
| 2006/0012989 A1 | 1/2006 | Lee |
| 2006/0022582 A1 | 2/2006 | Radkov |
| 2006/0060872 A1 | 3/2006 | Edmond et al. |
| 2006/0061259 A1 | 3/2006 | Negley ........................ 313/499 |
| 2006/0063289 A1 | 3/2006 | Negley et al. ................ 438/26 |
| 2006/0067073 A1 | 3/2006 | Ting |
| 2006/0090790 A1 | 5/2006 | Kobayashi et al. |
| 2006/0097245 A1 | 5/2006 | Aanegola et al. ............. 257/26 |
| 2006/0097385 A1 | 5/2006 | Negley ........................ 257/722 |
| 2006/0105482 A1 | 5/2006 | Alferink et al. |
| 2006/0105485 A1 | 5/2006 | Basin et al. |
| 2006/0115482 A1 | 5/2006 | Alferink et al. ............... 438/22 |
| 2006/0124953 A1 | 5/2006 | Alferink |
| 2006/0113548 A1 | 6/2006 | Chen et al. |
| 2006/0138435 A1 | 6/2006 | Tarsa et al. ................... 257/89 |
| 2006/0138937 A1 | 6/2006 | Ibbetson |
| 2006/0152140 A1 | 7/2006 | Brandes ........................ 313/503 |
| 2006/0152172 A9 | 7/2006 | Mueller et al. |
| 2006/0152820 A1 | 7/2006 | Lien et al. ................... 359/726 |
| 2006/0180774 A1 | 8/2006 | Endo .......................... 250/485.1 |
| 2006/0181192 A1 | 8/2006 | Radkov |
| 2006/0180818 A1 | 9/2006 | Nagai |
| 2006/0202105 A1 | 9/2006 | Krames et al. |
| 2006/0226759 A1 | 10/2006 | Masuda et al. |
| 2006/0227558 A1 | 10/2006 | Osawa et al. ............... 362/351 |
| 2006/0245184 A1 | 11/2006 | Galli |
| 2006/0250792 A1 | 11/2006 | Izardel ........................ 362/231 |
| 2006/0268555 A1 | 11/2006 | Kelly |
| 2007/0001188 A1 | 1/2007 | Lee |
| 2007/0001994 A1 | 1/2007 | Roth |
| 2007/0041220 A1 | 2/2007 | Lynch |
| 2007/0047232 A1 | 3/2007 | Kim et al. |
| 2007/0051966 A1 | 3/2007 | Higashi |
| 2007/0069663 A1 | 3/2007 | Burdalski et al. |
| 2007/0090381 A1 | 4/2007 | Otsuka et al. |
| 2007/0090737 A1 | 4/2007 | Hu et al. ...................... 313/11 |
| 2007/0091633 A1 | 4/2007 | Harrity et al. |
| 2007/0137074 A1 | 6/2007 | Van De Ven et al. |
| 2007/0139920 A1 | 6/2007 | Van De Ven et al. |
| 2007/0139923 A1 | 6/2007 | Negley et al. |
| 2007/0139938 A1 | 6/2007 | Petroski |
| 2007/0139949 A1 | 6/2007 | Tanda et al. ................. 362/551 |
| 2007/0170447 A1 | 6/2007 | Negley |
| 2007/0158668 A1 | 7/2007 | Tarsa et al. .................... 21/98 |
| 2007/0165408 A1 | 7/2007 | Li |
| 2007/0171145 A1 | 7/2007 | Coleman et al. |
| 2007/0182299 A1 | 8/2007 | Ouderkirk .................... 313/110 |
| 2007/0202623 A1 | 8/2007 | Gao |
| 2007/0206375 A1 | 9/2007 | Lys |
| 2007/0210326 A1 | 9/2007 | Kurihara |
| 2007/0215890 A1 | 9/2007 | Harbers et al. .............. 257/98 |
| 2007/0223219 A1 | 9/2007 | Medendorp |
| 2007/0236911 A1 | 10/2007 | Negley |
| 2007/0247414 A1 | 10/2007 | Roberta |
| 2007/0247847 A1 | 11/2007 | Villard |
| 2007/0262337 A1 | 11/2007 | Villard |
| 2007/0263393 A1 | 11/2007 | Van De Ven |
| 2007/0263405 A1 | 11/2007 | Ng et al. ..................... 362/555 |
| 2007/0267976 A1 | 11/2007 | Bohler et al. ............... 315/112 |
| 2007/0267983 A1 | 11/2007 | Van De Ven et al. |
| 2007/0274063 A1 | 11/2007 | Negley |
| 2007/0274080 A1 | 11/2007 | Negley et al. ............... 362/341 |
| 2007/0276606 A1 | 11/2007 | Radkov |
| 2007/0278503 A1 | 12/2007 | Van De Ven et al. |
| 2007/0278934 A1 | 12/2007 | Van De Ven et al. |
| 2007/0278974 A1 | 12/2007 | Van De Ven |
| 2007/0279440 A1 | 12/2007 | Negley |
| 2007/0279903 A1 | 12/2007 | Negley et al. |
| 2007/0280624 A1 | 12/2007 | Negley et al. |
| 2007/0285924 A1 | 12/2007 | Morris et al. ............... 362/264 |
| 2007/0297179 A1 | 12/2007 | Leung et al. |

(56) References Cited

U.S. PATENT DOCUMENTS

| | | |
|---|---|---|
| 2007/0297183 A1 | 12/2007 | Coushaine |
| 2008/0023711 A1* | 1/2008 | Tarsa .................. H01L 33/486 |
| | | 257/98 |
| 2008/0037257 A1 | 2/2008 | Bolta |
| 2008/0055908 A1 | 3/2008 | Wu et al. ..................... 362/294 |
| 2008/0062694 A1 | 3/2008 | Lai et al. ..................... 362/294 |
| 2008/0067640 A1 | 3/2008 | Do et al. |
| 2008/0074032 A1 | 3/2008 | Yano et al. |
| 2008/0080165 A1 | 4/2008 | Kim |
| 2008/0084685 A1 | 4/2008 | Van De Ven et al. |
| 2008/0084700 A1 | 4/2008 | Van De Ven |
| 2008/0084701 A1 | 4/2008 | Van De Ven et al. |
| 2008/0088248 A1 | 4/2008 | Myers |
| 2008/0089053 A1 | 4/2008 | Negley |
| 2008/0093615 A1 | 4/2008 | Lin et al. ...................... 257/98 |
| 2008/0106893 A1 | 5/2008 | Johnson et al. ............. 362/228 |
| 2008/0106895 A1 | 5/2008 | Van De Ven et al. |
| 2008/0106907 A1 | 5/2008 | Trott et al. |
| 2008/0112168 A1 | 5/2008 | Pickard et al. |
| 2008/0112170 A1 | 5/2008 | Trott et al. |
| 2008/0112183 A1 | 5/2008 | Negley |
| 2008/0117620 A1 | 5/2008 | Hama et al. .................... 362/84 |
| 2008/0128735 A1 | 6/2008 | Yoo |
| 2008/0130265 A1 | 6/2008 | Negley et al. |
| 2008/0130285 A1 | 6/2008 | Negley |
| 2008/0136313 A1 | 6/2008 | Negley |
| 2008/0137347 A1 | 6/2008 | Trott et al. |
| 2008/0149166 A1 | 6/2008 | Beeson et al. ................ 136/248 |
| 2008/0170396 A1 | 7/2008 | Yuan et al. |
| 2008/0173884 A1 | 7/2008 | Chitnis et al. ................... 27/98 |
| 2008/0179602 A1 | 7/2008 | Negley |
| 2008/0179611 A1 | 7/2008 | Chitnis et al. ................... 27/98 |
| 2008/0192458 A1 | 8/2008 | Li |
| 2008/0192462 A1 | 8/2008 | Steedly et al. |
| 2008/0192493 A1 | 8/2008 | Villard |
| 2008/0198572 A1 | 8/2008 | Medendorp |
| 2008/0211416 A1 | 9/2008 | Negley et al. |
| 2008/0231201 A1 | 9/2008 | Higley et al. |
| 2008/0232119 A1 | 9/2008 | Ribarich ....................... 362/373 |
| 2008/0259589 A1 | 10/2008 | Van De Ven |
| 2008/0278928 A1 | 11/2008 | Van De Ven et al. |
| 2008/0278940 A1 | 11/2008 | Van De Ven et al. |
| 2008/0278950 A1 | 11/2008 | Pickard et al. |
| 2008/0278952 A1 | 11/2008 | Trott et al. |
| 2008/0285279 A1 | 11/2008 | Ng et al. ...................... 362/249 |
| 2008/0304250 A1 | 12/2008 | Harbers et al. |
| 2008/0304260 A1 | 12/2008 | Van De Ven et al. |
| 2008/0304261 A1 | 12/2008 | Van De Ven et al. |
| 2008/0304269 A1 | 12/2008 | Pickard et al. |
| 2008/0308825 A1 | 12/2008 | Chakraborty et al. .......... 257/98 |
| 2008/0309255 A1 | 12/2008 | Myers |
| 2008/0310154 A1 | 12/2008 | Van De Ven et al. |
| 2009/0001399 A1 | 1/2009 | Diana et al. .................... 257/98 |
| 2009/0002986 A1 | 1/2009 | Medendorp et al. |
| 2009/0015137 A1 | 1/2009 | Su et al. ....................... 313/503 |
| 2009/0039375 A1 | 2/2009 | Le Toquin et al. |
| 2009/0040760 A1 | 2/2009 | Chen et al. ................... 362/249 |
| 2009/0046473 A1 | 2/2009 | Tsai et al. ..................... 362/373 |
| 2009/0058256 A1 | 3/2009 | Mitsuishi et al. ............. 313/487 |
| 2009/0059559 A1 | 3/2009 | Pabst |
| 2009/0067180 A1 | 3/2009 | Tahmosybayat .............. 362/339 |
| 2009/0086492 A1 | 4/2009 | Meyer |
| 2009/0086508 A1 | 4/2009 | Bierhuizen ................... 362/617 |
| 2009/0095960 A1 | 4/2009 | Murayama ...................... 257/79 |
| 2009/0100213 A1 | 4/2009 | Li |
| 2009/0101930 A1 | 4/2009 | Li |
| 2009/0103293 A1 | 4/2009 | Harbers |
| 2009/0103296 A1 | 4/2009 | Harbers |
| 2009/0108269 A1 | 4/2009 | Negley et al. |
| 2009/0113296 A1 | 4/2009 | Harbers et al. |
| 2009/0116217 A1 | 5/2009 | Teng et al. |
| 2009/0140633 A1* | 6/2009 | Tanimoto ............... H01L 33/504 |
| | | 313/503 |
| 2009/0147179 A1 | 6/2009 | Yamashita |
| 2009/0161356 A1 | 6/2009 | Negley et al. ................ 362/231 |
| 2009/0175041 A1 | 7/2009 | Yuen et al. |
| 2009/0184618 A1 | 7/2009 | Hakata et al. |
| 2009/0190353 A1 | 7/2009 | Barker .......................... 362/249 |
| 2009/0195186 A1 | 8/2009 | Guest et al. .................. 315/294 |
| 2009/0201679 A1 | 8/2009 | Konaka ......................... 362/235 |
| 2009/0208307 A1 | 8/2009 | Haase ........................... 362/234 |
| 2009/0213595 A1 | 8/2009 | Alexander et al. ........... 362/373 |
| 2009/0217970 A1 | 9/2009 | Zimmerman et al. ........ 136/252 |
| 2009/0262516 A1 | 10/2009 | Li ................................... 362/84 |
| 2009/0273727 A1 | 11/2009 | Kubota et al. .................. 349/62 |
| 2009/0273924 A1 | 11/2009 | Chiang ......................... 362/241 |
| 2009/0283779 A1 | 11/2009 | Negley et al. ................... 257/88 |
| 2009/0286337 A1 | 11/2009 | Lee ................................. 438/27 |
| 2009/0296387 A1 | 12/2009 | Reisenauer et al. .......... 362/235 |
| 2009/0310368 A1 | 12/2009 | Incerti .......................... 362/326 |
| 2009/0316073 A1 | 12/2009 | Chen et al. ..................... 349/64 |
| 2009/0316383 A1 | 12/2009 | Son |
| 2009/0322197 A1 | 12/2009 | Helbing |
| 2009/0322208 A1 | 12/2009 | Shaikevitch et al. ......... 313/503 |
| 2009/0322800 A1 | 12/2009 | Atkins .......................... 345/690 |
| 2009/0323333 A1 | 12/2009 | Chang |
| 2010/0020547 A1 | 1/2010 | Olsson .......................... 362/311 |
| 2010/0025700 A1 | 2/2010 | Jung et al. ...................... 257/89 |
| 2010/0026185 A1 | 2/2010 | Betsuda et al. ................. 315/32 |
| 2010/0027258 A1 | 2/2010 | Maxik et al. ................. 362/240 |
| 2010/0038660 A1 | 2/2010 | Shuja .............................. 257/98 |
| 2010/0044735 A1 | 2/2010 | Oyamada |
| 2010/0046231 A1 | 2/2010 | Medinis ........................ 362/294 |
| 2010/0060130 A1 | 3/2010 | Li |
| 2010/0060144 A1 | 3/2010 | Justel et al. ................... 313/503 |
| 2010/0079061 A1* | 4/2010 | Tsai ....................... H01L 33/501 |
| | | 313/504 |
| 2010/0091487 A1 | 4/2010 | Shin ............................. 362/235 |
| 2010/0096967 A1 | 4/2010 | Marinus et al. ............... 313/46 |
| 2010/0102707 A1 | 4/2010 | Fukuda et al. ............... 313/503 |
| 2010/0109575 A1 | 5/2010 | Ansems et al. |
| 2010/0134047 A1 | 6/2010 | Hasnain |
| 2010/0140655 A1 | 6/2010 | Shi ................................. 257/99 |
| 2010/0149783 A1 | 6/2010 | Takenaka et al. .............. 362/84 |
| 2010/0149814 A1 | 6/2010 | Zhai et al. ....................... 257/88 |
| 2010/0155763 A1* | 6/2010 | Donofrio ................. H01L 33/50 |
| | | 257/98 |
| 2010/0170075 A1 | 7/2010 | Kanade et al. ................. 29/428 |
| 2010/0177522 A1 | 7/2010 | Lee ............................... 362/373 |
| 2010/0201284 A1 | 8/2010 | Kraus |
| 2010/0207502 A1 | 8/2010 | Cao et al. ...................... 313/46 |
| 2010/0219735 A1 | 9/2010 | Sakai et al. .................... 313/46 |
| 2010/0232134 A1 | 9/2010 | Tran ............................... 362/84 |
| 2010/0244729 A1 | 9/2010 | Chen et al. ................... 315/291 |
| 2010/0246165 A1 | 9/2010 | Diaz et al. .................... 362/183 |
| 2010/0014839 A1 | 10/2010 | Benoy et al. ................. 386/117 |
| 2010/0259918 A1 | 10/2010 | Rains, Jr. ........................ 362/84 |
| 2010/0264799 A1 | 10/2010 | Liu et al. |
| 2010/0264826 A1 | 10/2010 | Yatsuda ........................ 315/112 |
| 2010/0314985 A1 | 12/2010 | Premysler ...................... 313/46 |
| 2010/0314996 A1 | 12/2010 | Van de Ven |
| 2010/0327745 A1 | 12/2010 | Dassanayake et al. |
| 2010/0327755 A1 | 12/2010 | Dassanayake ................. 315/35 |
| 2010/0328925 A1 | 12/2010 | Hoelen .......................... 362/84 |
| 2011/0001151 A1 | 1/2011 | Le Toquin |
| 2011/0037368 A1 | 2/2011 | Huang ............................ 313/46 |
| 2011/0044022 A1 | 2/2011 | Ko et al. ......................... 362/84 |
| 2011/0215969 A1 | 2/2011 | Le et al. |
| 2011/0058379 A1 | 3/2011 | Diamantidis .............. 362/296.01 |
| 2011/0068356 A1* | 3/2011 | Chiang ................. H01L 33/507 |
| | | 257/98 |
| 2011/0074271 A1 | 3/2011 | Takeshi et al. ................. 313/46 |
| 2011/0074296 A1 | 3/2011 | Shen et al. ................... 315/112 |
| 2011/0080096 A1 | 4/2011 | Dudik et al. ................... 315/35 |
| 2011/0080740 A1 | 4/2011 | Allen et al. ................... 362/294 |
| 2011/0080742 A1 | 4/2011 | Allen |
| 2011/0089804 A1 | 4/2011 | Mahalingam et al. .......... 313/46 |
| 2011/0089830 A1 | 4/2011 | Pickard et al. ................. 315/32 |
| 2011/0095686 A1 | 4/2011 | Falicoff et al. ................. 315/35 |
| 2011/0133222 A1 | 6/2011 | Allen et al. ..................... 257/88 |
| 2011/0149563 A1 | 6/2011 | Hsia .............................. 362/221 |
| 2011/0149578 A1* | 6/2011 | Niiyama ....................... F21K 9/00 |
| | | 362/294 |
| 2011/0157989 A1 | 6/2011 | Kanai |

(56) References Cited

U.S. PATENT DOCUMENTS

| | | | |
|---|---|---|---|
| 2011/0175528 A1 | 7/2011 | Rains et al. ............... 315/51 |
| 2011/0176291 A1 | 7/2011 | Sanders | |
| 2011/0176316 A1 | 7/2011 | Phipps et al. | |
| 2011/0205733 A1 | 8/2011 | Lenderink et al. .......... 362/231 |
| 2011/0215696 A1 | 9/2011 | Tong et al. ............... 313/46 |
| 2011/0215697 A1 | 9/2011 | Tong | |
| 2011/0216523 A1 | 9/2011 | Tong et al. ............... 362/84 |
| 2011/0220920 A1* | 9/2011 | Collins ............ H01L 33/504 257/88 |
| 2011/0228514 A1 | 9/2011 | Tong et al. | |
| 2011/0242816 A1 | 10/2011 | Chowdhury et al. ........ 362/294 |
| 2011/0267835 A1 | 11/2011 | Boonekamp et al. ........ 362/555 |
| 2011/0273072 A1 | 11/2011 | Oki ..................... 313/46 |
| 2011/0278609 A1* | 11/2011 | Jeong ................. H01L 33/60 257/98 |
| 2011/0291560 A1 | 12/2011 | Wang et al. ............... 315/32 |
| 2011/0298371 A1 | 12/2011 | Brandes et al. ........... 315/32 |
| 2012/0032219 A1 | 2/2012 | Ooyabu et al. | |
| 2012/0040585 A1 | 2/2012 | Huang | |
| 2012/0056526 A1* | 3/2012 | Mitsuishi ............ C09K 11/0883 313/503 |
| 2012/0155059 A1 | 6/2012 | Hoelen et al. ................. 362/84 |
| 2012/0161626 A1 | 6/2012 | Van de Ven et al. ............ 315/35 |
| 2012/0241778 A1 | 9/2012 | Franck ........................ 257/88 |
| 2012/0320591 A1 | 12/2012 | Liao et al. ................... 362/249 |
| 2013/0049018 A1 | 2/2013 | Ramer et al. ................. 257/81 |
| 2013/0063945 A1 | 3/2013 | Wu et al. .................... 362/249 |
| 2013/0119280 A1 | 5/2013 | Fuchi et al. ............. 250/504 R |
| 2013/0249374 A1 | 9/2013 | Lee et al. ..................... 313/12 |
| 2013/0257266 A1* | 10/2013 | Ishizaki ............... H01L 33/504 313/503 |
| 2013/0293098 A1 | 11/2013 | Li et al. ................... 313/512 |
| 2013/0328074 A1 | 12/2013 | Lowes et al. | |
| 2014/0293577 A1* | 10/2014 | Yamakawa .......... H01L 33/504 362/84 |
| 2015/0069439 A1* | 3/2015 | Deeben ............... H01L 33/501 257/98 |

FOREIGN PATENT DOCUMENTS

| | | |
|---|---|---|
| CN | 1608326 | 4/2005 |
| CN | 1726410 | 1/2006 |
| CN | 1767216 | 5/2006 |
| CN | 1802533 | 7/2006 |
| CN | 1922286 A | 2/2007 |
| CN | 101012916 A | 8/2007 |
| CN | 101128695 | 2/2008 |
| CN | 101262032 | 9/2008 |
| CN | 101262032 A | 9/2008 |
| CN | 1013388887 A | 1/2009 |
| CN | 101368719 A | 2/2009 |
| CN | 101501388 A | 8/2009 |
| CN | 101641623 | 2/2010 |
| CN | 102077011 | 5/2011 |
| CN | 102859258 A | 1/2013 |
| DE | 3 916 875 | 12/1990 |
| DE | 4311937 A1 | 10/1994 |
| DE | 10251955 | 5/2004 |
| DE | 10251955 A1 | 5/2004 |
| DE | 10-335077 | 3/2005 |
| DE | 102004051382 | 4/2006 |
| DE | 102006061164 | 6/2008 |
| DE | 10 2007 037862 A1 | 10/2008 |
| DE | 202008013667 | 12/2008 |
| DE | 102011004718 | 8/2012 |
| EP | 0 838 866 | 4/1998 |
| EP | 0876085 | 11/1998 |
| EP | 0876085 A2 | 11/1998 |
| EP | 0890059 A1 | 1/1999 |
| EP | 0936682 A1 | 8/1999 |
| EP | 0 971 421 | 1/2000 |
| EP | 1 024 399 | 8/2000 |
| EP | 1058221 A2 | 12/2000 |
| EP | 1 081 771 | 3/2001 |
| EP | 1 160 883 | 12/2001 |
| EP | 1 193 772 | 4/2002 |
| EP | 1 263 058 | 12/2002 |
| EP | 1 367 655 | 12/2003 |
| EP | 1 380 876 | 1/2004 |
| EP | 1 462 711 | 12/2004 |
| EP | 1 571 715 | 9/2005 |
| EP | 1 760 795 | 1/2006 |
| EP | 1881259 | 1/2008 |
| EP | 2146135 A2 | 1/2010 |
| EP | 2154420 | 2/2010 |
| EP | 2293353 A1 | 3/2011 |
| EP | 2469154 | 6/2012 |
| FR | 2941346 | 7/2010 |
| GB | 1423011 | 1/1976 |
| GB | 2345954 A | 7/2000 |
| GB | 2 366 610 A | 3/2002 |
| GB | 2366610 | 3/2002 |
| GB | 2366610 A | 3/2002 |
| JP | H03081903 | 4/1991 |
| JP | 04-159519 | 6/1992 |
| JP | H06283006 | 10/1994 |
| JP | 09-146089 | 6/1997 |
| JP | H09265807 | 10/1997 |
| JP | 10-163535 | 6/1998 |
| JP | H11-177149 | 2/1999 |
| JP | H11177149 | 7/1999 |
| JP | 11-213730 A | 8/1999 |
| JP | H11260125 | 9/1999 |
| JP | 2000-022222 | 1/2000 |
| JP | 2000022222 | 1/2000 |
| JP | 2000-183408 | 6/2000 |
| JP | 2000173304 | 6/2000 |
| JP | 2001-111114 | 4/2001 |
| JP | 2001118403 | 4/2001 |
| JP | 2001-156331 | 6/2001 |
| JP | 2001-307506 | 11/2001 |
| JP | 2002-150821 | 5/2002 |
| JP | 2002525814 | 8/2002 |
| JP | 2003-515956 | 5/2003 |
| JP | 2003515899 | 5/2003 |
| JP | 2004-080046 | 3/2004 |
| JP | 2004-103443 | 4/2004 |
| JP | 2004146225 | 5/2004 |
| JP | 2004241318 | 8/2004 |
| JP | 2004-253309 | 9/2004 |
| JP | 2004-356116 | 12/2004 |
| JP | 2004-363055 | 12/2004 |
| JP | 2005-005482 | 1/2005 |
| JP | 2005-093097 A | 4/2005 |
| JP | 2005-101296 | 4/2005 |
| JP | 2005108700 | 4/2005 |
| JP | 20051008700 | 4/2005 |
| JP | 2005-142311 | 6/2005 |
| JP | 2005244226 | 9/2005 |
| JP | 2005-277127 | 10/2005 |
| JP | 2005-286267 A | 10/2005 |
| JP | 2005277127 | 10/2005 |
| JP | 2005021635 | 11/2005 |
| JP | 2006019676 | 1/2006 |
| JP | 2006108661 | 4/2006 |
| JP | 2006148147 | 6/2006 |
| JP | 2006156187 | 6/2006 |
| JP | 20066159187 | 6/2006 |
| JP | WO 2006065558 | 6/2006 |
| JP | 200640850 A | 9/2006 |
| JP | 2006525648 | 11/2006 |
| JP | 2006331683 | 12/2006 |
| JP | 2007-49019 | 2/2007 |
| JP | 2007049019 | 2/2007 |
| JP | A2007040919 | 2/2007 |
| JP | 200759930 | 3/2007 |
| JP | 2007059911 | 3/2007 |
| JP | 2007081090 | 3/2007 |
| JP | 2007-122950 | 5/2007 |
| JP | 2007-141737 | 6/2007 |
| JP | 2007/173397 A | 7/2007 |
| JP | 2007-184330 | 7/2007 |
| JP | 2007173397 A * | 7/2007 |

(56) References Cited

FOREIGN PATENT DOCUMENTS

| | | |
|---|---|---|
| JP | 2007184330 | 7/2007 |
| JP | 3138653 | 12/2007 |
| JP | 2008505448 | 2/2008 |
| JP | 2008-508742 | 3/2008 |
| JP | 200871793 | 3/2008 |
| JP | 2008508742 | 3/2008 |
| JP | 2008091140 | 4/2008 |
| JP | 2008108835 | 5/2008 |
| JP | 2008-523639 | 7/2008 |
| JP | 2008523639 | 7/2008 |
| JP | 2008-187195 | 8/2008 |
| JP | 2008187195 | 8/2008 |
| JP | 2008-262765 | 10/2008 |
| JP | 2008262765 | 10/2008 |
| JP | 200828183 | 11/2008 |
| JP | 2008288409 | 11/2008 |
| JP | 2008300117 | 12/2008 |
| JP | 2008300203 | 12/2008 |
| JP | 2008300460 | 12/2008 |
| JP | 2008300570 | 12/2008 |
| JP | 2009-016058 A | 1/2009 |
| JP | 2009016058 | 1/2009 |
| JP | 2009016153 | 1/2009 |
| JP | 2009021264 | 1/2009 |
| JP | 2009-59896 | 3/2009 |
| JP | 2009059896 | 3/2009 |
| JP | 2009117346 | 5/2009 |
| JP | WO 2009093163 | 7/2009 |
| JP | 3153766 | 8/2009 |
| JP | U3153766 | 8/2009 |
| JP | 2009238960 | 10/2009 |
| JP | WO 2009119038 | 10/2009 |
| JP | 2009-267039 | 11/2009 |
| JP | 2009266780 | 11/2009 |
| JP | 2009277586 | 11/2009 |
| JP | 2009295299 | 12/2009 |
| JP | WO 2009148543 | 12/2009 |
| JP | 2010016223 | 1/2010 |
| JP | 2010040494 | 2/2010 |
| JP | 2010050473 | 3/2010 |
| JP | 2010129300 | 6/2010 |
| JP | 2010267826 | 11/2010 |
| KR | 100944181 | 2/2010 |
| KR | 1020100037353 | 4/2010 |
| KR | 100980588 B1 | 9/2010 |
| KR | 3020110008445 | 3/2011 |
| KR | 1020110101939 A | 9/2011 |
| TW | 546854 | 8/2003 |
| TW | 200505054 | 2/2005 |
| TW | 200507686 | 2/2005 |
| TW | 200527664 | 8/2005 |
| TW | 2006033434 | 2/2006 |
| TW | 200618339 | 6/2006 |
| TW | 200619744 | 6/2006 |
| TW | M309750 | 4/2007 |
| TW | 200739151 | 10/2007 |
| TW | 200806922 | 2/2008 |
| TW | 200907239 | 2/2009 |
| TW | 200928435 | 7/2009 |
| TW | 200930937 | 7/2009 |
| TW | 200938768 | 9/2009 |
| TW | 200943592 | 10/2009 |
| TW | D134005 | 3/2010 |
| TW | 100300960 | 3/2011 |
| TW | D141681 | 7/2011 |
| WO | 98/43014 | 10/1998 |
| WO | 99/66483 | 12/1999 |
| WO | WO 2000/017569 A1 | 3/2000 |
| WO | 00/34709 | 6/2000 |
| WO | WO 0124583 A1 | 4/2001 |
| WO | 01/41215 | 6/2001 |
| WO | 01/43113 | 6/2001 |
| WO | WO 2001/040702 A1 | 6/2001 |
| WO | WO 0160119 A2 | 8/2001 |
| WO | WO 0169692 | 9/2001 |
| WO | 03/056876 | 7/2003 |
| WO | 03/091771 | 11/2003 |
| WO | WO 2004068599 | 8/2004 |
| WO | WO 2004068909 | 8/2004 |
| WO | WO 2004/100213 A2 | 11/2004 |
| WO | WO 2004100213 | 11/2004 |
| WO | WO 2004100213 A2 | 11/2004 |
| WO | 2005/004202 | 1/2005 |
| WO | 2005013365 | 2/2005 |
| WO | 2005/104253 | 11/2005 |
| WO | WO 2005104247 | 11/2005 |
| WO | WO 2005107420 A2 | 11/2005 |
| WO | 2005124877 | 12/2005 |
| WO | WO 2006012043 | 2/2006 |
| WO | 2006/028312 | 3/2006 |
| WO | 2006/061728 A2 | 6/2006 |
| WO | WO 06059535 A2 | 6/2006 |
| WO | WO 2006061728 | 6/2006 |
| WO | WO 2006065558 | 6/2006 |
| WO | WO 2006121196 | 11/2006 |
| WO | WO 2007061758 | 5/2007 |
| WO | WO 2007/130358 A2 | 11/2007 |
| WO | WO 2007146566 A2 | 12/2007 |
| WO | WO 2008/018002 A2 | 2/2008 |
| WO | WO 2008018002 | 2/2008 |
| WO | WO 2008/052318 A1 | 5/2008 |
| WO | WO 2008/117211 A1 | 10/2008 |
| WO | WO 04100213 A2 | 11/2008 |
| WO | WO 08134056 A1 | 11/2008 |
| WO | WO 2008/146229 A2 | 12/2008 |
| WO | WO 2008146229 | 12/2008 |
| WO | WO 2009/024952 A2 | 2/2009 |
| WO | WO 2009028861 A2 * | 3/2009 ........... H01L 33/504 |
| WO | 2009039801 A1 | 4/2009 |
| WO | WO 2009052099 | 4/2009 |
| WO | WO 2009/091562 A2 | 7/2009 |
| WO | WO 2009/093163 A2 | 7/2009 |
| WO | WO 2009091562 | 7/2009 |
| WO | WO 2009093163 | 7/2009 |
| WO | WO 2009093163 A2 | 7/2009 |
| WO | WO 2009/107052 A1 | 9/2009 |
| WO | WO 2009107052 | 9/2009 |
| WO | WO 2009/119038 A2 | 10/2009 |
| WO | WO 2009/128004 A1 | 10/2009 |
| WO | WO 2009119038 | 10/2009 |
| WO | WO 2009125314 A2 | 10/2009 |
| WO | WO 2009131627 | 10/2009 |
| WO | WO 2009143047 A2 | 11/2009 |
| WO | WO 2009/158422 A1 | 12/2009 |
| WO | WO 2009158422 | 12/2009 |
| WO | WO 2009158422 A1 | 12/2009 |
| WO | WO 2010/012999 A2 | 2/2010 |
| WO | WO 2010/013893 | 2/2010 |
| WO | WO 2010012999 | 2/2010 |
| WO | WO 2010013893 | 2/2010 |
| WO | WO 2010013898 A2 | 2/2010 |
| WO | WO 2010052640 | 5/2010 |
| WO | WO 2010/119618 A1 | 10/2010 |
| WO | WO 2010/128419 A1 | 11/2010 |
| WO | WO 2011100193 | 8/2011 |
| WO | WO 2011109091 A1 | 9/2011 |
| WO | WO 2011109098 | 9/2011 |
| WO | WO 2012011279 | 1/2012 |
| WO | WO 2012031533 | 3/2012 |

OTHER PUBLICATIONS

Second Office Action and Search Report from Chinese Patent Appl. No. 2011800207092, dated Jan. 22, 2015.
Examination Report from European Patent Appl. No. 11 710 348.1-1757, dated Feb. 18, 2015.
Examination Report from European Patent Appl. No. 11 710 906.6-1757, dated Feb. 18, 2015.
Examination Report from European Patent Appl. No. 12 740 244.4-1757, dated Feb. 9, 2015.
Office Action from U.S. Appl. No. 13/029,063, dated Jan. 13, 2015.
Office Action from U.S. Appl. No. 14/014,272, dated Jan. 14, 2015.
Response to OA from U.S. Appl. No. 14/014,272, filed Mar. 3, 2015.

(56) References Cited

OTHER PUBLICATIONS

Office Action from U.S. Appl. No. 12/901,405, dated Feb. 4, 2015.
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,162, filed May 30, 2007.
U.S. Appl. No. 11/854,744, filed Sep. 13, 2007.
U.S. Appl. No. 11/936,163, filed Nov. 7, 2007.
U.S. Appl. No. 11/843,243, filed Aug. 22, 2007.
U.S. Appl. No. 11/948,021, filed Nov. 30, 2007.
U.S. Appl. No. 11/870,679, filed Oct. 11, 2007.
U.S. Appl. No. 12/017,558, filed Jan. 22, 2008.
U.S. Appl. No. 12/017,600, filed Jan. 22, 2008.
U.S. Appl. No. 12/057,748, filed Mar. 28, 2008.
U.S. Appl. No. 11/743,324, filed May 2, 2007.
U.S. Appl. No. 11/032,363, filed Jan. 10, 2005.
U.S. Appl. No. 61/075,513, filed Jun. 25, 2008.
Search Report and Office Action from Taiwanese Patent Appl. No. 099143827, dated Jun. 12, 2015.
Office Action from Taiwanese Patent Appl. No. 100107012, dated Jul. 22, 2015.
Decision of Board of Appeal and Minutes of Oral Proceedings from European Appl. No. 09152962, dated Jun. 2, 2015.
Decision to Grant from Chinese Patent Appl. No. 201080062056.X, dated Jul. 6, 2015.
Office Action from Taiwanese Appl. No. 101107038, dated Jul. 21, 2015.
Office Action from Taiwanese Patent Appl No. 100107042, dated Jun. 2, 2015.
Office Action from Taiwanese Patent Appl. No. 100107047, dated Jun. 2, 2015.
Office Action from Taiwanese Patent Appl. No. 100107040, dated Jun. 2, 2015.
Office Action from Taiwanese Patent Appl. No. 100107044, dated Jun. 1, 2015.
Third Office Action from Chinese Patent Appl. No. 201180022606X, dated Jun. 10, 2015.
Summons to Oral Proceedings from European Patent Appl. No. 09152962/2166580, dated Jan. 29, 2015.
First Office Action from Chinese Patent Appl. No. 2011800225832, dated Jan. 20, 2015.
First Office Action from Chinese Patent Appl. No. 2011800226214, dated Dec. 25, 2014.
Office Action from U.S. Appl. No. 13/029,068, dated Sep. 26, 2014.
Response to OA from U.S. Appl. No. 13/029,068, filed Nov. 18, 2014.
Office Action from U.S. Appl. No. 13/358,901, dated Oct. 31, 2014.
Office Action from U.S. Appl. No. 13/430,478, dated Nov. 5, 2014.
Office Action from U.S. Appl. No. 13/034,501, dated Nov. 5, 2014.
Office Action from U.S. Appl. No. 13/028,863, dated Nov. 10, 2014.
Decision to Grant from Japanese Appl. No. 2012-556062, dated Nov. 27, 2014.
Second Office Action from Chinese Patent Appl. No. 2011800207069, dated Dec. 5, 2014.
Second Office Action from Chinese Patent Appl. No. 2011800223856, dated Apr. 16, 2015.
Office Action from Taiwanese Patent Appl. No. 100107048, dated Apr. 24, 2015.
Notice of Decline of Amendments and Final Office Action from Japanese Appl. No. 2012-556065, dated Apr. 10, 2015.
Second Office Action from Chinese Patent Appl. No. 2011800223837, dated Apr. 13, 2015.
Communication from European Patent Appl. No. 13762957.2-1757, dated Apr. 30, 2015.
Office Action and Search Report from Taiwanese Patent Appl. No. 100107051, dated May 12, 2015.
Third Office Action from Chinese Patent Appl. No. 2011800207069, dated Apr. 13, 2015.
Second Office Action from Chinese Patent Appl. No. 2011800226248, dated May 4, 2015.
Office Action from Taiwanese Appl. No. 100107047, dated Jun. 5, 2015.
Second Office Action from Chinese Appl. No. 201180022620X, dated Apr. 20, 2015.
Office Action from Taiwanese Appl. No. 100107040, dated Jun. 5, 2015.
Office Action from Taiwanese Patent Appl. No. 10420724800, dated Jun. 2, 2015.
Office Action from U.S. Appl. No. 13/029,068, dated Mar. 31, 2015.
Office Action from U.S. Appl. No. 11/149,999, dated Mar. 31, 2015.
Office Action from U.S. Appl. No. 12/985,275, dated Apr. 3, 2015.
Office Action from U.S. Appl. No. 13/430,478, dated Apr. 22, 2015.
Office Action from U.S. Appl. No. 13/029,025, dated Apr. 29, 2015.
Office Action from U.S. Appl. No. 13/018,245, dated May 28, 2015.
Office Action from U.S. Appl. No. 13/028,863, dated Jun. 3, 2015.
Office Action from U.S. Appl. No. 13/758,763, dated Jun. 5, 2015.
Office Action from U.S. Appl. No. 14/185,123, dated Jun. 9, 2015.
First Office Action from Chinese Appl. No. 201180022626.7, dated Nov. 15, 2014.
Second Office Action from Chinese Appl. No, 201180022606X, dated Dec. 23, 2014.
Appeal Decision from Japanese Appl. No. 2011-231319, dated Jan. 13, 2015.
Office Action from U.S. Appl. No. 13/607,300, dated Nov. 19, 2014.
Office Action from U.S. Appl. No. 13/029,025, dated Dec. 11, 2014.
Office Action from U.S. Appl. No. 13/018,245, dated Dec. 11, 2014.
Office Action from U.S. Appl. No. 13/029,068, dated Dec. 23, 2014.
Office Action from U.S. Appl. No. 12/985,275, dated Dec. 29, 2014.
Office Action from Japanese Patent Appl. No. 2014-122643, dated Apr. 10, 2015.
Examination from European Patent Appl. No. 10799139.0, dated Nov. 18, 2015.
Request for Correction from Chinese Patent Appl. No. 201180022606X, dated Nov. 12, 2015.
Third Office Action from Chinese Patent Appl. No. 2011800223856, dated Nov. 2, 2015.
Office Action from U.S. Appl. No. 13/536,707, dated Nov. 16, 2015.
Office Action from U.S. Appl. No. 14/185,123, dated Nov. 17, 2015.
Office Action from U.S. Appl. No. 13/029,068, dated Dec. 3, 2015.
Office Action from U.S. Appl. No. 14/108,815, dated Nov. 5, 2015.
Third Office Action from Chinese Patent Appl. No. 2011800207092, dated Jul. 13, 2015.
Notice of Allowance from Japanese Patent Appl. No. 2014-122643, dated Sep. 3, 2015.
Notification of the Fourth Office Action from Chinese Patent Appl. No. 2011800207069, dated Aug. 24, 2015.
Decision of Rejection from Japanese Patent Appl. No. 2012-566065, dated Aug. 18, 2015.
Second Office Action from Chinese Patent Appl. No. 2011800226267, dated Aug. 3, 2015.
Office Action from U.S. Appl. No. 13/029,025, dated Aug. 17, 2015.
Office Action from U.S. Appl. No. 13/430,478, dated Aug. 27, 2015.
Office Action from U.S. Appl. No. 12/985,275, dated Sep. 2, 2015.
Office Action from U.S. Appl. No. 13/029,068, dated Sep. 8, 2015.
Office Action from U.S. Appl. No. 13/029,063, dated Sep. 17, 2015.
Office Action from U.S. Appl. No. 11/149,999, dated Oct. 1, 2015.
Office Action from U.S. Appl. No. 14/108,815; dated Apr. 27, 2016.
Fourth Office Action for Chinese Application No. 2011800223856; dated May 5, 2016.
Fourth Office Action for Chinese Application No. 201180022624.8; dated May 24, 2016.
Fourth Office Action for Chinese Application No. 2011800223837; dated Jun. 6, 2016.
Office Action from U.S. Appl. No. 13/029,068; dated Jun. 9, 2016.
Office Action from U.S. Appl. No. 13/536,707; dated Jun. 23, 2016.
Third Office Action for Chinese Application No. 2011800225832; dated Jul. 7, 2016.

(56) References Cited

OTHER PUBLICATIONS

Notice of Issuance for Chinese Application No. 2011800210/09.2; dated Jul. 25, 2016.
Office Action for U.S. Appl. No. 13/758,763; dated Jul. 26, 2016.
European Office Action for Application No. 11710348.1; dated Aug. 8, 2016.
Office Action for U.S. Appl. No. 12/985,275; dated Aug. 30, 2016.
Office Action for U.S. Appl. No. 13/029,063; dated Sep. 8, 2016.
Fourth Office Action from Chinese Patent Appl. No. 201180020709.2, dated Jan. 25, 2016.
Decision of Rejection from Chinese Patent Appl. No. 201180020706.9, dated Mar. 2, 2016.
Re-Examination Report from Japanese Patent Appl. No. 2012-556065, dated Feb. 1, 2016.
Examination Report from European Patent Appl. No. 11 709 509.1-1757, dated Mar. 4, 2016.
Office Action from U.S. Appl. No. 12/985,275; dated Feb. 18, 2016.
Decision of Rejection for Chinese Appl. 2011800223856; dated Jan. 5, 2017.
Office Action for Chinese Appl. 2011800225832; dated Feb. 4, 2017.
Office Action for Chinese Application No. 201180022383.7; dated Mar. 15, 2017.
Office Action for European Application No. 10799139.0; dated Mar. 31, 2017.
Office Action for U.S. Appl. No. 13/758,763; dated Apr. 5, 2017.
Office Action for U.S. Appl. No. 14/108,815; dated Apr. 28, 2017.
Office Action for U.S. Appl. No. 13/029,068; dated Jun. 2, 2017.
Office Action for Japanese Application No. 2012-556065; dated Jun. 16, 2017.
Office Action for Chinese Application No. 201180022620; dated Jun. 26, 2017.
Office Action for U.S. Appl. No. 13/536,707; dated Jun. 30, 2017.
Office Action for U.S. Appl. No. 13/029,063; dated Aug. 2, 2017.
Office Action for U.S. Appl. No. 14/108,815; dated Aug. 4, 2017.
Office Action for European Application No. 15750564.5; dated Mar. 15, 2017.
Office Action for U.S. Appl. No. 13/758,763; dated Oct. 17, 2017.
Office Action for Japanese Application No. 2012-556065; dated Oct. 24, 2017.
Office Action for U.S. Appl. No. 13/029,068; dated Nov. 3, 2017.
Office Action for Chinese Application No. 2011800225832; dated Dec. 14, 2017.
Office Action for U.S. Appl. No. 14/108,815; dated Jan. 5, 2018.
Office Action for U.S. Appl. No. 13/029,068; dated Feb. 8, 2018.
Office Action for U.S. Appl. No. 13/536,707; dated Feb. 22, 2018.
Foreign Office Action for Chinese Application No. 201180022583.2; dated Apr. 4, 2018.
Office Action for U.S. Appl. No. 14/108,815; dated May 24, 2018.
Office Action for U.S. Appl. No. 13/758,763; dated Jun. 14, 2018.
Office Action for U.S. Appl. No. 13/029,068; dated Jun. 15, 2018.
Office Action for U.S. Appl. No. 13/536,707; dated Jul. 10, 2018.
Office Action for Chinese Application No. 2015800540943; dated Apr. 28, 2018.
"Design and Manufacturing of Integrated Multi-chip Light-Emitting Diodes Packages" Li Zongtao, 2003, vol. 11, pp. 46-57, Dated Jan. 15, 2013.
International Search Report and Written Opinion for PCT Patent Application No. PCT/US2011/000405 dated Nov. 2, 2011.
International Search Report and Written Opinion for PCT/US2011/000407 dated Nov. 16, 2011.
Office Action of the IPO for Taiwan Patent Application No. TW 100300962 dated Nov. 21, 2011.
Office Action of the IPO for Taiwan Patent Application No. TW 100300961 dated Nov. 16, 2011.
Office Action of the IPO for Taiwan Patent Application No. TW 100300960 dated Nov. 15, 2011.
Office Action of the IPO for Taiwan Patent Application No. TW 100302770 dated Jan. 13, 2012.
International Search Report and Written Opinion for PCT Application No. PCT/US2011/000399 dated Jul. 12, 2011.
Decision to Refuse a European Patent Application for EP 09 152 962.8 dated Jul. 6, 2011.
International Search Report and Written Opinion, PCT/US2009/063604, dated Feb. 26, 2010.
U.S. Appl. No. 12/566,195, Van De Ven, filed Sep. 24, 2009.
U.S. Appl. No. 12/704,730, Van De Ven, filed Feb. 12, 2010.
C.Crane Geobulb®-II LED Light Bulb, Item #2SW, Description, p. 1-2.
Cree LR4, 4" and 6" Recessed Architectural Downlight, Product Info p. 1-2.
U.S. Appl. No. 11/656,759, filed Jan. 22, 2007, Chitnis, et al.
U.S. Appl. No. 11/899,790, filed Sep. 7, 2007, Chitnis, et al.
U.S. Appl. No. 11/473,089, filed Jun. 21, 2006, Tarsa, et al.
U.S. Appl. No. 13/034,501, filed Feb. 24, 2011, Le, et al.
U.S. Appl. No. 13/770,389, filed Feb. 19, 2013, Sun, et al.
U.S. Appl. No. 13/029,005, filed Feb. 16, 2011, Tong, et al.
U.S. Appl. No. 13/029,025, filed Feb. 16, 2011, Tong, et al.
U.S. Appl. No. 13/536,707, filed Jun. 28, 2012, Le Toquin, et al.
U.S. Appl. No. 12/151,089, filed May 2, 2008, Chakraborty, et al.
U.S. Appl. No. 13/837,442, filed Mar. 15, 2013, Gupta, et al.
U.S. Appl. No. 13/804,309, filed Mar. 14, 2013, Castillo, et al.
U.S. Appl. No. 11/895,573, filed Aug. 24, 2007, Chakraborty, et al.
U.S. Appl. No. 12/498,253, filed Jul. 6, 2009, Le Toquin, et al.
U.S. Appl. No. 12/002,429, filed Dec. 14, 2007, Loh, et al.
U.S. Appl. No. 13/544,662, filed Jul. 9, 2012, Tarsa, et al.
U.S. Appl. No. 13/842,307, filed Mar. 15, 2013, Ibbetson, et al.
U.S. Appl. No. 13/902,080, filed May 24, 2013, Lowes, et al.
U.S. Appl. No. 13/607,300, filed Sep. 7, 2012, Progl, et al.
U.S. Appl. No. 13/758,763, filed Feb. 4, 2013, Leung, et al.
U.S. Appl. No. 13/840,887, filed Mar. 15, 2013, Ven de Ven, et al.
U.S. Appl. No. 13/828,348, filed Mar. 14, 2013, Edmond, et al.
U.S. Appl. No. 12/717,048, filed Mar. 3, 2010, Donofrio, et al.
U.S. Appl. No. 13/306,589, filed Nov. 29, 2011, Tarsa, et al.
Cree XLamp CXA1520 LED Product Family Data Sheet, www.cree.com, 15 pages.
Cree XLamp CXA2520 LED Product Family Data Sheet, www.cree.com, 19 pages.
U.S. Appl. No. 13/649,052, filed Oct. 10, 2012, Lowes, et al.
U.S. Appl. No. 13/649,067, filed Oct. 10, 2012, Lowes, et al.
WhiteOptics™ White97 Film, Reflector Film Technical Data Sheet from WhiteOptics, LLC, New Castel, DE.
WhiteOptics™ Metal, Technical Data Sheet from WhiteOptics, LLC, New Castel, DE.
U.S. Appl. No. 13/018,245, filed Jan. 31, 2011, Tong.
U.S. Appl. No. 12/848,825, filed Aug. 2, 2010, Tong.
U.S. Appl. No. 13/017,778, filed Jan. 31, 2011, Andrews.
U.S. Appl. No. 12/757,179, filed Apr. 9, 2010, Yuan.
U.S. Appl. No. 12/901,405, filed Oct. 8, 2010, Tong.
U.S. Appl. No. 61/339,515, filed Mar. 3, 2010, Tong.
U.S. Appl. No. 12/975,820, filed Dec. 22, 2010, Van De Ven.
U.S. Appl. No. 13/029,063, filed Feb. 16, 2011, Hussell.
U.S. Appl. No. 61/435,759, filed Jan. 24, 2011, Le, et al.
U.S. Appl. No. 61/339,516, filed Mar. 3, 2010, Tong, et al.
U.S. Appl. No. 61/424,670, filed Dec. 19, 2010, Yuan, et al.
U.S. Appl. No. 13/022,490, filed Feb. 7, 2011, Tong, et al.
U.S. Appl. No. 13/358,901, filed Jan. 26, 2012, Progl, et al.
Cree, XLamp® LEDs, Product Info and Data Sheets, 34 Pages.
Nichia Corp Part Spec. *High Brightness LEDs* (May 1999), 15 Pgs. Ea. (NSPW 300BS, NSPW 312BS, Etc).
International Search Report and Written Opinion for PCT/US2011/000403 dated Aug. 23, 2011.
International Search Report and Written Opinion for PCT/US2011/000404 dated Aug. 25, 2011.
International Search Report and Written Opinion for PCT/US2011/000398 dated Aug. 30, 2011.
International Search Report and Written Opinion for PCT/US2011/000406 dated Sep. 15, 2011.
International Search Report and Written Opinion for counterpart PCT Application No. PCT/US2011/000397 dated May 24, 2011.
International Search Report and Written Opinion for PCT Application No. PCT/US2010/003146 dated Jun. 7, 2011.

(56) References Cited

OTHER PUBLICATIONS

Decision for Final Rejection for Japanese Patent Application No. 2001-542133 dated Jun. 28, 2011.
International Search Report and Written Opinion for PCT/US2011/000400 dated May 2, 2011.
U.S. Appl. No. 12/757,179, filed Apr. 9, 2010, Yuan, et al.
Energy Star® Program Requirements for Integral LED Lamps, amended Mar. 22, 2010.
International Search Report and Written Opinion for PCT Application No. PCT/US2011/000391 dated Oct. 6, 2011.
International Search Report and Written Opinion for PCT Application No. PCT/US2011/000402 dated Sep. 30, 2011.
Office Action from U.S. Appl. No. 13/029,005, dated Jan. 4, 2013.
Response to OA from U.S. Appl. No. 13/029,005, filed Apr. 17, 2013.
Office Action from U.S. Appl. No. 12/848,825, dated Nov. 5, 2012.
Response to OA from U.S. Appl. No. 12/848,825, filed Feb. 5, 2013.
Office Action from U.S. Appl. No. 13/029,005, dated Jun. 11, 2013.
Office Action from U.S. Appl. No. 12/901,405, dated Jan. 9, 2013.
Response to OA from U.S. Appl. No. 12/901,405, filed Apr. 29, 2013.
Office Action from U.S. Appl. No. 12/985,275, dated Feb. 28, 2013.
Response to OA from U.S. Appl. No. 12/985,275, filed May 28, 2013.
Office Action from U.S. Appl. No. 13/018,291, dated Mar. 20, 2013.
Response to OA from U.S. Appl. No. 13/018,291, filed May 20, 2013.
Office Action from U.S. Appl. No. 13/022,490, dated Apr. 2, 2013.
Office Action from U.S. Appl. No. 13/018,291, dated May 31, 2013.
Office Action from U.S. Appl. No. 12/636,958, dated Jul. 19, 2012.
Response to OA from U.S. Appl. No. 12/636,958, filed Nov. 19, 2012.
Office Action from U.S. Appl. No. 13/054,501, dated May 31, 2013.
Office Action from U.S. Appl. No. 13/028,946, filed Apr. 11, 2013.
Office Action from U.S. Appl. No. 13/028,913, dated Apr. 29, 2013.
Office Action from U.S. Appl. No. 12/901,405, dated Jul. 1, 2013.
Office Action from U.S. Appl. No. 13/018,291, dated Oct. 10, 2012.
Response to OA from U.S. Appl. No. 13/018,291, filed Jan. 7, 2013.
Office Action from U.S. Appl. No. 13/022,490, dated Nov. 7, 2012.
Response to OA from U.S. Appl. No. 13/022,490, filed Feb. 1, 2013.
Office Action from U.S. Appl. No. 13/034,501, dated Dec. 3, 2012.
Response to OA from U.S. Appl. No. 13/034,501, filed Apr. 3, 2013.
Office Action from U.S. Appl. No. 13/028,946, dated Dec. 4, 2012.
Response to OA from U.S. Appl. No. 13/028,946, filed Jan. 29, 2013.
Office Action from U.S. Appl. No. 13/029,005, dated Jan. 24, 2013.
Office Action from U.S. Appl. No. 13/028,946, dated Jul. 16, 2012.
Response to OA from U.S. Appl. No. 13/028,946, filed Oct. 8, 2012.
Office Action from U.S. Appl. No. 13/029,025, dated Jul. 16, 2013.
Office Action from U.S. Appl. No. 13/430,478, dated Jun. 18, 2013.
Office Action from U.S. Appl. No. 13/022,490, dated Oct. 17, 2013.
Office Action from U.S. Appl. No. 11/149,999, dated May 13, 2013.
Response to OA from U.S. Appl. No. 11/149,999, filed Sep. 13, 2013.
Office Action from U.S. Appl. No. 12/985,275, dated Aug. 27, 2013.
Office Action from U.S. Appl. No. 13/358,901, dated Oct. 9, 2013.
Office Action from U.S. Appl. No. 13/028,863, dated Jul. 30, 2013.
Office Action from U.S. Appl. No. 13/028,913, dated Nov. 4, 2013.
Office Action from U.S. Appl. No. 13/029,063, dated Oct. 23, 2013.
Office Action from U.S. Appl. No. 13/028,946, dated Oct. 31, 2013.
Office Action from U.S. Appl. No. 13/029,068, dated Nov. 15, 2013.
Office Action from U.S. Appl. No. 13/029,025, dated Dec. 6, 2013.
Office Action from U.S. Appl. No. 11/149,999, dated Jan. 15, 2014.
Office Action from U.S. Appl. No. 13/034,501, dated Jan. 23, 2014.
Office Action from U.S. Appl. No. 13/028,913, dated Feb. 19, 2014.
Office Action from U.S. Appl. No. 13/028,863, dated Mar. 4, 2014.
Office Action from U.S. Appl. No. 13/430,478, dated Feb. 21, 2014.
Office Action from U.S. Appl. No. 13/358,901, dated Mar. 6, 2014.
Office Action from U.S. Appl. No. 13/018,291, dated Mar. 7, 2014.
Office Action from U.S. Appl. No. 13/029,025, dated Mar. 19, 2014.
Office Action from U.S. Appl. No. 13/029,063, dated Apr. 1, 2014.
Office Action from U.S. Appl. No. 12/985,275, dated Apr. 10, 2014.
Office Action from U.S. Appl. No. 13/029,068, dated Apr. 24, 2014.
Office Action from U.S. Appl. No. 13/024,501, dated May 5, 2014.
Office Action from U.S. Appl. No. 13/022,490, dated May 6, 2014.
Office Action from U.S. Appl. No. 13/028,863, dated May 9, 2014.
Office Action from U.S. Appl. No. 13/028,946, dated May 27, 2014.
Office Action from U.S. Appl. No. 13/028,913, dated May 22, 2014.
Office Action from U.S. Appl. No. 13/029,088, dated Jun. 13, 2014.
Office Action from U.S. Appl. No. 13/018,245, dated Jun. 10, 2014.
Office Action from U.S. Appl. No. 13/358,901, dated Jul. 15, 2014.
Response to OA from U.S. Appl. No. 13/358,901, filed Aug. 21, 2014.
Office Action from U.S. Appl. No. 13/340,478, dated Jul. 23, 2014.
Office Action from U.S. Appl. No. 14/014,272, dated Jul. 29, 2014.
Office Action from U.S. Appl. No. 13/029,025, dated Aug. 6, 2014.
Office Action from U.S. Appl. No. 12/985,275, dated Aug. 7, 2014.
Office Action from U.S. Appl. No. 12/901,405, dated Aug. 7, 2014.
Notice to Submit a Response from Korean Patent Application No. 30-2011-0008448, dated Apr. 16, 2012.
Notice to Submit a Response from Korean Patent Application No. 30-2011-0008445, dated Apr. 16, 2012.
Notice to Submit a Response from Korean Patent Application No. 30-2011-0008446, dated Apr. 16, 2012.
Office Action for Taiwanese Patent Application No. 100300961, dated May 7, 2012.
Office Action from Taiwanese Patent Application No. 100300960, dated May 7, 2012.
Notice to Submit a Response from Korean Patent Application No. 30-2011-0024961, dated Sep. 10, 2012.
International Search Report and Written Opinion from PCT Application No. PCT/US2012/044705 dated Oct. 9, 2012.
Notice to Submit a Response from Korean Patent Application No. 30-2011-0008446, dated Oct. 22, 2012.
Search Report and Written Opinion from PCT Application No. PCT/US2012/072108, dated Feb. 27, 2013.
International Search Report and Written Opinion from PCT Application No. PCT/US2011/000389, dated May 6, 2013.
International Search Report and Written Opinion from PCT Application No. PCT/US2011/000390, dated May 6, 2013.
International Preliminary Report on Patentability from PCT/US2011/00389, dated May 8, 2013.
International Preliminary Report on Patentability from PCT/US2011/000390, dated May 8, 2013.
Reasons for Rejection from Japanese Patent Appl. No. 2011-198454, dated Mar. 7, 2013.
Notice of Reasons for Rejection from Japanese Patent Appl. No. 2012-543086, dated Aug. 27, 2013.
Decision of Dismissal of Amendment, Decision of Rejection from Japanese Patent Appl. No. 2011-231319, dated Oct. 15, 2013.
Office Action from Japanese Patent Appl. No. 2012-556063, dated Oct. 11, 2013.
Office Action from Japanese Patent Appl. No. 2012-556066, dated Oct. 25, 2013.
Office Action from Japanese Patent Appl. No. 2012-556065, dated Oct. 25, 2013.
Office Action from Japanese Patent Appl. No. 2012-556064, dated Oct. 29, 2013.
Notice of Reasons for Rejection from Japanese Patent Appl. No. 2012-543086, dated Dec. 24, 2013.
Office Action from Japanese Patent Appl. No. 2012-556062, dated Dec. 20, 2013.
International Preliminary Report on Patentability and Written Opinion from PCT/US2012/044705 dated Jan. 7, 2014.
Office Action from Japanese Patent appl. No. 2012-556063, dated Jan. 28, 2014.
Comments on the Written Opinion and Amendment of the Application from European Patent appl. No. 12740244.4, dated Feb. 20, 2014.
International Search Report and Written Opinion from PCT/US2013/057712 dated Feb. 4, 2014.
First Office Action from Chinese Patent Appl. No. 201080062056.X, dated Feb. 12, 2014.

(56) References Cited

OTHER PUBLICATIONS

Office Action from Japanese Patent Appl. No. 2012-556066, dated Mar. 14, 2014.
First Office Action from Chinese Patent Application No. 2011800207069, dated May 5, 2014.
First Office Action from Chinese Patent Application No. 201180022606, dated May 4, 2014.
First Office Action from Chinese Patent Appl. No. 201180020709.2, dated May 4, 2014.
Office Action from U.S. Appl. No. 13/029,068, dated Jun. 13, 2014.
Decision to Grant from Japanese Patent Appl. No. 2012-556066, dated Jul. 4, 2014.
Decision of Rejection from Japanese Patent Appl. No. 2012-556064, dated Jun. 6, 2014.
First Office Action and Search Report from Chinese Patent Appl. No. 201180022620X, dated Jul. 1, 2014.
First Office Action from Chinese Patent Appl. No. 2011800223856, dated Aug. 1, 2014.
First Office Action from Chinese Patent Appl. No. 2011800226248, dated Aug. 25, 2014.
Official Action from European Patent Appl. No. 11710348.1-1757, dated Oct. 9, 2014.
Office Action from Japanese Patent Appl. No. 2012-556065, dated Aug. 5, 2014.
Office Action from Japanese Patent Appl. No. 2012-556062, dated Aug. 5, 2014.
First Office Action from Chinese Patent Appl. No. 2011800223837, dated Jul. 24, 2014.
Office Action from European Patent Appl. No. 11710906.6-1757, dated Sep. 10, 2014.
Second Office Action from Chinese Appl. No. 201080082056.X, dated Sep. 29, 2014.
First Office Action and Search Report from Chinese Appl. No. 2011800223856, dated Aug. 1, 2014.
Communication from European Appl. No. 12816621.2-1757, dated Sep. 25, 2014.
Pretrial Report from Japanese Patent Appl. No. 2011-231319, dated Apr. 14, 2014.
U.S. Appl. No. 12/463,709, filed May 11, 2009, Donofrio, et al.
U.S. Appl. No. 14/183,218, filed Feb. 18, 2014, Reiherzer, et al.
Cree XLamp XQ Family of LEDs, XLamp XEQ-LED, www.cree.com/LED-Components-and-Modules/Products/XLamp/Discrete-Direction.
T-Clad Thermal Insulated Metal Substrate from Bergquist Mfg Company, Prescott, Wisconsin.
Cree XLamp XT-E High Voltage White LEDs from Cree, Inc., www.cree.com/xlamp, 16 pages.
U.S. Appl. No. 61/047,824, filed Apr. 25, 2008, Le Toquin.
Narendran, et al., Solid State Lighting: Failure Analysis of White LEDs, Journal of Crystal Growth, vol. 268, Issues 1-4, Aug. 2004, Abstract.
Narendran, et al., "Color Rendering Properties of LED Light Sources", 2002, pp. 1-8.
U.S. Dept. of Energy, DOE Solid-State Lighting CALiPER Program, Summary of Results: Round 3 of Product Testing, Oct. 2007.
U.S. Dept. of Energy, "DOE Solid-State Lighting CALiPER Program, Summary of Results: Round 4 of Product Testing", Jan. 2008.
U.S. Dept. of Energy, "DOE Solid-State Lighting CALiPER Program, Summary of Results: Round 5 of Product Testing", May 2008.
Kim, et al., "Strongly Enhanced Phosphor Efficiency in GaInN White Light-Emitting Diodes Using Remote Phosphor Configuration and Diffuse Reflector Cup", Japanese Journal of Applied Physics 44(21):L649-L651 (2005).
Invitation to Pay Additional Fees and, Where Applicable, Protest Fee (7 pages) corresponding to International Appl. No. PCT/US2008/009234; dated Nov. 14, 2008.
International Search Report and Written Opinion (11 pages) corresponding to International Appl. No. PCT/US2007/01382; dated Feb. 20, 2008.
International Search Report and Written Opinion (15 pages) corresponding to International Application No. PCT/US2009/002193; dated Jul. 20, 2009.
Office Action from Taiwanese Patent Appl. No. 097102415, dated Oct. 16, 2013.
Second Office Action from Chinese Patent App. No. 200980121269.2, dated Dec. 19, 2012.
Office Action from Japanese Patent Appl. No. 2011-506258, dated Sep. 14, 2012.
Press Release from LED Lighting Fixtures dated May 4, 2007 entitled "LED Lighting Fixtures to Expand Product Line".
OptoLED Lighting, Inc., OptoLED Product Information, 2009, Publisher: OptoLED GmBH website: accessed at http://222.optoled.de/english/products/led.html.
Permlight, Inc., Enbryten LED Product Info., Feb. 2005, from Permlight, Inc., website: http://www.webarchive.org displaying that www.permlight.com/products/LEDfixtures.asp was publicly available Jan. 2004.
Press Release from LED Lighting Fixtures dated Apr. 24, 2006 entitled "LED Lighting Fixtures, Inc. achieves unprecedented gain in light output from new luminaire".
Press Release from LED Lighting Fixtures dated Feb. 16, 2006 entitled "LED Lighting Fixtures, Inc. Announces Record Performance".
Press Release from LED Lighting Fixtures dated Feb. 7, 2007 entitled "LED Lighting Fixtures, Inc. Announces its first LED-based Recessed Down Light".
Press Release from LED Lighting Fixtures dated Jan. 26, 2006 entitled "LED Lighting Fixtures, Creates 750 Lumen Recessed Light and Uses Only 16 Watts of Power".
Press Release from LED Lighting Fixtures dated May 30, 2006 entitled "LED Lighting Fixtures, Inc. Sets World Record at 80 Lumens per Watt for Warm White Fixture".
Shimizu, "Development of High-Efficiency LED Downlight", First International Conference on White LEDs and Solid State Lighting, Nov. 30, 2007.
Van De Ven, et al., "Warm White Illumination with High CRI and High Efficacy by Combining 455 nm Excited Yellowish Phosphor LEDs and Red AlInGap LEDs," First International Conference on White LEDs and Solid State Lighting, Nov. 30, 2007.
Color Kinetics, Inc., Color Kinetics Support: White Papers & Presentations; available at http://www.colorkinetics.com/support/whitepapers/: Solid State Lighting White Papers & Presentations, Feb. 22, 2006, pp. 1-4.
Color Kinetics, Inc., "Color Quality of Intelligent Solid-State Light Systems" Color Quality of Solid-State Light Sources, Mar. 2005, pp. 1.3.
CSA International, "Test Data Report", Project No. 1786317, Report No. 1786317-1 (Apr. 2006).
DOE SSL CALiPer Report, "Product Test Reference: CALiPer 07-31 Downlight Lamp".
DOE SSL CALiPer Report, "Product Test Reference, CALiPer 07-47 Downlight Lamp".
Krames et al., Lumileds Lighting, Light from Silicon Valley, Progress and Future Direction of LED Technology, SSL Workshop, Nov. 13, 2003, Publisher: Lumileds Lighting, Inc., pp. 1-21.
Press Release from LED Ligating Fixtures dated Nov. 28, 2007 entitled "New Lamp from LED Lighting Fixtures Shatter World Record for Energy Efficiency".
Schlotter, et al., "Luminescence Conversion of Blue Light Emitting Diodes", App. Phys. A. 64, 417-418 (1997).
Chhajed, S., *Influence of junction temperature on chromaticity and color-rendering properties of trichromatic white-light sources* . . . , Journal of Applied Physics, 2005, vol. 97pp. 1-8.
Compound Semiconductors Online, "LED Lighting Fixtures, Inc. Sets World Record at 80 Lumens per Watt for Warm White", Compound Semiconductors Online, May 30, 2006, pp. 1.
Cree, Inc., "Creek® Xlamp® 7090 XR-E Series LED Binning and Labeling," Application Note: CLD-AP08.000, 7pp (2006).
Boehlen et al., "Laser micro-machining of high density optical structures on large substrates," Proc. of SPIE Vo 5339, 2004, pp. 118-126.

(56) References Cited

OTHER PUBLICATIONS

White Light LED, Part Nos. NSPW300BS and NSPW312BS, High Brightness LEDs, Nov. 12, 1999, Publisher: Nichia Corporation.
Third Office Action from Chinese Patent Appl. No. 2011800223856—translations only, original already submitted.
Official Notification and Search Report from Taiwanese Patent appl. No. 10421609300, dated Dec. 1, 2015.
Official Notification and Search Report from Taiwanese Patent appl. No. 10421621560, dated Dec. 2, 2015.
Third Office Action from Chinese Patent Appl. No. 2011800226248, dated Nov. 20, 2015.
Official Notification and Search Report from Taiwanese Patent appl. No. 10421651990, dated Dec. 7, 2015.
Notice of Issuance from Chinese Patent Appl. No. 2011800226063X, dated Dec. 10, 2015.
Official Notification and Search Report from Taiwanese Patent Appl. No. 10421595210, dated Nov. 27, 2015.
Office Action from Chinese Patent Appl. No. 201180022583.2, dated Dec. 17, 2015.
Examination from European Patent appl. No. 11 710 906.6-1757, dated Jan. 8, 2016.
Examination from Euroyean Patent appl. No. 11 710 348.1-1757, dated Jan. 8, 2016.
Foreign Notice of Allowance for European Application No. 11710906.6; dated Sep. 2, 2016.
Office Action for U.S. Appl. No. 14/108,815; dated Sep. 16, 2016.
Office Action for U.S. Appl. No. 13/536,707; dated Oct. 19, 2016.
Foreign Office Action for Japanese Appl. No. 2012-556065; dated Nov. 22, 2016.
Foreign Office Action for Chinese Appl. No. 2011800207069; dated Nov. 29, 2016.
Foreign Office Action for Chinese Appl. No. 201180022620; dated Dec. 1, 2016.
Foreign Office Action for Chinese Appl. No. 2011800226267; dated Dec. 15, 2016.
Notice of Allowance for Chinese Application No. 201180022624.8; dated Jan. 3, 2017.
Office Action for U.S. Appl. No. 13/029,068; dated Jan. 10, 2017.
Office Action from U.S. Appl. No. 13/029,025; dated Jan. 6, 2016.
Office Action from U.S. Appl. No. 13/430,478; dated Jan. 7, 2016.
Office Action from U.S. Appl. No. 13/758,763; dated Feb. 2, 2016.
Office Action from U.S. Appl. No. 13/029,063; dated Feb. 11, 2016.
Decision of Rejection for Chinese Patent Application No. 2015800540943, dated Mar. 3, 2021, 13 pages.
Li, Zong-Tao, et al., "Detailed Study on Pulse-Sprayed Conformal Phosphor Configurations for LEDs", Journal of Display Technology, vol. 9, Issue 6, Jun. 2013, IEEE, pp. 433-440.
Examination Report for European Patent Application No. 15750564.5, dated Apr. 29, 2021, 5 pages.
Intention to Grant for European Patent Application No. 15750564.5, dated Dec. 8, 2021, 8 pages.

* cited by examiner

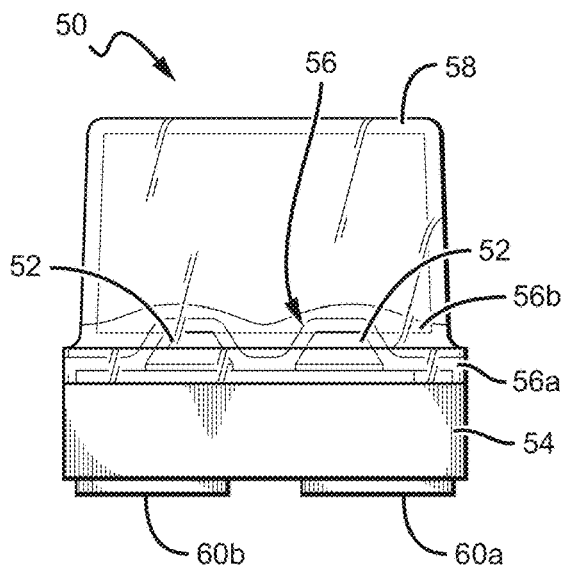
FIG. 8
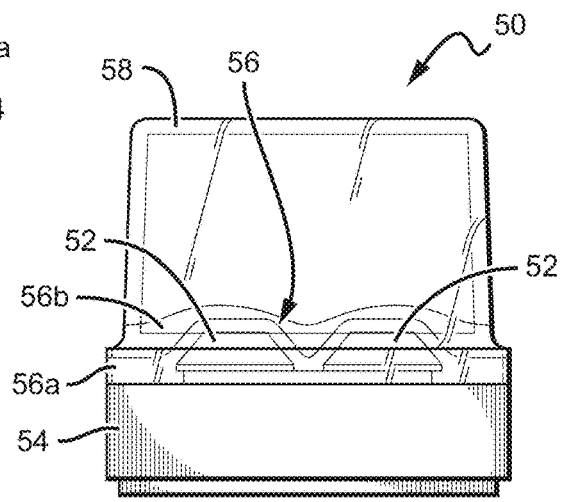
FIG. 9
FIG. 10
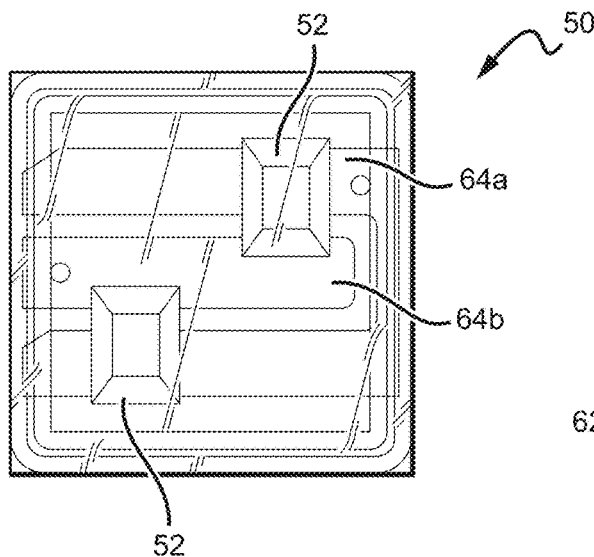
FIG. 11
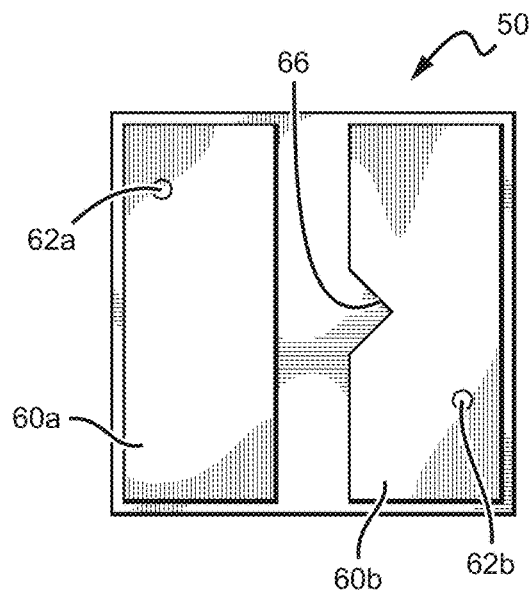

|  | Yellow | Green | Red1 | Red2 |
|---|---|---|---|---|
| Bi-Layer | 10% (>100% more by weight) | 90% (>10% more by weight) | 75% (>20% less by weight) | 25% (>70% less by weight) |
| Mixed | 5.4% | 94.60% | 50% | 50% |

|  | Color Bin | Recipe | G/(Y+G) | Red2/(Red2+Red1) |
|---|---|---|---|---|
| Bi-Layer 90CRI | E8 | 1st Layer: Red1+Red2 2nd Layer: Green+Yellow | 90% | 25% |
| 90CRI POR | E8 | Green+Yellow+Red1+Red2 | 95% | 50% |

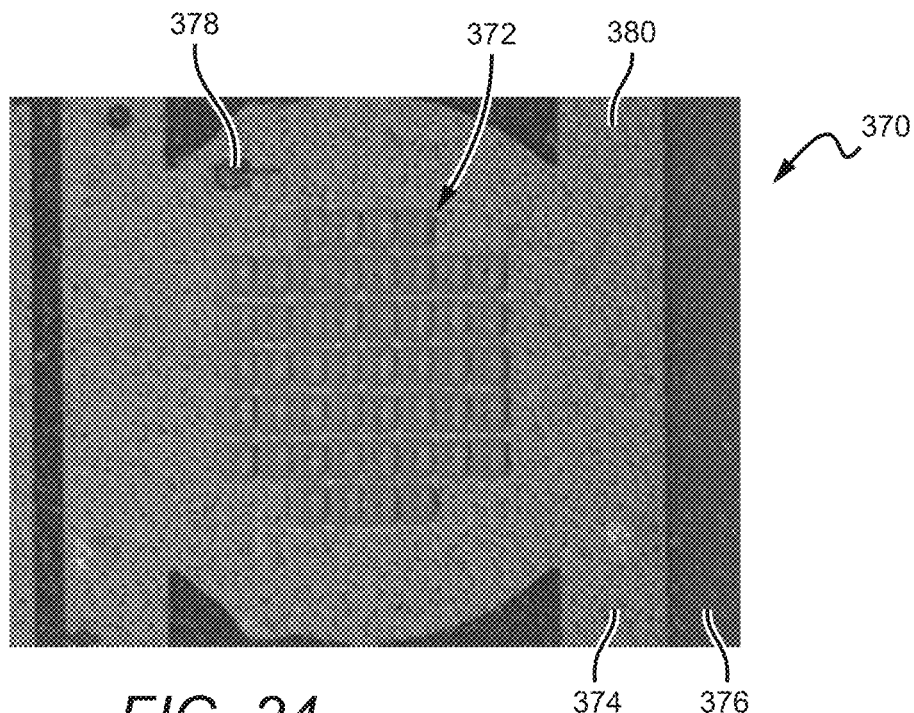
FIG. 24
FIG. 25
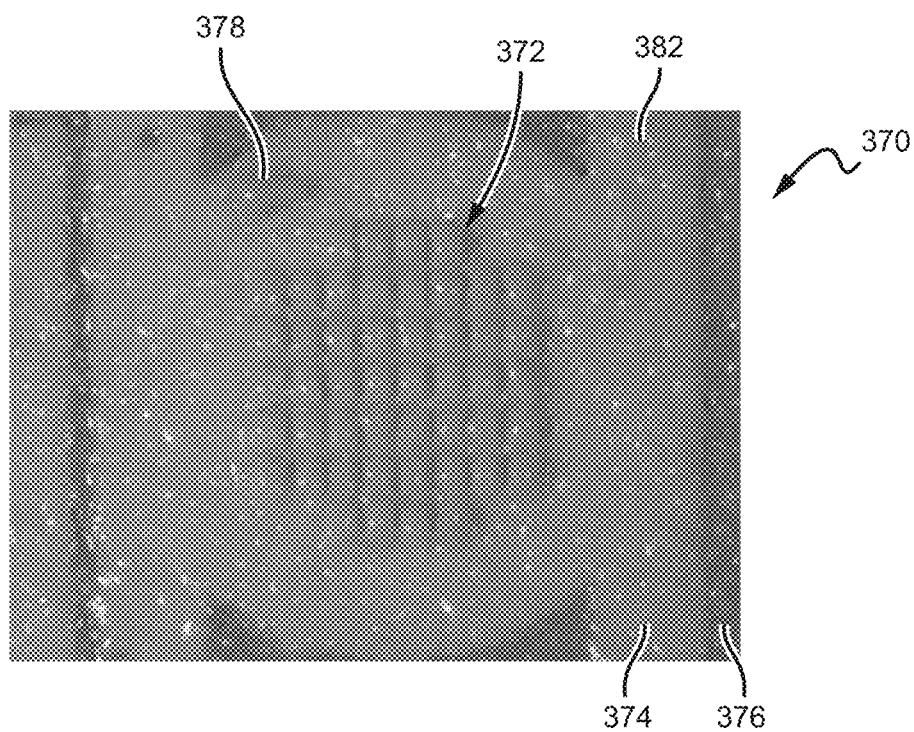

MULTI-LAYER CONVERSION MATERIAL FOR DOWN CONVERSION IN SOLID STATE LIGHTING

This application is a continuation-in-part of and claims the benefit of U.S. patent application Ser. No. 13/028,863, to Tong et al., filed on Feb. 16, 2011, now U.S. Pat. No. 9,275,979, and U.S. patent application Ser. No. 13/649,052, to Lowes et al., filed on Oct. 10, 2012, now U.S. Pat. No. 9,048,396.

BACKGROUND OF THE INVENTION

Field of the Invention

This invention relates to solid state light sources and in particular to efficient and reliable light emitting diode (LED) packages having enhanced emission characteristics through separation of different phosphor components.

Description of the Related Art

Incandescent or filament-based lamps or bulbs are commonly used as light sources for both residential and commercial facilities. However, such lamps are highly inefficient light sources, with as much as 95% of the input energy lost, primarily in the form of heat or infrared energy. Compact Fluorescent Lamps are more effective than incandescent at converting the electricity into light but require the use of toxic materials such as Hg such that when the lamps are disposed of these toxic materials that can pollute the environment, including underground water supplies. One solution for improving the efficiency of lamps or bulbs is to use solid state devices such as light emitting diodes (LED or LEDs), rather than metal filaments, to produce light.

Light emitting diodes generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED or LED chip 12 is mounted on a reflective cup 13 by means of a solder bond or conductive epoxy. One or more wire bonds 11 connect the ohmic contacts of the LED chip to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflective cup due to the less than 100% reflectivity of practical reflector surfaces). In addition, heat retention may be an issue for a package such as the package 10 shown in FIG. 1a, since it may be difficult to extract heat through the leads 15A, 15B.

A conventional LED package 20 illustrated in FIG. 2 may be more suited for high power operations which may generate more heat. In the LED package 20, one or more LEDs 22 are mounted onto a carrier such as a printed circuit board (PCB) carrier, substrate or submount 23. A metal reflector 24 mounted on the submount 23 surrounds the LED chip(s) 22 and reflects light emitted by the LEDs 22 away from the package 20. The reflector 24 also provides mechanical protection to the LEDs 22. One or more wire bond connections 27 are made between ohmic contacts on the LED chips 22 and electrical traces 25A, 25B on the submount 23. The mounted LEDs 22 are then covered with an encapsulant 26, which may provide environmental and mechanical protection to the chips while also acting as a lens. The encapsulant 26 can also comprise one or more convention materials (e.g. phosphors) that absorb light from the LED chips and re-emit light with different wavelengths of light. The overall emission from the package 20 can be a combination of light from the LEDs 22 and the re-emitted light from the conversion material. The metal reflector 24 is typically attached to the carrier by means of a solder or epoxy bond.

LEDs, such as those found in the LED package 20 of FIG. 2 can also be coated by conversion material comprising one or more phosphors, with the phosphors absorbing at least some of the LED light. The LED can emit a different wavelength of light such that it emits a combination of light from the LED and the phosphor. The LEDs can be coated with a phosphor using many different methods, with one suitable method being described in U.S. patent application Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089 to Tarsa et al. entitled "Close Loop Electrophoretic Deposition of Semiconductor Devices".

Lamps have also been developed utilizing solid state light sources, such as LEDs, with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light through a phosphor. In some embodiments the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759 to Negley et al., entitled "Lighting Device."

The coated LEDs, LED packages and solid state lamps described above can utilize more than one type of conversion material, such as phosphors, to produce the desired overall emission temperature and CRI. Each of the phosphors can absorb light from the LED and re-emit light at a different wavelength of light. Some of these conventional arrangements can utilize a green/yellow phosphor, in combination with a red or orange phosphor, with these phosphors typically absorbing blue LED light and emitting green/yellow and red light, respectively. The re-emitted light can combine with blue LED light to produce the desired emission characteristics.

These conventional arrangements typically mix the different phosphors together at one location, such as in the LED coating, LED package encapsulant, or lamp remote phosphor. One disadvantage of mixing the phosphors together is that there can be significant "cross-talk" or "overlap" between the emission and excitation spectrum for the different phosphors, which can negatively impact the CRI and emission efficiency for the combined emitted light. FIG. 3 shows graphs 30 showing one example of the emission and excitation characteristics for conventional phosphors that can be mixed together. The first graph 30 shows the red phosphor excitation spectrum 32, green phosphor emission spectrum 34, and the red emission spectrum 36. The second graph 40 shows the same red phosphor emission excitation spectrum 32, yellow phosphor emission spectrum 42, and the same red phosphor emission spectrum 36. The shaded overlap regions 38, 44 show the portion of the green and yellow emission spectrums 34, 42 that overlap the red excitation spectrum 32. This overlap can result in "re-absorption" of the converted yellow/green phosphor light by the red phosphor. This converts a portion of the yellow/green that would otherwise contribute to overall emission, to red. In lighting components using these phosphors to produce a white light combination from the LED and phosphors, the re-absorption distorts the resulting white light on the black body curve of a CIE graph such that the yellow/green peak emission can shift to red, and the red peak can shift to blue. This can result in a CRI reduction in the overall emission. There is also some efficiency loss associated with the phosphor absorption and emission process, and repeating this process through re-absorption of the yellow/green light by the red phosphor results in additional efficiency losses.

SUMMARY OF THE INVENTION

The present invention is directed to different LEDs having conversion materials arranged in a layered fashion to improve the LEDs' characteristics. Some of these characteristics include improved emission intensity and color rendering index (CRI), while others can include a reduction in the amount of costly conversion material needed to reach a desired color point or CRI. In some embodiments the different conversion material layers can be arranged so that respective layers absorb light from the LED light source and re-emit light in different wavelength spectrum. In some embodiments, the layers can be tailored so that there is minimal overlap of the emission and excitation spectrums for the conversion materials in the layers.

One embodiment of an LED according to the present invention comprises one or more LED chips on a surface of a submount. A conversion material layer comprising two or more layers of different conversion materials is included covering the one or more LED chips and at least a portion of the submount around said LED chips. An encapsulant is included over the LED chips and the submount.

One embodiment of a solid state emitter according to the present invention comprises one or more of solid state light sources on a planar surface of a submount. A plurality of conversion material layers are included over the light sources and over at least part of the planar surface. One of the conversion material layers that is below the top one of the conversion material layers emits a wavelength of light that does not substantially overlap with the excitation spectrum of one of the layers above it. An encapsulant is included over the solid state light sources and the submount.

Another embodiment of an LED according to the present invention comprises an LED chip. A conversion material layer is included comprising two or more layers of different conversion materials, with the conversion material layer covering said LED chip and the area around the LED chip. The LED produces improved emission characteristics compared to the same LED having a conversion material layer with mixed conversion materials.

These and other aspects and advantages of the invention will become apparent to those skilled in the art from the following detailed description and the accompanying drawings, which illustrate by way of example the features of the invention.

BRIEF DESCRIPTION OF THE DRAWINGS

FIG. 8 is a back view of the LED shown in FIG. 4;

FIG. 9 is a right side view of the LED shown in FIG. 4;

FIG. 10 is a top view of the LED shown in FIG. 4;

FIG. 11 is bottom view of the LED shown in FIG. 4;

FIG. 24 is a top view of another embodiment of an LED according to the present invention at one of its manufacturing steps; and FIG. 25 is a top view of the LED chip in FIG. 24 at a subsequent manufacturing step.

DETAILED DESCRIPTION OF THE INVENTION

Figure 1:
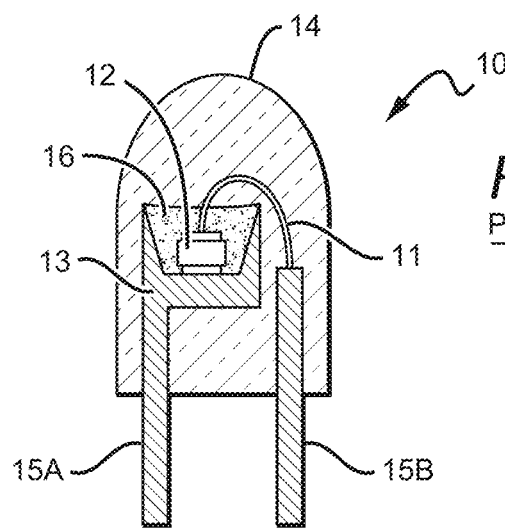
FIG. 1 shows a sectional view of one embodiment of a prior art LED lamp.
Figure 2:
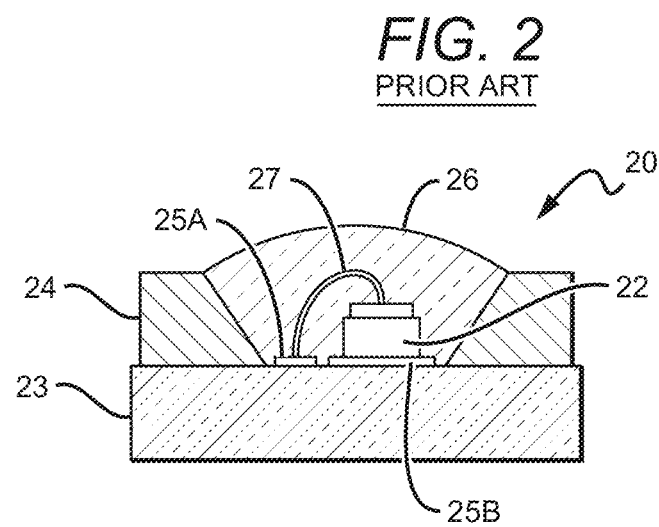
FIG. 2 shows a sectional view of another embodiment of a prior art LED lamp.

The present invention is directed to solid state emitters, such as light emitting diodes (LED or LEDs) that utilize multiple conversion materials or phosphor types in the conversion process in order to achieve the desired emission color point. Different embodiments of the present invention can apply the different phosphor types in separate layers on, above or around one or a plurality of LED chips to achieve the desired light down conversion. The LEDs can then emit a desired combination of light from the LED chips and conversion material, such as a white light combination.

In some embodiments, one or more of the phosphor layer can be a relatively thin conformal layer having a substantially uniform phosphor particle density. In other embodiments, a phosphor layer may be provided that comprises phosphor particles that are nonuniformly dispersed therein. In some embodiments the layers can have a phosphor-free regions in different locations, such as at the exterior surfaces or near the edges of the phosphor layer. The phosphor layer, or any wavelength conversion layer, can convert a portion of the light emitted from the LED chip to a different wavelength, a process that is known in the art. One example of this process, is converting a portion of blue-emitted light from an LED chip, to yellow/green and red light. As further described below, there are many different phosphors that can be used for this type of light conversion.

In some embodiments, conversion materials can be applied as layers of different phosphor types in order of longest emission wavelength phosphor first (e.g. red), followed by shorter emission phosphors (e.g. yellow or green) in sequence as opposed to applying in a homogeneously mixed phosphor converter. The conversion material layers can be applied as a blanket over the LED chips and the area surrounding the chip, such as the surface of the submount holding the LED chips. The advantages that can be realized with embodiments according to the present invention can include, but is not limited to, improved efficiency at the same color rendering index (CRI), enhanced CRI at the same efficiency, and a reduction in the quantity of certain phosphors needed to achieve a given color target. For example, red phosphors are relatively expensive and in the case where less red phosphors are used the cost savings can be significant.

Some conversion materials can be arranged in different embodiments described herein to achieve the desired emission efficiency (e.g. lumens per watt (LPW)). This discrete layer arrangement can also be optimized to achieve the desired CRI, R9, Qg, thermal quenching, etc. For some embodiments directed to optimized thermal quenching, the most temperature sensitive conversion material can be placed on the LED surface for improved heat sinking.

The layered arrangements according to the present invention can provide for conversion materials separation to reduce the impact of emission and excitation spectrum overlap. Some embodiments of the present invention are directed to LEDs arranged to produce white light with a warm color temperature by utilizing two separate phosphor components in a way that eliminates or reduces the re-absorption (interaction) between the two component phosphors. That is, the separation reduces the amount of light from the first phosphor that interacts with the second phosphor, to reduce or eliminate the re-absorption by the second phosphor. This in turn reduces the color shift in CRI and losses that may be experienced by this re-absorption. This can result in improved emission efficiency of warm white light with a CRI that is significantly higher than those arrangements where re-absorption is not addressed, such as where the different phosphors are mixed.

In some embodiments, the first phosphor can re-emit a wavelength of light that does not overlap with the excitation spectrum of the second phosphor such that light re-emitted from the first phosphor passes through the second phosphor without risk of being absorbed by the second phosphor. The emission spectrum of the second phosphor, however, may emit light that at least partially overlaps with the excitation spectrum of the first phosphor. In arrangements where light from the second phosphor passes through the first phosphor, there may be a risk of light from the second phosphor being re-absorbed by the first phosphor. The separation of the phosphors minimizes the amount of re-emitted light that encounters the first phosphor, thereby minimizing the amount of light that can be re-absorbed by the first phosphor. To allow light from the first phosphor to pass through the second phosphor, in some embodiments can comprise materials such that the emission spectrum of the first phosphor does not overlap the excitation spectrum of the second phosphor.

In some embodiments, the second phosphor can comprise a yellow/green phosphor that absorbs blue light and re-emits yellow/green light, and the first phosphor can comprise a red phosphor that absorbs blue light and emits red light, with the emission spectrum of the yellow/green phosphor overlapping the excitation spectrum of the red phosphor. As described in more detail below, these embodiments provide separation between the first and second phosphors in a way that minimizes the chances that the yellow/green phosphor emission would encounter the red phosphor, and as a result, there is little chance of re-emitted yellow/green light being reabsorbed by the red phosphor. Compared to the mixed phosphor arrangement, the phosphor separation results in overall lamp or package emission having a higher CRI and higher phosphor efficiency.

The separation can take many different forms that can provide different levels of reduction in crosstalk between the first and second phosphors. In some embodiments the separation can comprise separate layers on an LED chip, formed on top of each other, with each layer being a different one of the phosphors or having different phosphors that generally emit in the same or similar emission spectrums. In other embodiments, one of the phosphors can be separated from the others by an intervening layer, or the phosphor can be provided remote to the other phosphor. This remote arrangement can take many different forms. In some embodiments, one of the phosphors can comprise a conformal coat over one or more LEDs and the second phosphor can be remote to the first phosphor, such as in the shape of dome over the LEDs. This arrangement reduces even further the chances of crosstalk between the first and second phosphors by further reducing the chances that light emitted from the second phosphor would encounter the first phosphor.

Different embodiments can also comprise conversion material layers arranged in many different ways. Some can embodiments can include two phosphors, each of which can be provided in a separate layer as described above (e.g. yellow/green phosphor layer on red phosphor layer). In other embodiments more than two phosphors can be used, with some having two or more phosphors with similar emission characteristics in the first layer and two or more phosphors with similar characteristics in the second layer. In some of these embodiments the first layer can have two or more phosphors that are different but that both emit in the red wavelength spectrum. The second layer can also have two or more different phosphors that emit in the yellow/green emission spectrum. The different phosphor can be chosen to provide the desired LED emission characteristics. In other embodiments utilizing multiple phosphors in different emission spectrum, each of the phosphors can be provided in its own separate layer, while others of the phosphors can be in their own layers or can be mixed in a layer. The converter sequence in different embodiments can take many different permutations of mixed and separated layers. These can include different combinations and sequences such as mixed phosphor on a discrete (single phosphor) layer, a discrete layer on a mixed layer, a discrete layer on a mixed layer on a discrete layer, etc.

The present invention is described herein with reference to certain embodiments, but it is understood that the invention can be embodied in many different forms and should not be construed as limited to the embodiments set forth herein. In particular, the present invention is described below in regards to certain LED packages or lamps having one or multiple LEDs or LED chips or LED packages in different configurations, but it is understood that the present invention can be used for many other lamps having many different configurations. Examples of different lamps arranged in different ways according to the present invention are described below and in U.S. Provisional Patent application Ser. No. 61/435,759, to Le et al., entitled "Solid State Lamp", filed on Jan. 24, 2011, and incorporated herein by reference.

The embodiments below are described with reference to LED or LEDs, but it is understood that this is meant to encompass LED chips and LED packages. The components can have different shapes and sizes beyond those shown and different numbers of LEDs can be included. The present invention is described herein with reference to conversion materials, phosphors, phosphor layers and related terms. The use of these terms should not be construed as limiting. It is understood that the use of the term phosphor or phosphor layers is meant to encompass and be equally applicable to all wavelength conversion materials.

It is also understood that a light source may be comprised of one or multiple LED chips and in embodiments with more than one, different ones of the LED chips can have different emission wavelengths. Although the present invention is described below with reference to phosphor conversion materials, it is understood that many other conversion materials can be used. The present invention is described herein with reference to conversion materials, phosphor layers being remote to one another. Remote in this context refers being spaced apart from and/or to not being on or in direct thermal contact.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures. The phosphors are described herein with referenced to red, yellow or green emitting phosphors, but it is understood that this can include other colors close to these emission colors. For red, by example, this can include those close to red in the light spectrum, such as orange.

The present invention is described herein with reference to certain embodiments, but it is understood that the invention can be embodied in many different forms and should not be construed as limited to the embodiments set forth herein. In particular, the present invention is described below in regards to certain LED packages having LED chips in different configurations, but it is understood that the present invention can be used for many other LED packages with other LED configurations. The LED packages can also have many different shapes beyond those described below, such as rectangular, and solder pads and attach pads can be arranged in many different ways. In other embodiments, the emission intensity of the different types of LED chips can be controlled to vary the overall LED package emission.

The present invention can be described herein with reference to conversion materials, wavelength conversion materials, remote phosphors, phosphors, phosphor layers and related terms. The use of these terms should not be construed as limiting. It is understood that the use of the term remote phosphors, phosphor or phosphor layers is meant to encompass and be equally applicable to all wavelength conversion materials.

The embodiments below are described with reference to an LED or LEDs, but it is understood that this is meant to encompass LED chips, and these terms can be used interchangeably. These components can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

It is also understood that when a feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures. Further, many of the embodiments of the present invention are shown with a "top" primary emission surface. It is understood that any one or more surfaces, including but not limited to a top surface, can be (or can combine to form) a primary emission surface. For example, a package can be designed to have a primary emission out a side emission surface.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 4:
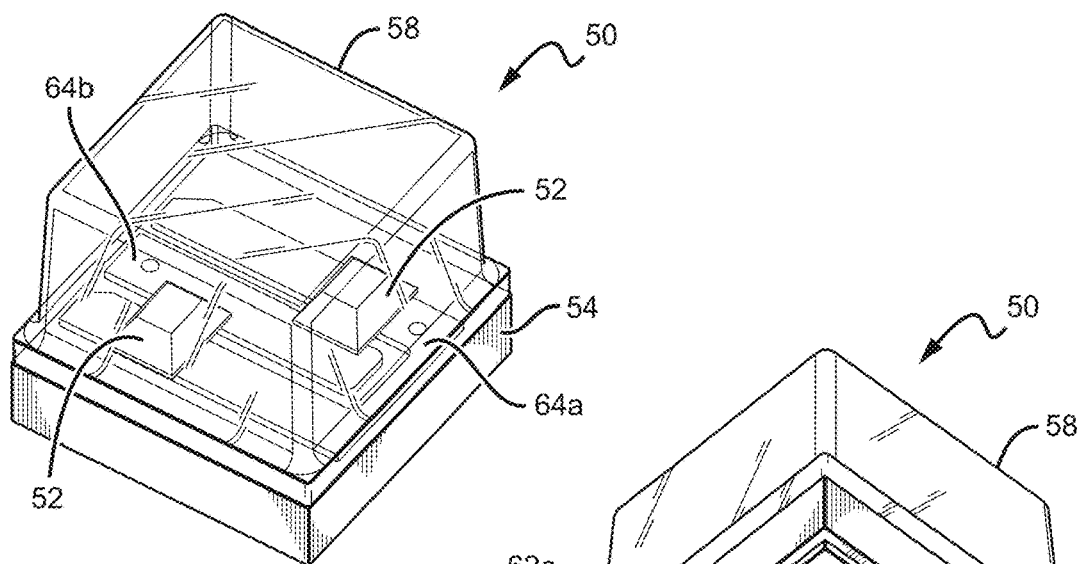
FIG. 4 is a top perspective view of one embodiment of an LED according to the present invention.
Figure 5:
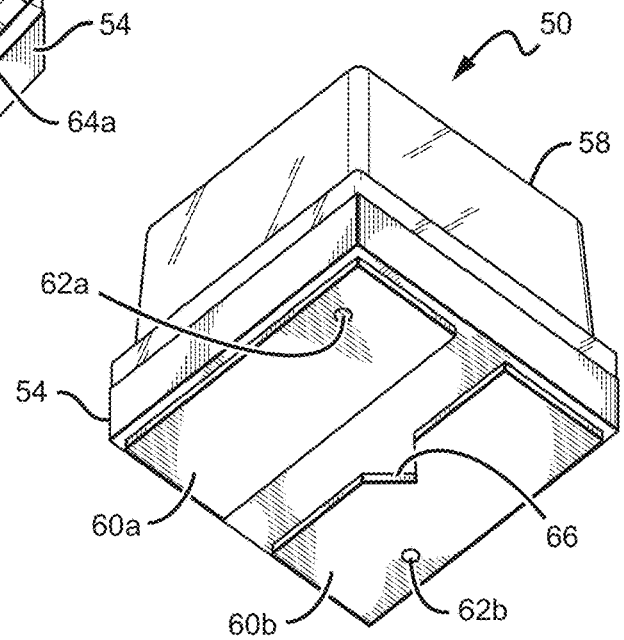
FIG. 5 is a bottom perspective view of the LED shown in FIG. 4.
Figure 6:
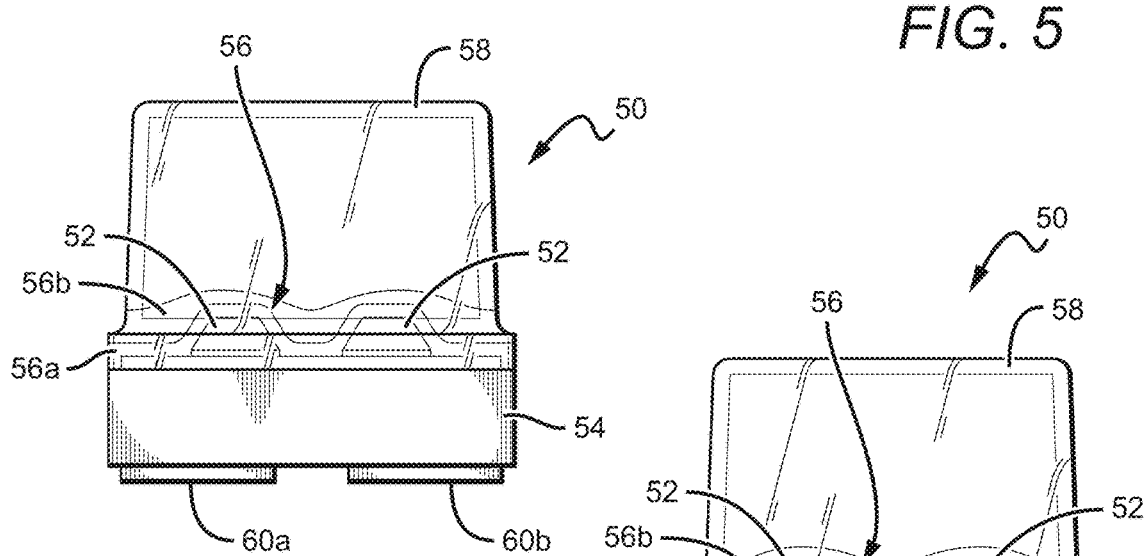
FIG. 6 is a front view of the LED shown in FIG. 4.
Figure 7:
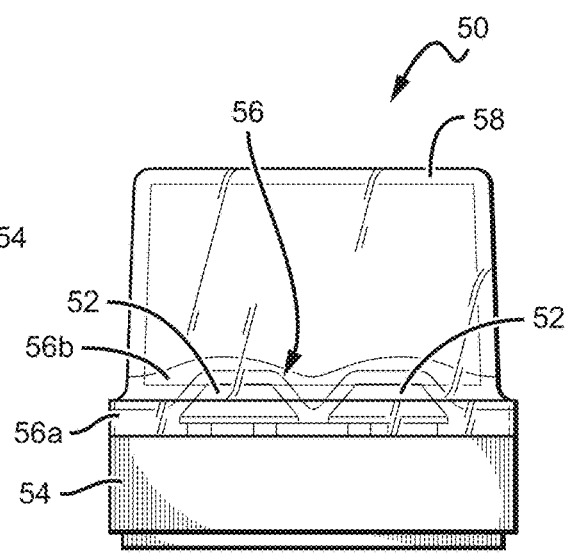
FIG. 7 is left side view of the LED shown in FIG. 4.

FIGS. 4 through 11 show one embodiment of an LED 50 according to the present invention comprising one or more LED chips 52, mounted on a submount 54. The LED 50 also comprises first and second bottom contact/solder pads 60a and 60b on the bottom of the submount 54, first and second conductive vias 62a, 62b passing through the submount 54, and first and second die attach pads 64a, 64b on the top surface of the submount 54. The LED package further comprises a conversion material layer 56 covering the LED chips 52, the exposed surfaces of the die attach pads 64a, 64b, and exposed portions of the top surface of the submount 54. An encapsulant 58 is included over the LED 52, the attach pads 64a, 64b, and the submount 54. FIGS. 4 and 11 show the LED chips 52, attach pads 64a, 64b, and top surface of the submount 54. It is understood that these features may be at least partially obscured by the conversion material layer described below. These features of the LED are shown unobscured for ease of description.

The LED 50 is shown with two LED chips 52 but it is understood that in other embodiments (such as those described below) the light source can comprise one LED chips or more than two LED chips, with some comprising a multiple LED chip array. Many different LED chips can be used such as those commercially available from Cree Inc., under its DA, EZ, GaN, MB, RT, TR, UT and XT families of LED chips. The LED 50 is particularly arranged for use with the DA family of LED chips such as the DA850 chip that can be flip chip mounted and allows for wire-free bonding. These types of chips are generally described in U.S. patent application Ser. No. 12/463,709 to Donofrio et al., entitled "Semiconductor Light Emitting Diodes Having Reflective Structures and Methods of Fabricating Same," now U.S. Pat. No. 8,368,100, which is incorporated herein by reference. The LED 50 can be arranged similar to the LED packages commercially available from Cree, Inc. under product names Xlamp XQ family of LEDs (e.g. Xlamp XQ-B LED). However, in this embodiment the phosphor is arranged in a discrete layered manner as opposed to the conventional mixed conversion material.

The LED chips 52 can emit many different colors of light, with a preferred LED chips 52 emitting light in the blue wavelength spectrum. It is understood that in some embodiments the LED chips can be provided following removal of its growth substrate. In other embodiments, the LED chip's growth substrate can remain on the LED chips 52 with some of these embodiments having a shaped or textured growth substrate. In some embodiments, the LED chips 52 can comprise a transparent growth substrate such as silicon carbide, sapphire, GaN, GaP, etc. The LED chips can also comprise a three dimensional structure and in some embodiments, the LEDs can have structures comprising entirely or partially oblique facets on one or more surfaces of the chip.

The LED 50 further comprises a submount 54, with the LED chips 52 mounted to the submount 54. The submount 54 can be formed of many different materials with a preferred material being electrically insulating, such as a dielectric material. The submount 54 can comprise a ceramic material such as alumina, aluminum nitride, silicon carbide, or a polymeric material such as polymide and polyester. In the preferred embodiment, the submount 54 can comprise a dielectric material having a relatively high thermal conductivity, such as aluminum nitride and alumina. In other embodiments the submount 54 can comprise a printed circuit board (PCB), sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

The top surface of the submount 54 is shown having a planar with patterned conductive features that can comprise first and second die attach pads 64a, 64b. A space is provided between the attach pads 64a, 64b, with the LED chips 52 mounted to the pads 64a, 64b such that respective portions of the LED chips 52 are mounted to a respective one of the pads 64a and 64b and the LED 52 spans the space between the attach pads 64a, 64b. Many different mounting methods can be used, such as methods utilizing conventional solder materials. Other types of LED chips can be electrically connected to the attach pads 64a, 64b or other conductive traces using known surface mount or wire bonding methods depending on the geometry of the LED 50.

The pads 64a, 64b can comprise many different materials, such as metals or other conductive materials, and in one embodiment they can comprise copper deposited using known techniques such as plating. In other embodiments pads 64a, 64b can be sputtered using a mask to form the desired pattern, and in other embodiments they can be formed using known photolithography processes. The pads 64a, 64b can extend beyond the edge of the LED chips 52 to cover most of the top surface of the submount 54. This helps in thermal management for the LED 50 by spreading heat from the LED chips 52 into the pads 64a, 64b so that heat spreads beyond the edge of the LED chips 52 into more area of the submount 54. This allows the heat to be less localized and allows it to more efficiently dissipate through the submount 54 into the ambient.

The LED 50 also comprises first and second solder pads 60a, 60b formed on the bottom surface of the submount 54, which can be used for mounting the LED package 52 in place using known mounting methods. It is understood that in other embodiments LEDs according to the present invention can have more than two solder pads. The solder pads 60a, 60b can be made of the same materials and can be formed of the same way as die attach pads 64a, 64b. First and second conductive vias 62a, 62b can be included that pass through the submount 54 with the vias being formed of an electrically conductive material such as those used for the die attach pads and solder pads, and are arranged to provide an electrically conductive path between the solder pads 60a, 60b and the die attach pads 64a, 64b. In the embodiment shown, first via 62a forms an electrically conductive path between the first solder pad 60a and the first die attach pad 64a, while second via 62b provides a conductive path between the second solder pad 60b and the second die attach pad 64b. This allows an electrical signal applied to the solder pads 60a, 60b to be conducted through the submount 54 along the vias 62a, 62b, to the die attach pads 64a, 64b. The signal is then conducted to the LED chips 52 through the die attach pads. It is understood that in other embodiments the electrical signal can be transmitted to the LED in other ways such as through conductive traces or wire bond pads arranged in different locations in the LED package, and running between the mounting surface or the submount, and the LED.

The LEDs 50 also comprises a polarity indicator 66 in one of the solder pads that can take many different shapes and can comprise a V-shaped notch along an edge of a solder. This polarity indicator 66 can be detected with up-looking cameras on automated pick-and-place equipment during manufacturing. The indicator 66 can be near the center of the pad's inner edge placing it near the center of the submount 54 in the area of the submount 54 that can be visible through hole in a carrier tape. This allows for the indicator 66 (and the corresponding LED package polarity) to be visible and verified carrier tape hole without removing the LED from the carrier tape.

The indicator 66 can have many different shapes beyond V-shaped, such as U-shaped, I-shaped, W-shaped, square shaped, rectangular shaped, star shaped, plus shaped, minus shaped, etc. The notch can also be included in many different locations on the solder pads 60a, 60b. It is noted that other types of polarity indicators can be used, such as holes of different shapes or other cutouts in the solder pads, and in other embodiments the LED packages can have indicators in other locations such as on the top surfaces of the LED 50. In the embodiment shown, the second attach pad 64b can have an indicator to show polarity when viewing the LED package 50 from the top. These indicators can take many different shapes and sizes such as those described above, and in some embodiments can comprise notches or holes as described above.

The conversion material layer 56 is included over the LEDs 52, exposed portions of the pads 64a and 64b, and exposed portions of the submount's top surface. As described in more detail below, the conversion material layer can comprise two or more conversion material layers, each of which has absorbs light from the LED chips 52 and reemits light in a different wavelength range.

Encapsulant 58 is included on the conversion material layer 56, and over the LED 52 and submount 54, with the encapsulant 58 providing environmental and mechanical protection. The encapsulant can take many different shapes and sizes, with some embodiments comprising a hemispheric encapsulant. In other embodiments, the encapsulant 58 can comprise planar surfaces, and in the embodiment shown the encapsulant 58 has a generally cubic shape. The encapsulant includes both vertical and horizontal planar surfaces in the shape of a cube, but it is understood that the encapsulant can take many different shapes such as any shape having a flat top and vertical sidewalls with planar surfaces. These can include but are not limited to different prismatic or polygon shapes such as triangles, pentagons, hexagons, octagons, etc. These shapes can include a horizontal planar surface, with vertical surfaces numbering in the range of 3 to 12 or more. In still other embodiments, the encapsulant can be cylindrical with different cross sections such as circular or oval. Encapsulants with planar surfaces and their advantages are fully described in U.S. patent application Ser. No. 13/649,052, to Lowes et al., now U.S. Pat. No. 9,048,396, which is incorporated herein by reference.

Many different materials can be used for the encapsulant 58 such as silicones, plastics, epoxies or glass, with a suitable material being compatible with molding processes. Silicone is suitable for molding and provides suitable optical transmission properties. It can also withstand subsequent reflow processes and does not significantly degrade over time. The encapsulant can also be formed using many different methods, and in some embodiments a molding process (described in more detail below) can be used that simultaneously forms encapsulants 58 over a multitude of LEDs 52 on a submount panel.

The conversion material layer 56 can also comprise a binder, and different materials can be used for the binder, with materials preferably being robust after curing and substantially transparent in the visible wavelength spectrum. Suitable materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing. It is understood, however, that the phosphor particles can be applied without a binder.

For LED 50, the conversion material layer 56 comprises multiple layers having different conversion materials. The different embodiments can have a conversion material layer that comprise multiple layers with at least one layer below the top layer having an emission (or reemission) spectrum that is substantially outside the excitation spectrum of the top layer. This allows for light from the layer below to pass through the top without being substantially absorbed. This can increase the overall emission efficiency of the LED compared to LEDs with mixed phosphors. This also allows for light from the top layer to emit without most of the light passing back into the lower layer where it might be reabsorbed.

For example, the conversion material layer can comprise a bi-layer arrangement having a first layer 56a that absorbs light from the LED chips 52 and reemits light in the red wavelength spectrum. The conversion material layer 56 can also comprise a second layer 56b that absorbs light from the LED chips 52 and reemits light in the yellow/green wavelength spectrum. It is understood that in some embodiments each of the layers 56a, 56b can comprise more than one conversion material type to generate the desired reemission wavelength. For example, the layer reemitting red can have more than one type of conversion material reemitting in the red spectrum. As described below, many different conversion materials can be used to generate the desired LED package light emission, with the present invention being particularly adapted to LED packages emitting white light.

Figures 12, 13, 14:
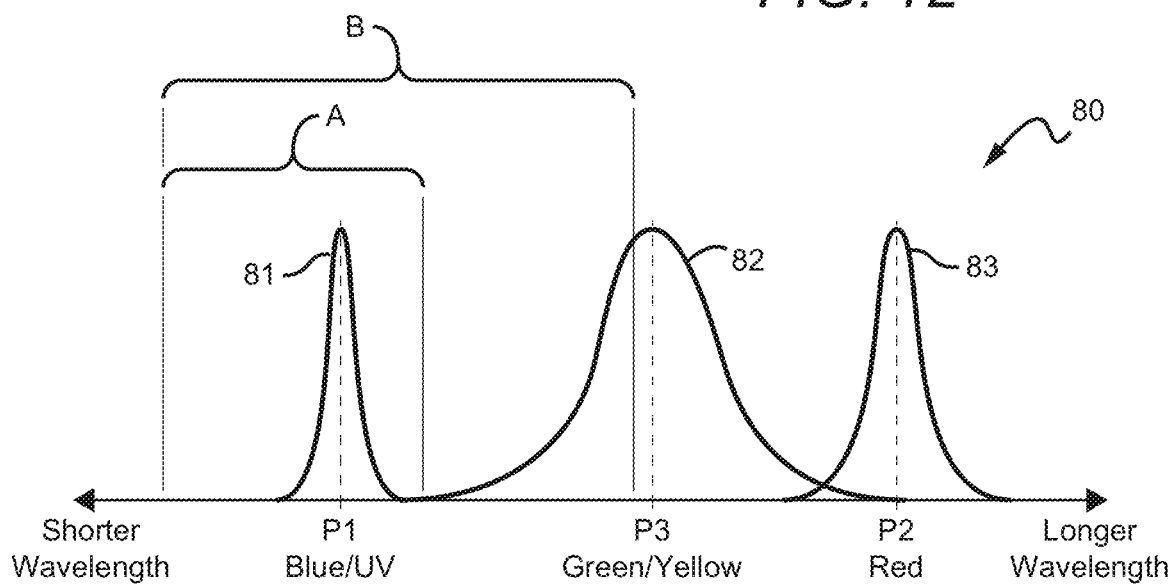
FIG. 12 is a graph showing relationship between the emission spectrum for an LED and the emission and excitation spectrum for phosphors in one embodiment of an LED according to the present invention.
FIG. 13 is a table showing the concentrations of phosphors for one embodiment of an LED according to the present invention in comparison to an LED with mixed conversion materials.
FIG. 14 is a table showing the ratios of concentrations of phosphors for one embodiment of an LED according to the present invention in comparison to an LED with mixed conversion materials.

FIG. 12 is a graph 80 that further illustrates the relationship between emission and excitation wavelength ranges for different phosphor layers included over an LED according to the present invention. In the graph shorter wavelengths are on the left, while longer wavelengths are on the right. Curve 81 represents an exemplary emission spectrum of a blue or UV emitting LED chip such as those that could be used in LED 50. The emission spectrum 81 is centered around a peak wavelength P1 which falls in the blue or UV region of the visible spectrum. Curve 83 represents an exemplary emission spectrum of a phosphor such as can be found in the first conversion material layer 56a described above; i.e. the layer closest to the LED chip. The emission spectrum 83 is centered around a peak wavelength P2 which falls in the red region of the visible spectrum. Curve 82 represents an exemplary emission spectrum of a phosphor that can be found in the second conversion material layer 56b. The emission spectrum 82 is centered around a peak wavelength P3 which falls in the green to yellow region of the visible spectrum.

Figure 3:
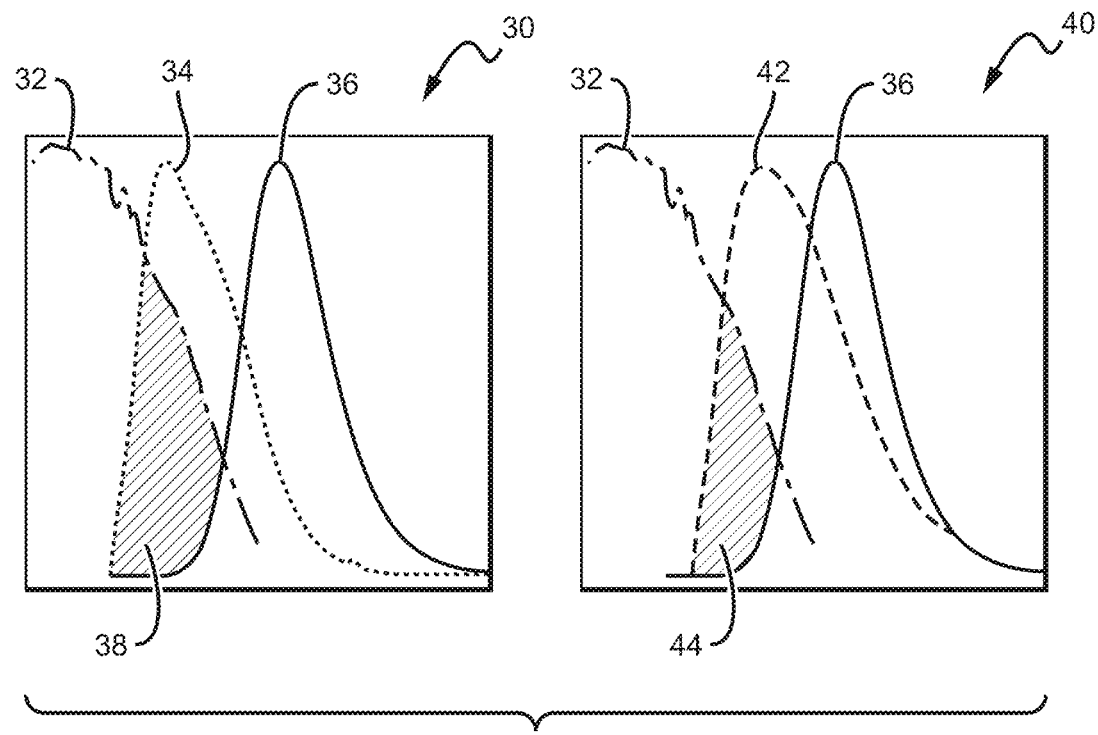
FIG. 3 is a graph showing overlap between the excitation spectrum and emission spectrum of two phosphors.

Graph 80 also shows excitation region A of the green/yellow phosphor and excitation region B of the red phosphor. The emission spectrum 81 of the LED chips may fall within a green/yellow phosphor excitation region A, which generates the emission spectrum 83. That is, the phosphor that emits light having the emission spectrum 82 (i.e. the green/yellow phosphor) can be responsive to light having a wavelength within the excitation region A. The emission spectrum 81 of the LED chips may also fall within a excitation region B of the red phosphor that generates the emission spectrum 83. That is, the phosphor that emits light having the emission spectrum 81 can be responsive to light having a wavelength within the excitation region B. It is understood excitation regions A and B illustrated in FIG. 12 may not have sharp boundaries, but may fall off gradually at the edges thereof as shown in FIG. 3 above. As used herein, a wavelength of light is within an excitation region of a phosphor if a visually perceivable amount of light is emitted by the phosphor in response to stimulation by light at the wavelength that is generated by an LED structure or that is generated in response to light emitted by an LED structure.

The emission spectrum 82 of the green/yellow phosphor can at least partially fall within the excitation region B of the red phosphor. That is, some light that is emitted by the green/yellow phosphor can be re-absorbed by the red phosphor. Such re-absorption can lead to losses, as some energy is lost in every phosphor absorption/emission cycle. The re-absorption can also alter the color point of the combined light output by the structure. However, as further illustrated in FIG. 12, the emission spectrum 83 of the red phosphor is outside the excitation region A of the green/yellow phosphor. Thus, light emitted by the red phosphor may not substantially be absorbed and cause responsive emission by the green/yellow phosphor. It will be appreciated that there may be some negligible absorption of red light by the green/yellow phosphor that may be converted into heat instead of light.

To reduce losses from re-absorption of emitted photons, to provide improved emission characteristics, and/or provide more consistent light output, some embodiments according to the present invention can separate the green/yellow phosphor from the red phosphor containing regions. For example, a green/yellow phosphor layer can be placed on the red phosphor layer so that light from the LED chip(s) passes through the red phosphor first. Un-absorbed blue light from the LED chip and red light generated in the red phosphor layer then pass through the green phosphor layer. However, primarily only the blue light from the LED chip is absorbed by the green/yellow to cause emission of green/yellow light thereby. The light from the red phosphor layer can pass through the green/yellow layer without being substantially absorbed.

The above example shown in FIG. 12 is related to a green/yellow phosphor layer on a red phosphor layer, but there can be many different phosphor layer arrangements according to the present invention. The different embodiments can include two or more phosphor layers and can be arranged so that the emission spectrum of one or more of the layers below the top layer minimally overlap or do not overlap at all with the excitation spectrum of one or more of the layers above. This present invention is not limited to two layers, and in those embodiments having more than two layers, the emission spectrum of one or both of layers below the top layer can have emission spectrum that does not overlap with the excitation spectrum of the top layer. In other embodiments, intervening layers can also be arranged according to the present invention. That is, a layer below the top layer can have an excitation spectrum that does not overlap with the emission spectrum of a layer below it. There can be many layer arrangements that follow this general relationship of emission spectrum of a layer related to the excitation spectrum of a layer above.

In LED 50, the conversion material layer arrangement provides for increased emission efficiency by minimizing or eliminating the cross absorption of emitted light from the conversion materials. By separating the phosphors in a layer arrangement, as described above, instead of conventional mixing of the phosphors, the reabsorbs ion by an conversion material layer 56b of the emitted light of the lower phosphor layer 56a can be reduced or eliminated. In the case of a green/yellow conversion layer on a red conversion layer, the reabsorption of light from the green/yellow layer by the red conversion layer can be reduced or eliminated. This reabsorption can be further minimized by providing separation between the green/yellow layer and the red layer.

The conversion material layer can be applied using different processes including but not limited to spraying, dispensing, spin coating, sputtering, printing, powder coating, electrophoretic deposition (EPD), and electrostatic deposition, among others. These processes can also include a solvent in the phosphor-binder mixture that can liquefy and lower the viscosity of the mixture. Many different solvents can be used including but not limited to toluene, benzene, zylene, or OS-20 commercially available from Dow Corning®, and different concentration of the solvent can be used. When the solvent-phosphor-binder mixture is sprayed, poured or dispersed heat from the remote phosphor evaporates the solvent and can also cure the binder in the mixture leaving a fixed phosphor layer. Various deposition methods and systems are described in U.S. Patent Application Publication No. 2010/0155763, to Donofrio et al., entitled "Systems and Methods for Application of Optical Materials to Optical Elements," and also assigned to Cree, Inc.

In LED 50, the first layer 56a is deposited such that is blanket covers the LED chips 52, the top surface of the submount 54 and the pads 64a, 64b. The second layer 56b can then be deposited so that it covers the first layer 56a, thereby providing a bi-layer blanket coverage over the LEDs 52 submount 54 and pads 64a, 64b. LED chip light and converted light from the conversion material layer can emit toward the surface of the encapsulant 58. Some of this light will be reflected at the surface of the encapsulant by total internal reflection (TIR), and can be directed back toward the submount 54. This TIR light will encounter the blanket coverage conversion material layers 56a, 56b where the conversion material can again absorb and reemit at least some of the light. Without this blanked coverage, at least some of the TIR light would be absorbed at the submounts 54 or the pads 64a, 64b. The absorption and reemission of the TIR light can increase the chances that this light will escape from the encapsulant to contribute to LED emission; thereby increasing overall LED emission efficiency. This is referred to as photon recycling as fully described in U.S. patent application Ser. No. 13/649,052, now U.S. Pat. No. 9,048,396, incorporated above.

Different embodiments can comprise other elements arranged to increase emission efficiency. In some embodiments a reflective layer can be arranged in different locations and in different ways in LED packages according to the present invention. In some embodiments the reflective layer can be on the same surface of the submount having the LED chips. The reflective layer can at least partially surround the LED chips, and can cover the surface of the submount. In some embodiments, this surface of the submount can comprise the exposed surfaces of the die attach pads around the LED chips, the top surface of the submount around the LED chips and/or any electrostatic discharge (ESD) chip. In other embodiments where the conversion material layer covers the attach pads and submount, this reflective layer can be on the conversion material layer with the conversion material between the reflective layer and the submount. In still other embodiments, the conversion material layer can be on the reflective layer, with the reflective layer between the conversion material layer and the submount. In still other embodiments, the reflective layer can cover only selective portions of the submount, on selective ones of the die attach pads, wirebonds and any ESD chip. This type of reflective layer and its advantages are generally described in U.S. patent application Ser. No. 14/183,218 to Reiherzer et al., now U.S. Pat. No. 10,424,702, which is incorporated herein by reference.

It is understood that in some embodiments, the bi-layer conversion material 56a, 56b can cover less than all of the top surface of the submount 54 and pads 64a, 64b. In some embodiments the bi-layer conversion material 56a, 56b can cover only the LED chips 52. In still other embodiments different ones of the bi-layers can cover different areas. For example, in some embodiments the first layer 56a can cover only the LED chips 52, while the second layer 56b can cover the LED chips and all or part of the top surface of the submount 54 and pads 64a, 64b. This arrangement still allows for the advantages of photon recycling as described above. These are only some of the many different conversion material coverages that can be used in different LED embodiments according to the present invention.

It is understood that in different embodiments intervening layers not having conversion materials can be included between the multiple conversion material layers. In some embodiments, these intervening layers can be substantially transparent and can be arranged to provide separation between different ones of the layers, to reduce emission or light from the different layers passing into others of the layers to further reduce reabsorption. The intervening layer(s) can also include materials to assist in scattering of the light from the LED. In some embodiments the intervening layers can comprise scattering particles or can be shaped or textured to assist in light scattering.

In some embodiments, the emission efficiency (or luminous flux measured in lumens per watt (LPW)) increase for LEDs according to the present invention with separated phosphors compared to the same LEDs with mixed phosphors, can be more than 20%. In other embodiments it can be greater than 10%, while in still other embodiments it can be greater than or approximately equal to 5%. In still other embodiments it can be in the range of 2-10%. For the embodiment shown in FIGS. 4 to 11 the increase in efficiency can be in the range of 2-10%, or approximately 5%.

The layering approach also provides further advantages such as achieving the same target emission characteristics in LED packages according to the present invention, while allowing for reduced amount of red phosphor in comparison to conventional LED chips with mixed phosphors. This can be particularly important in reducing costs based on the higher relative cost of red phosphors. In some embodiments, the same color (as measured by bin) can be achieved at the same color rendering index (CRI), using significantly less red phosphor. In some embodiments, the reduction in red phosphor compared to the same LED with mixed phosphors can be as high as approximately 75%. In other embodiments it can be as high as 50%, while in still other embodiments it can at high as 25%.

As mentioned above, different LED embodiments can have discrete conversion material layers emitting in a particular spectrum, such as one layer in yellow/green and the other in red. These discrete layers can comprise more than one phosphor type to tune the conversion material layer to provide the desired LED emission characteristics. In some embodiments the yellow/green layer can have two or more different types of yellow/green emitting phosphors and the red layer can have two different or more different red phosphors.

FIG. 13 is a table 90 comparing one embodiment of a four phosphor recipe for the bi-layered conversion material layer that can be used in LEDs according to the present invention. This recipe is compared to the same four phosphors used in a conventional LED where the phosphors are mixed in a single conversion material layer, with table 90 showing the different amounts in percentages of overall phosphor in the layer for the phosphors so that each emits at substantially the same color point and CRI. The first layer closest to the LED chips can comprise two red phosphors identified as Red1 and Red2, with each emitting at different wavelengths in the red spectrum. The two red phosphors can comprise formulas known in the art with Red1 having a shorter emission wavelength compared to the emission wavelength of the Red2 phosphor. Red phosphors generally have peak emission wavelengths in the range of 620-750 nm and in some embodiments, with some embodiment having red phosphors emitting light having peak emissions in the range of 620-670 nm with a pattern having a full width at half maximum (FWHM) in the range of 70-100 nm. In one embodiment, Red1 can have a peak emission wavelength of approximately 621 nm and a full width at half maximum (FWHM) of approximately 80 nm. Red2 can also have peak emission wavelength of approximately 651 nm with a FWHM of approximately 90 nm.

The second layer can comprise yellow and green emitting phosphors, with some embodiments comprising a $Y_3Al_5O_{12}$:Ce yellow emitting phosphor and a $Lu_{3-x}Ce_xAl_5O_{12}$,Y (Y=Halide) green emitting phosphor. Green and yellow phosphors generally have peak emission wavelengths in the range of 495-590 nm with green typically having a peak emission in the lower portion of this range and yellow having a peak emission in the higher end of this range. In some embodiments, the green and yellow phosphors emit peak emission wavelengths in the range of 520-580 nm with FWHM in the range of 100-130 nm. In some of these embodiments, the yellow emitting phosphor can have a peak emission wavelength of approximately 560 nm and a FWHM of approximately 115 nm. The green emitting phosphor can have a peak emission of approximately 534 nm and a FWHM of approximately 110 nm. It is understood that in other embodiments other phosphors can be used with other characteristics, and each of these phosphors can be provided in discrete layers such that the LED could have four phosphor layers. In these embodiments the two red phosphor layers can be closest to the LED chips. In still other embodiments, some of the phosphors can be mixed in a layer while others can be provided in discrete layers.

In the embodiment shown, the table 90 compares the amount of phosphors necessary in a two layer verses mixed conversion material to achieve target color point in for example the E8 bin, with a CRI of 90 (the LED chips can emit a blue dominant light with a wavelength of 450 and 456 nm). In this embodiment, the bi-layer approach allows for these same emission characteristics as a mixed approach, while allowing for a reduction in red phosphors. In this embodiment, the bi-layer approach the phosphor Red2 can experience a decrease of approximately 25% ratio of the overall red phosphor mixture, and more importantly can experience a reduction of greater than 70% by weight compared to the mixed phosphor approach. The phosphor Red1 can experience an increase in its overall ratio of the red phosphor mixture, but can also experience greater than 20% reduction by weight compared to the mixed layer approach. This can result in significant cost reductions for the LED chip. It is noted that the bi-layer embodiments according to the present invention can also require more yellow and green phosphor, and can require more silicone for encapsulant. These increases can be acceptable based on the relatively low cost of yellow/green phosphors and silicone, and the significant cost of red phosphors.

The different amounts of red and yellow/green bi-layer phosphor approach also result in differences in phosphor ratios of the four phosphor approach compared to the conventional mixed approach. FIG. 14 is a graph 100 showing the different ratios of phosphors for the embodiment shown in FIG. 13 comparing the ratios of the yellow/green phosphors by the amount of green phosphor divided by the amount of green phosphor plus yellow phosphor. In this embodiment, the yellow/green ratio decreases from 95% to 90% for the mixed to bi-layer embodiments. FIG. 14 also compares the ratios of red phosphors by dividing the amount of Red2 red phosphor by the combination of the Red2 and Red1 phosphors. In this embodiment, their ratio decreases from 50% for the mixed to 25% for the bi-layer approach. This is only one of the many ways of comparing the different ratios of LED according to the present invention compared to mixed conversion LEDs.

FIGS. 13 and 14 are directed to comparing mixed and bi-layer conversion material LEDs emitting at the same color point and CRE by varying the phosphor amounts. It is also understood that for mixed and bi-layer LEDs using the same amount of phosphors, the LEDs can provide different emission characteristics. The bi-layer approach can result in an LED emitting with a higher CRI compared to the same LED with the same amount of mixed phosphors. In general, and LED emission with CRI of approximately 90% can be acceptable for many applications. When taking the phosphors from a mixed conversion material LED and using the same amounts in a bi-layer LED, the bi-layer LED chip can emit with a CRI in excess of 90. The excess CRI can be traded with other LED feature characteristics to achieve the acceptable 90 CRI while increasing efficiency. In some embodiments, the excess CRI can be traded with the wavelength of the red phosphor. That is, a lower wavelength emitting red phosphor can have a higher efficiency compared to higher wavelength phosphors, but can result in a lower CRI. The excess CRI can allow for the use of lower wavelength red phosphors that still allow for LED chip emission at the desired 90 CRI. This can also allow for increased emission efficiency compared to the same LED using a mixed conversion material layer with the same phosphors.

Figure 15:
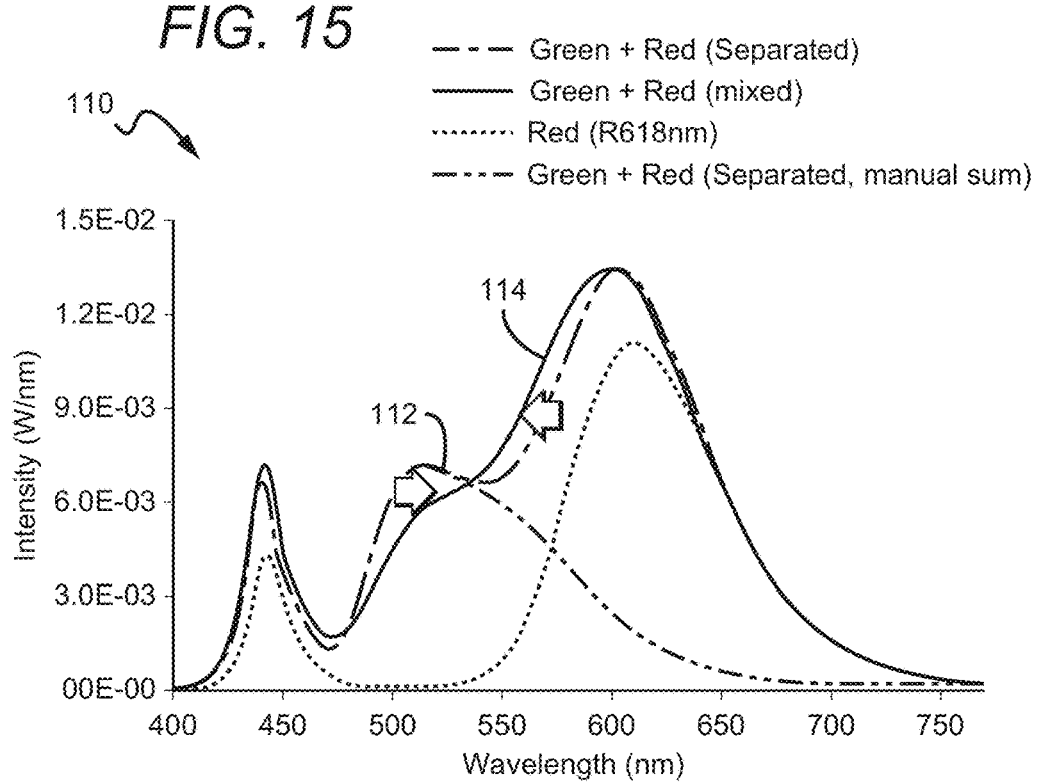
FIG. 15 is a graph showing the emission spectrum for an LED according to the present invention compared to an LED with mixed conversion materials.

FIG. 15 is a graph 110 showing a comparison of the emission characteristics for an LED with mixed phosphor compared to a similar lamp with bi-layer separate phosphors as described above. In this embodiment, the first layer comprises a red phosphor with a peak emission of approximately 615 nm, and the second layer can comprise a green phosphor. The first emission spectrum 112 is for a lamp with separated red and green phosphors, with the spectrum showing peaks in the blue, green and red wavelength spectrums. The second emission spectrum 114 is for a similar lamp with mixed red and green phosphors and shows a reduction and shift in the blue peak compared to the separated spectrum 112, as well as a shift in the red peak. The overall phosphor conversion efficiency for both is approximately the same, but the CRI for the separated is approximately 88.5 for separated phosphors verses 78.5 for the mixed phosphor configuration.

Figure 16:
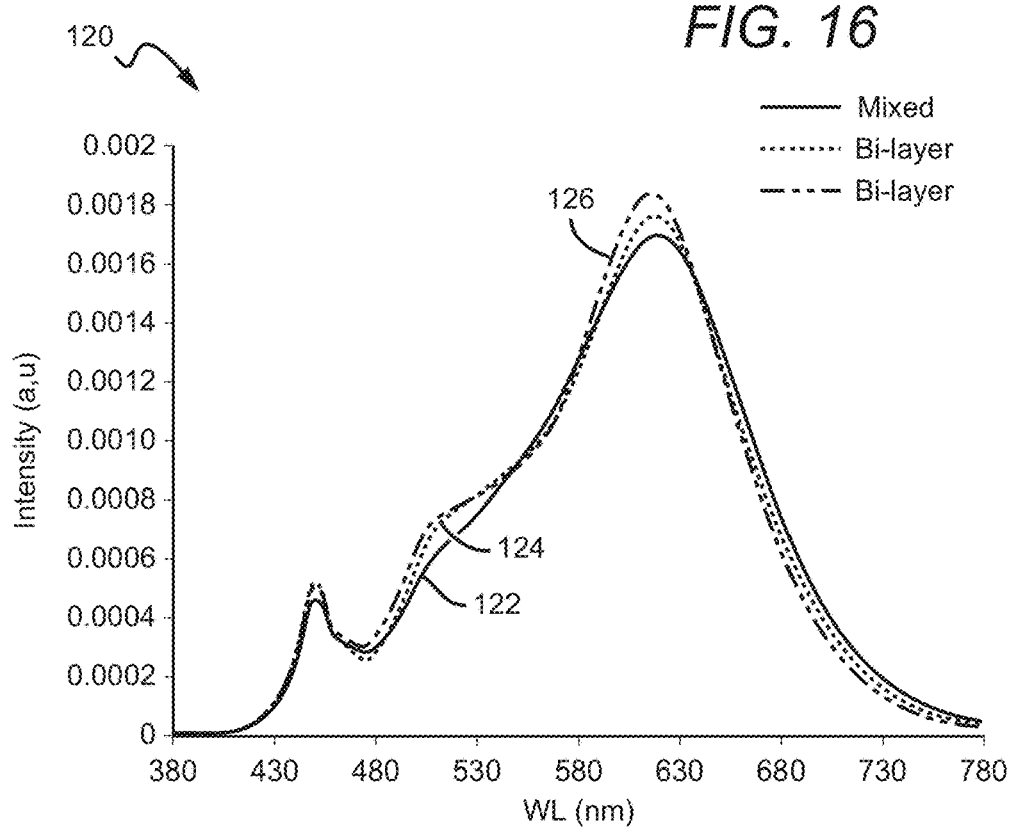
FIG. 16 is a graph showing the emission spectrum for a LED according to the present invention compared to an LED with mixed conversion materials.

FIG. 16 shows another graph 120 showing a comparison of the emission characteristics for an LED with mixed phosphor compared so a similar bi-layer separate phosphor according to the present invention. Spectrum 122 shows the emission characteristics of an LED with mixed red and yellow/green phosphors, with the tow red phosphors in a 1 to 1 ratio. Spectrum 124 shows the emission characteristics of an LED with a bi-layer conversion material with the first red phosphor layer comprising two red phosphors in a 3 to 1 ratio. Spectrum 126 shows the emission characteristics of an LED with bi-layer conversion material with the first layer comprising only one red phosphor. Like the embodiment shown in FIG. 15, the mixed embodiment shows a shifting in the blue peak and the red peak. The bi-layer approach can result in the approximately the same or improved emission efficient while at the same time providing for an improved CRI.

Figure 17:
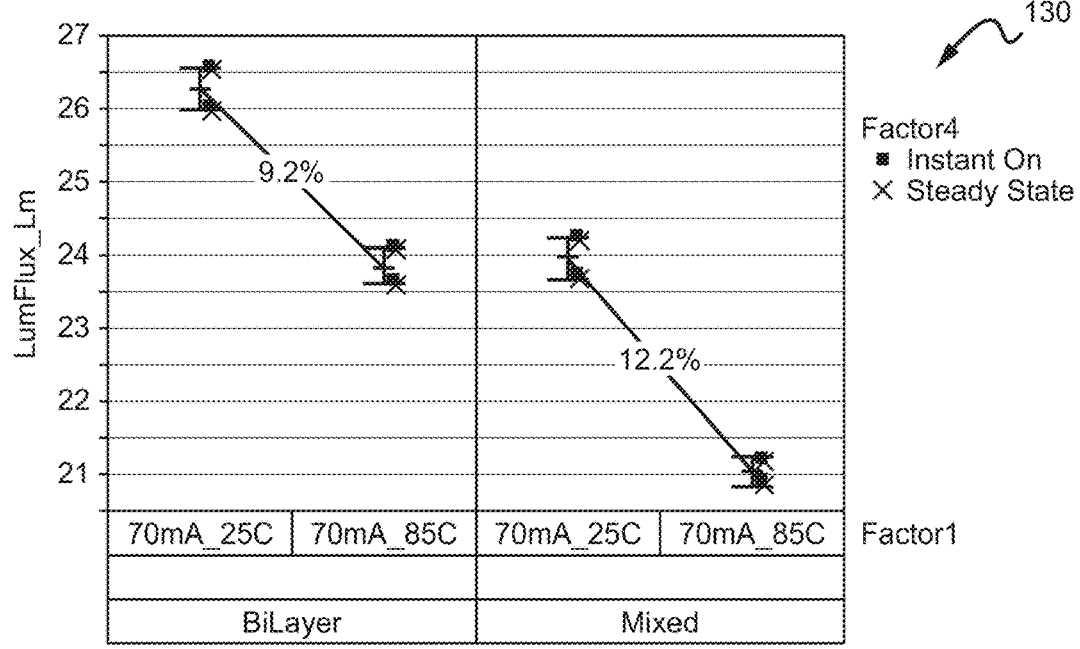
FIG. 17 is a graph showing the emission characteristics for an LED according to the present invention over temperature compared to an LED with mixed conversion materials.

It is understood that others characteristics of LEDs can also vary when comparing bi-layer conversion material embodiments to conventional mixed conversion material embodiments. For example, the mixed embodiments can experience a greater drop off in emission at increased operating temperature compared to the bi-layer approach. FIG. 17 is a graph 130 showing the emission characteristics of a bi-layer conversion LED compared to a mixed conversion LED though an operating temperature range of 25° C. to 85° C. For the embodiment shown, the luminous flux of the mixed conversion LED drops off by greater than 10% over this temperature range, while the bi-layer embodiment drops off by less than 10%. In different embodiments, the drop off in luminous flux can be in the range of 20-30%, with the graph 130 showing the mixed conversion material layer LED having a drop off of 12.2% while the bi-layer embodiment has a drop-off of 9.2%.

The above embodiments are only some of the different LED chips and materials that can be used in embodiments according to the present invention. The LED chips can emit light in spectrums other than blue and UV wavelength spectrums. The conversion material layers can comprise many different materials beyond those described above. In some embodiments, the phosphor particles comprise many different compositions and phosphor materials alone or in combination. In one embodiment the single crystalline phosphor can comprise yttrium aluminum garnet (YAG, with chemical formula $Y_3Al_5O_{12}$). The YAG host can be combined with other compounds to achieve the desired emission wavelength. In one embodiment where the single crystalline phosphor absorbs blue light and reemits yellow, the single crystalline phosphor can comprise YAG:Ce. This embodiment is particularly applicable to light emitters that emit a white light combination of blue and yellow light. A full range of broad yellow spectral emission is possible using conversion particles made of phosphors based on the (Gd, Y)$_3$(Al,Ga)$_5$O$_{12}$:Ce system, which include Y$_3$Al$_5$O$_{12}$:Ce (YAG). Other yellow phosphors that can be used for white emitting LED chips include:

Tb$_{3-x}$Re$_x$O$_{12}$:Ce (TAG);
RE=Y, Gd, La, Lu; and/or
Sr$_{2-y}$Ba$_x$Ca$_y$SiO$_4$:Eu.

In other embodiments, other compounds can be used with a YAG host for absorption and re-emission of different wavelengths of light. For example, a YAG:Nb single crystal phosphor can be provided to absorb blue light and reemit red light. First and second phosphors can also be combined for higher CRI white (i.e., warm white) with the yellow phosphors above combined with red phosphors. Various red phosphors can be used including:

Sr$_x$Ca$_{1-x}$S:Eu,Y; Y=halide;
CaSiAlN$_3$:Eu; or
Sr$_{2-y}$Ca$_y$SiO$_4$:Eu.

Other phosphors can be used to create saturated color emission by converting substantially all light to a particular color. For example, the following phosphors can be used to generate great saturated light:

SrGa$_2$S$_4$:Eu;
Sr$_{2-y}$Ba$_y$SiO$_4$:Eu; or
SrSi$_2$O$_2$N$_2$:Eu.

The following lists some additional suitable phosphors that can be used as conversion particles, although others can be used. Each exhibits excitation in the blue and/or UV emission spectrum, provides a desirable peak emission, has efficient light conversion:

Yellow/Green
(Sr,Ca,Ba) (Al,Ga)$_2$S$_4$: Eu$^{2+}$
Ba$_2$(Mg,Zn) Si$_2$O$_7$:Eu$^{2+}$
Gd$_{0.46}$Sr$_{0.31}$Al$_{1.23}$O$_x$F$_{1.38}$:Eu$^{2+}$$_{0.6}$
(Ba$_{1-x-y}$Sr$_x$Ca$_y$) SiO$_4$:Eu
Ba$_2$SiO$_4$=Eu$^{2+}$
Red
Lu$_2$O$_3$=Eu$^{3+}$
(Sr$_{2-x}$La$_x$)(Cei$_{-x}$Eu$_x$)O$_4$
Sr$_2$C$_{1-x}$Eu$_x$O$_4$
SrTiO$_3$:Pr$^{3+}$, GA$^{3+}$
CaAlSiN$_3$IEu$^{2+}$
Sr$_2$Si$_5$N$_8$=Eu$^{2+}$ In some embodiments, the layer comprising luminophoric material, the optical coupling layer and/or the optically transparent structure may also provide a functional layer which comprises a light scattering layer, which comprises a binder material as discussed above and light scattering particles, for example titanium oxide particles. In other embodiments, the layer comprises materials to alter the refractive index of the functional layer. In some embodiments, the functional layer comprises a combination of one or more of the types of functional layers described herein (e.g. a wavelength conversion layer and a scattering or refractive index altering layer).

In some embodiments, the LED die is configured to emit blue light, for example light having a dominant wavelength of about 450-460 nm, and the phosphor layer comprises yellow phosphor, such as YAG:Ce phosphor, having a peak wavelength of about 550 nm. In other embodiments, the LED die is configured to emit blue light, and the phosphor layer may comprise a mixture of yellow phosphor and red phosphor, such CASN-based phosphor. In still other embodiments, the LED die is configured to emit blue, and the phosphor layer may comprise a mixture of yellow phosphor, red phosphor and green phosphor, such as LuAG:Ce phosphor particles. Moreover, various combinations and subcombinations of these and/or other colors and/or types of phosphors may be used in mixtures and/or in separate layers.

Alternate wavelength conversion materials may also be used to down-convert light to generate white emissions. Such materials may be, but are not limited to organic fluorescent materials or dyes or inorganic quantum dot materials such as CdSe/ZnS, InP/InAs, CdS/CdSe, CdTe/CdSe or others.

The conversion material can comprise different sized phosphor particles including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light.

The conversion material layer 56 can have many different thicknesses depending at least partially on the concentration of conversion material, the size of the conversion material particles, and the desired amount of light to be converted by the conversion material. Conversion material layer according to the present invention can be in a binder with phosphor concentration levels (phosphor loading) above 30%. Other embodiments can have concentration levels above 50%, while in still others the concentration level can be above 60%.

The LEDs according to the present invention can have many different relative thicknesses, with some embodiments comprising a first layer that is closest to the LED chip having the longest emission wavelength of the LED's phosphors. The second layer moving away from the LED chip(s) can be thicker and can have a smaller emission wavelength than the first layer. Additional layers moving away from the LED chip can be thicker and/or can have smaller emission wavelengths than the layers below. In some embodiments the layers can become progressively thicker moving away from the LED chip, while in other embodiments the layers need only be thicker than the first layer. Likewise, in some embodiment the emission wavelengths of the layers can become progressively smaller moving away from the LED chip, with in other embodiments the emission wavelengths need only be smaller than the first layer's emission wavelength.

For LED 50, the bi-layer conversion material layer can have an overall thickness in the range of 50-500 μm, with some embodiments having an overall in the range of 75-300 μm and others having an overall thickness in the range of 100-200 μm. Thickness may also vary across the layer, with different regions having different thicknesses. The first conversion material layer 56a can be different percentages of the overall thickness of the conversion material layer. In some embodiments, the first layer 56a can comprise 5-30% of the overall thickness of the conversion material layer, while in other embodiments it can comprise 10-20% of the overall layer thickness. When measuring the thickness of the layers over the LED chips (or LED chip in other embodiments) the first layer can have many different thicknesses, such as in the range of approximately 10-70 μm. Other embodiments having a thickness in the range of approximately 15-60 μm and still other embodiments a thickness in the range of approximately 20-50 μm. In some embodiments, the first layer over the LED chip can have a thickness greater than approximately 10 µm, while other embodiments can have thicknesses greater than approximately 20 µm. The thickness of the second layer over the LED chips can have a thickness in the range of approximately 40-400 µm, with other embodiments having a thickness in the range of approximately 75-300 µm. Still other embodiments can have a thickness in the range of approximately 90-250 µm. In some embodiments, the first layer can have a thickness greater than approximately 50 µm, while other embodiments can have a thickness greater than approximately 100 µm.

It is understood that these thicknesses and percentages can vary in different conversion material regions and that the conversion material layer can also have different regions in the respective layers with different concentrations of phosphor particles.

Different embodiments according to the present invention can provide the conversion material layers covering the LED chips in different ways. In some embodiments, the first red phosphor layer can comprise a substantial conformal coating over the LED chips, with the yellow/green conversion material layer covering the LED chips and filling gaps between the LEDs chips. In still other embodiments both layers can comprise a conformal coating or both layers can layer covering and substantially filling the gaps between adjacent LED chips.

Figure 18:
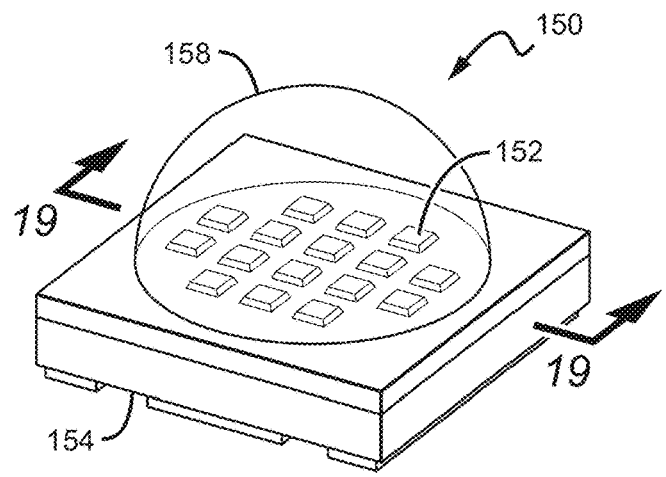
FIG. 18 is a perspective view of one embodiment of an LED according to the present invention.
Figure 19:
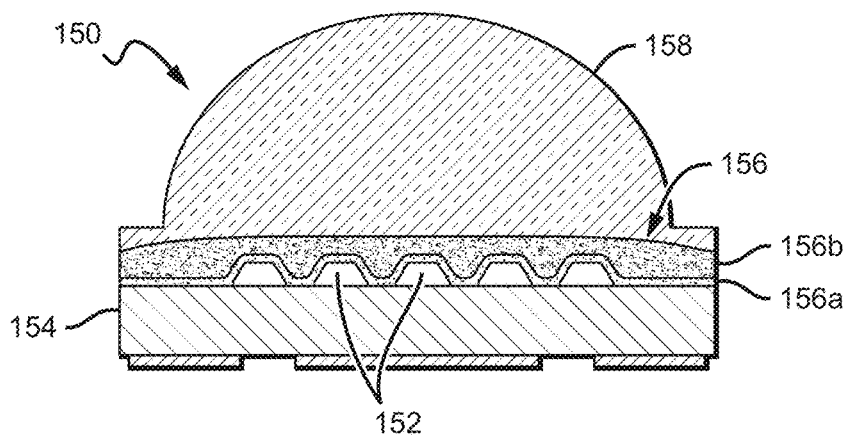
FIG. 19 is a sectional view of the LED shown in FIG. 17 taken along section lines 18-18.

It is understood that the different embodiments of the present invention can be arranged in many different ways beyond the embodiment shown above. By way of example, other embodiments can have different numbers of LED chips coupled to solder pads and die attach pads in different ways, different encapsulants, different conversion material layers, and without submounts. FIGS. 18 and 19 show another embodiment of LED 150 according to the present invention that can comprise LED chips 152 on a submount 154. The submount 154 can comprise die attach pads and solder pads similar to those described above in LED 50. Instead of two LED chips, the LED 150 comprises an array of LED chips 152 and it is understood that the array can comprise many different numbers of LEDs coupled together in different parallel and serial arrangements. In the embodiment shown, array of LED chips 152 comprises 16 serially connected LED chips. The LED package is arranged similarly to the commercially available Cree® XLamp® XT-E High Voltage LED, with the LED 150 having a layered conversion material layer as described herein.

Like the embodiment above, the conversion material layer 156 can comprise a bi-layer conversional material layer blanket covering the exposed top surfaces of the submount 154, die attach pads and the LED chips 152. The bi-layer conversion material layer 156 can be made of many of the same materials and deposited in the same manner as the conversion material layers above. Like the embodiments above, the conversion material layer 156 can comprise a first layer 156a that absorbs LED chip light and emits in the red spectrum, and a second layer 156b that absorbs LED chip light and emits light in the yellow/green wavelength spectrum. The LED chips can emit many different colors of light, and in some embodiments some of the LED chips can emit different colors of light than the others of the LED chips. In one embodiment, the LED chips 152 can emit blue light, with the LED 150 emitting a white light combination of LED chip light and conversion material light.

The bi-layer conversion material arrangement in LED 150 can provide the advantages discussed above in regards to LED 150, including but not limited to reduced red phosphor, tuning capabilities based on higher CRI, and different bi-layer recipes. In this embodiment, the first red layer 156a forms a relatively thin layer that conformally coats over the LED chips 152. The yellow/green layer 156b is relatively thick and also covers the LED chips 152 and can be thick enough to fill the space between adjacent ones of the LED chips 152. The resulting conversion material layer 156 can comprise a relatively smooth top surface, with the LED chips embedded in the conversion material layer 156. The conversion material layer 156 in LED 150 can have many different thicknesses, with the first layer 156a being different percentages of the overall layer thickness. In some embodiments, the conversion material layer can be in the range of 50-500 µm, with the layer generally being thinner over the top of the LED chips 152 and thicker between and around the LED chips 152. In some embodiments, the conversion material layer can have a thickness in the range of 100-250 µm. The thickness of the first layer 156a can be in range of 10-40% of the overall thickness of the conversion material layer 156. In still other embodiments it can be approximately 20-35% of the overall thickness. Some LED embodiments can comprise a first conversion material layer having a thickness less than 200 µm, and a second conversion layer having a thickness greater than the first conversion material layer and less than 300 µm.

The LED 150 can also comprise an encapsulant 158 made of the same materials as the encapsulant 58 in LED 50 described above. In LED 150, however, the encapsulant has a generally hemispheric shape. It is understood that many different encapsulants can be used in this embodiment, including those with planar surfaces.

Figure 20:
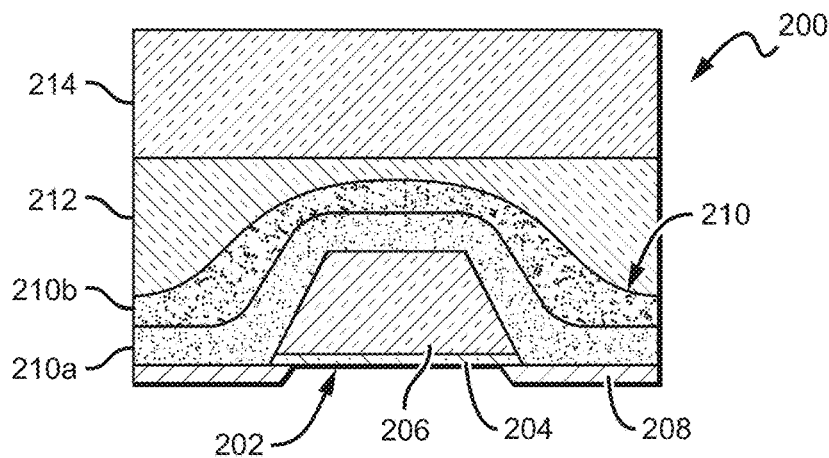
FIG. 20 is a sectional view of another embodiment of an LED according to the present invention.

FIG. 20 shows still another embodiment of an LED 200 according to the present invention that can be provided without a submount. LED 200 is similar to LEDs devices described in U.S. patent application Ser. No. 14/152,829, now U.S. Pat. No. 9,954,144, which is incorporated herein by reference, with the LED devices in this reference having mixed phosphor layers. The LED 200 includes a LED chip 202 that can comprise any of the LED chips described above, and generally includes a diode region 204 and a transparent substrate 206, such as a transparent silicon carbide growth substrate or a transparent sapphire growth substrate. In other embodiments, the growth substrate may be removed. In still other embodiments, another substrate may be provided that is different from the growth substrate, and the other substrate may be bonded to the LED epi region after removing the growth substrate.

The transparent substrate 206 may include angled sidewalls and in some embodiments, the sidewalls may be stepped, beveled and/or faceted. Non-oblique sidewalls and approximately equal size faces may also be provided in other embodiments. For example, a square or rectangular chip with straight or non-oblique sidewalls may also be used in some embodiments. The LED 200 also comprises a reflective layer 208, which can below the bottom surface of the LED chip 202. In some embodiments, this may also comprise a submount or any other feature.

A conversion material layer 210 is provided over the LED chip 202 and the reflective layer reflective layer. It is understood that the phosphor layer can be arranged in any of the ways described above, and in the embodiment shown comprises a bi-layer conversion material layer, with a first layer 210a on the LED chip 202 and a second layer 210b on the first layer 210a. The layers can comprise different conversion materials or phosphors as described above, with the embodiment shown having first layer 210a with a red phosphor and a second layer 210b with a yellow/green phosphor. In some embodiments, the conversion material layer 210 can also comprise a light scattering material such as, for example, titanium oxide particles. In other embodiments, the layer comprises materials to alter the refractive index of the layer.

The LED 200 also comprises an outer transparent layer 212 that provides a primary optic and can comprise any of the encapsulant materials described above, and in the embodiment shown the layer 212 can comprise silicone. The transparent layer 212 can be free of phosphors and may be shaped to provide a lens, dome and/or other optical components. The transparent layer 212 that is free of phosphor can also encapsulate the conversion material and/or the LED chip 202. In still other embodiments, the transparent layer may be provided on a phosphor layer that comprises phosphor particles that are non-uniformly dispersed therein. The device may further include an additional encapsulant or lens 214, which may be silicon or glass.

The bi-layer conversion material arrangement in LED 200 can comprise any of the materials described above that can be deposited using any of the methods described above. In LED 200, the bi-layer conversion material arrangement provides blanket coverage over the LED chip 202, with it is understood that one or both of the layers 210*a*, 210*b* can provide less than full blanket coverage as described above. The conversion material layer can have different thicknesses, with some embodiments having thicknesses in the range of 50-500 μm. Still other embodiments can have thicknesses in the range of 50-300 μm. The first layer 210*a* can comprise different percentages of the overall layer thickness, with some embodiments having a percentage in the range of 5-30%. In other embodiment, the first layer can comprise a percentage in the range of 8-15%.

Figure 21:
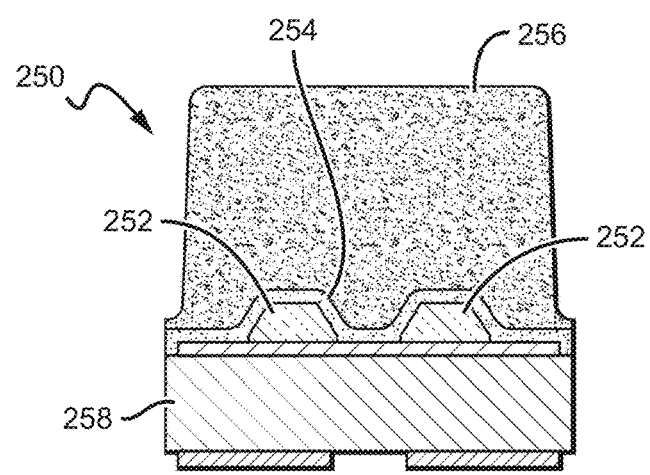
FIG. 21 is a sectional view of another embodiment of an LED according to the present invention.

FIG. 21 shows still another embodiment of an LED 250 according to the present invention that is similar to the LED 50 described above and shown in FIGS. 4 to 11 and comprises many of the same features. In this embodiment, however, the conversion material layer(s) and the encapsulant are arranged in different manner. For LED 250 the conversion material layer 254 comprises a single layer blanket covering the LED chips 252, the submount 258 and die attach pads as described above, although in other embodiments it can cover less than all of these features. The layer 254 absorbs light from the LED chips 252 and emits light in a particular wavelength spectrum such as in the red wavelength spectrum. The layer 254 can comprise the red emitting phosphors deposited in the different ways as described above. Instead of having a second conversion material layer on the first, the second conversion material is dispersed in the encapsulant 256. In the embodiment shown, the dispersed conversion material can be one or more of the yellow/green phosphors described above. The phosphor can be dispersed evenly in the encapsulant or can having different areas with different concentrations.

The emission wavelength spectrum of the red phosphor layer can be outside of the excitation spectrum of the yellow/green phosphor so that it can pass through the yellow/green phosphor without being absorbed. By dispersing the yellow/green phosphor in the encapsulant, the likelihood of reemitted light from the yellow/green phosphor passing back into the red phosphor layer is reduced. This reduces the chance that the yellow/green light with be reabsorbed in the red layer.

It is understood that there can be many different layered and dispersed phosphor arrangements in other embodiments according to the present invention. There can be more than one phosphor layer over the LED chips used in conjunction with a dispersed phosphor. There can be one or more layers used in conjunction with an encapsulant having more than one dispersed phosphor. It is also understood that this layered/dispersed combination can be used in any of the different LED embodiments according to the present invention.

Figure 22:
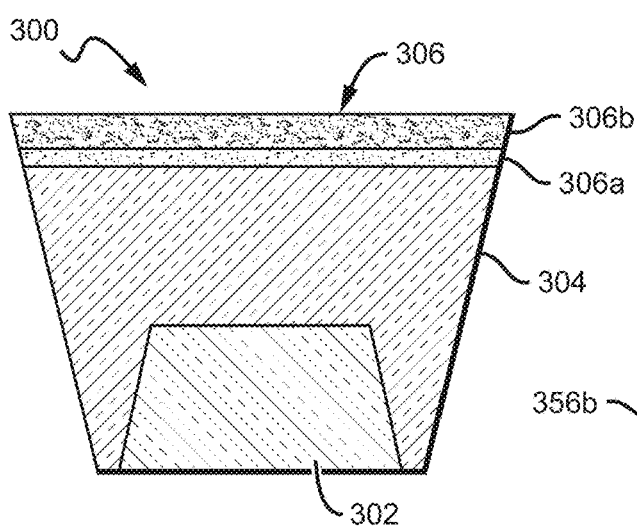
FIG. 22 is a sectional view of another embodiment of an LED according to the present invention.

Other LED embodiments according to the present invention can also provide separation between the LED chips and the layered conversion material layer or can provide separation between ones of the layers in the layered conversion material layer. FIG. 22 shows another embodiment an LED 300 according to the present invention comprising an LED chip 302 that can be any of the LED chips described above. A transparent encapsulant 304 is included over the LED chip 302 that can also comprise any of the materials described above. The encapsulant 304 can take many different shapes and sizes with the embodiment shown having angled side surfaces such that the top of the encapsulant 304 is wider than the portion close to the LED chip 302.

A second conversion material layer 306 is also included on the top surface of the encapsulant that can comprise the materials described above and can be deposited using the methods described above. Like above, the conversion layer can be bi-layered with the first layer (closed to the LED chip) 306*a* comprising a phosphor that absorbs light from the LED chip 302 and reemits light in the red wavelength spectrum. A second layer 306*b* can be on the first layer 306*a* and can comprise a phosphor that absorbs LED chip light and emits light in the yellow/green spectrum. The LED 300 can emit the desired white light combination of LED chip light and light from the first and second layer 306*a*, 306*b*. It is understood that different embodiments of the present invention can comprise conversion material with more than two layers.

Figure 23:
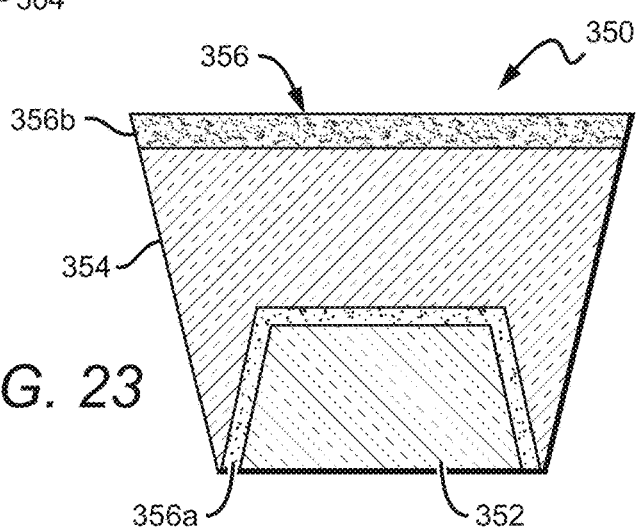
FIG. 23 is a sectional view of still another embodiment of an LED according to the present invention.

FIG. 23 shows another embodiment of an LED 350 according to the present invention that is similar to LED 300, and comprises an LED chip 352 and an encapsulant 354. The conversion material in this embodiment comprises two layers, but the layers are separate by the encapsulant 354. The first conversion material layer 356*a* directly covers the LED chip 352 and can comprise a red emitting phosphor as described above. The second conversion material layer 356*b* can be separated from the first layer 356*a* and can be on the top surface of the encapsulant 354. Like the embodiments above the second layer can comprise a yellow/green emitting phosphor. Separating the first and second layers 356*a*, 356*b* further reduces the amount of yellow/green light from the second layer 356*b* that might pass into the first layer 356*a*. This further reduces the chances the yellow/green light might be reabsorbed by the first layer. This can further increase the emission efficiency of the LED 350.

It is understood that these LED can be arranged in many different ways with the encapsulants, with other embodiments used with more than two layers arranged in different locations in the LED. Some can have more than one layer on the LED chip, on the top surface of the encapsulant, or can have one or more layers embedded within the encapsulant. Still other embodiments can have one or more phosphors dispersed in the encapsulant.

As mentioned above, different embodiments according to the present invention can use less than or more than four different phosphors arranged in different ways. In some embodiments, a bi-layer approach can use less than four, with some having one of the layers with two phosphors emitting in the red or yellow/green spectrum, with the other layer having one red phosphor or yellow/green phosphor. These embodiments utilize a total of three phosphors.

Other embodiments can utilize only two phosphors, with the first layer having one phosphor emitting in the red spectrum and the second layer having one phosphor emitting in the yellow/green spectrum. The two phosphors can be tailored to achieve the desired emission characteristics with fewer different phosphors. As described above, LEDs with single layer mixed phosphor deposition do not exhibit the same benefits according to the present invention compared to LEDs having first layer of single red phosphor and then a layer of a single yellow/green phosphor. A first, relatively thin layer of red phosphor can be applied first with an optical silicone, with the phosphor having a peak wavelength of ~630 um. A thicker second layer of green phosphor having a peak wavelength of ~539 can then be applied on the first layer. This combination can result in an LED that emits light in the E7 color region, with a CRI >90, CRI9 >40 and a brightness increase of approximately 15%, compared to the same LED with a single mixed layer of the same two phosphors. Other embodiments, the LED chip can experience a brightness increase of greater that approximately 10%. In other embodiments, the LED chip can experience a brightness increase of approximately 15% or more.

If the same red and green phosphors are used in an LED in a mixed single layer approach, the CRI of light emitted by the LED will not reach 90. Reaching a CRI of 90 in mixed layer LED can require 3 or 4 phosphors, with some utilizing one or more additional phosphors such as an additional red phosphor with a peak wavelength of ~651 nm. Some embodiments can include other additional phosphors, such as one or more yellow and green phosphors. However, for some LEDs the addition of a yellow phosphor to the two red and one green phosphor combination may not significantly add to the LED's ability to reach emission with a CRI of 90. In these embodiments, two reds have the greatest impact on the ability of the LED chip to reach a CRI of 90 in a single mixed layer system, which can be one of the reasons that the mixed layer system emits a lower luminous flux.

FIGS. 24 and 25 show another embodiment of an LED 370 according to the present invention at different points during its manufacturing. The LED 370 comprises a plurality of LED chips 372 mounted on die attach pad 374. Different embodiments can have different numbers of LED chips 372, with the embodiment shown having 48. The LEDs can comprise and of the chips listed above, and can emit at different wavelengths and with different characteristics as those described above. In different embodiments, the LED chips 372 can be connected in series, parallel or in different series/parallel combinations. The die attach pad 374 can be arranged on a submount 376 as described above, and the LED 370 can comprise other elements, such as an ESD chip 378.

Referring now to FIG. 24, the LED 370 can comprise a first phosphor layer 380 comprising a red layer of phosphor with a peak wavelength of ~630 um. In some embodiments the red phosphor layer 380 can provide blanket coverage over the LED chips 372, attach pads 374 and submount 376 as described above. However, in this embodiment, the red phosphor layer 380 does not provide a solid blanket covering, but instead is provided with irregular coverage. Irregular generally refers to the layer 380 not having a uniform thickness. In some embodiments the layer 380 can be discontinuous and may not provide coverage over portions of the LED chips 372, attach pads 374 and submount 376. In these embodiments the discontinuous nature of the layer 380 can be random, while in other embodiments the discontinuities can have some order or pattern. For all these embodiments, the red phosphor is provided in the appropriate amount of red for the targeted emission characteristics. More evenly deposited red phosphor can result in better color targeting, but even deposition is not required. More even deposition can be achieved through optimizing atomization during the deposition process.

Referring now to FIG. 25, a second layer 382 of green phosphor having a peak wavelength of ~539 is deposited over the first red phosphor layer 380. The second layer 382 is thicker than the first layer 380, and is also applied in a conformal manner. However, the second layer 382 provides blanket coverage over the LED chips 372, attach pad 374, and the submount 376. The first and second layers 380, 382 can be arranged with different materials with the embodiment shown having a relatively small amount of fumed silica of less that 1% per silicone weight. In some embodiments, the layers can have fumed silica in the amount of approximately 0.75% per silicone weight. Fumed silica is mixed with the phosphors aid in the LED reaching the target emission. This may not be required for the performance results, but is recommended for consistency of application. The LED 370 can also comprise an encapsulant that can be formed during a subsequent formation step, and the encapsulant can comprise any of the materials, shapes and sizes described above.

The embodiments presented herein are meant to be exemplary. Embodiments of the present invention can comprise any combination of compatible features shown in the various figures, and these embodiments should not be limited to those expressly illustrated and discussed.

Although the present invention has been described in detail with reference to certain preferred configurations thereof, other versions are possible. Therefore, the spirit and scope of the invention should not be limited to the versions described above.

We claim:

1. An LED component, comprising:
one or more LEDs on a surface of a submount;
a conversion material layer comprising at least first and second layers, said first layer comprising two or more different conversion materials having different peak emission wavelengths and emitting light in the same first wavelength spectrum, said second layer comprising two or more different conversion materials having different peak emission wavelengths and emitting light in the same second wavelength spectrum that is different from said first wavelength spectrum, said at least first and second layers arranged such that said first layer is closest to said one or more LEDs and has an emission spectrum that does not substantially overlap with the excitation spectrum of said second layer;
an encapsulant over said one or more LEDs, said conversion material layer, and said submount;
wherein said first layer fully conformally coats said one or more LEDs and continues over all of a top surface of said submount, said second layer covering said first conversion material layer, and
wherein the first layer thickness is approximately 40% or less of the overall thickness of said first and second conversion material layers, wherein said conversion material layer at least partially contacts a first portion of said encapsulant, wherein a second portion of said encapsulant is spaced from said conversion material layer.

2. The LED component of claim 1, wherein said first wavelength spectrum comprises the red emission spectrum and said second wavelength spectrum comprises the yellow/green emission spectrum.

3. The LED component of claim 1, wherein said first layer comprises two or more red emitting phosphors and said second layer comprises one or more yellow/green emitting phosphors.

4. The LED component of claim 3, wherein said red emitting phosphors are between said one or more LEDs and said yellow/green emitting phosphors.

5. The LED component of claim 3, wherein said red emitting phosphors are directly on said one or more LEDs and said yellow/green emitting phosphors are directly on said red emitting phosphors.

6. The LED component of claim 1, wherein there is separation between said one or more LEDs and said first layer.

7. The LED component of claim 3, wherein there is separation between said red emitting phosphors and said yellow/green emitting phosphors.

8. The LED component of claim 1, wherein one of said at least first and second layers below the top one of said layers emits a wavelength of light that does not substantially overlap with the excitation spectrum of one of the layers above it.

9. The LED component of claim 1, wherein the said at least first and second layers are on one another, wherein the emission wavelength of one of the layers below the top one of said layers is longer than the emission wavelength of the top one of said layers.

10. The LED component of claim 1, wherein one of the at least first and second layers below the top one of said layers conforms to said one or more LEDs.

11. The LED component of claim 1, wherein said at least first and second layers conform to said one or more LEDs.

12. The LED component of claim 1, further comprising a reflective layer between said at least first and second layers and said submount.

13. The LED component of claim 3, wherein the emission spectrum of said red phosphors does not substantially overlap with the excitation spectrum of said yellow/green phosphors.

14. The LED component of claim 3, wherein less emitted light from said yellow/green phosphors passes through said red phosphors compared to the same LED comprising a conversion material layer with mixed red and yellow/green phosphors.

15. The LED component of claim 3, wherein less emitted light from said yellow/green phosphors is absorbed by said red phosphors compared to the same LED comprising a conversion material with mixed red and yellow/green phosphors.

16. The LED component of claim 3, emitting light at a higher CRI compared to the same LED comprising a conversion material with mixed red and yellow/green phosphors with the same amount of red and yellow phosphors.

17. The LED component of claim 1, wherein said encapsulant comprises planar surfaces.

18. The LED component of claim 1, wherein said encapsulant is hemispheric.

19. The LED of claim 1, wherein said two or more conversion material layers comprise:
a first conversion material layer having a thickness less than 200 µm; and
a second conversion layer having a thickness greater than the first conversion material layer and less than 300 µm.

20. The LED of claim 1, wherein said two or more conversion material layers comprise:
a first conversion material layer and a second conversion material layer different from and on said first conversion material layer, wherein the overall thickness of said first and second conversion material layers is less than 500 µm, and where the first conversion material layer thickness is no greater than 40% of said overall thickness.

21. The LED of claim 1, wherein said two or more conversion material layers comprise:
a first conversion material layer on said LED chips; and
a second conversion material layer on said first conversion material layer, said second conversion material layer being thicker than said first conversion material layer and having an emission wavelength shorter than said first conversion material layer.

22. An LED component, comprising:
one or more LEDs on a surface of a submount;
a first conversion material layer fully conformally said one or more LEDs and continues over an entire top surface of said submount;
a second conversion material layer, said first conversion material layer between said second conversion material layer and said submount; and
an encapsulant over said one or more LEDs, said first and second conversion material layers, and said submount;
wherein said first conversion material layer comprises an emission spectrum that does not substantially overlap an emission spectrum of said second conversion material layer, wherein said second conversion material layer at least partially covers said first conversion material layer, and
wherein the first conversion material layer thickness is approximately 40% or less of the overall thickness of said first and second conversion material layers, wherein said second conversion material layer at least partially contacts a first portion of said encapsulant, wherein a second portion of said encapsulant is spaced from said second conversion material layer.

23. The LED component of claim 22, wherein said emission spectrum of said first conversion material layer comprises red light.

24. The LED component of claim 23, wherein said emission spectrum of said second conversion material layer comprises yellow/green light.

25. The LED component of claim 24, wherein said first conversion material layer comprises red phosphor and said second conversion material layer comprises yellow/green phosphor.

26. The LED component of claim 25, wherein said first conversion material layer comprises a conformal layer with one or more recesses, wherein said second conversion material layer at least partially fills at least one of said one or more recesses.

27. The LED component of claim 22, wherein said second conversion material layer comprises blanket yellow/green coverage over said one or more LEDs.

* * * * *

UNITED STATES PATENT AND TRADEMARK OFFICE
CERTIFICATE OF CORRECTION

PATENT NO. : 11,251,164 B2
APPLICATION NO. : 14/453482
DATED : February 15, 2022
INVENTOR(S) : Fan Zhang et al.

It is certified that error appears in the above-identified patent and that said Letters Patent is hereby corrected as shown below:

On the Title Page

And page 2, at item (63):
Replace "Continuation-in-part of application No. 13/028,863, filed on Feb. 16, 2011, now Pat. No. 9,275,979, which is a continuation-in-part of application No. 13/649,052, filed on Oct. 10, 2012, now Pat. No. 9,048,396."
With --Continuation-in-part of application No. 13/028,863, filed on Feb. 16, 2011, now Pat. No. 9,275,979, and a continuation-in-part of application No. 13/649,052, filed on Oct. 10, 2012, now Pat. No. 9,048,396.--.

In the Claims

Claim 22, Column 28, Lines 22-23, replace "a first conversion material layer fully conformally said one or more LEDs" with --first conversion material layer fully conformally coating said one or more LEDs--.

Signed and Sealed this
Thirty-first Day of May, 2022

Katherine Kelly Vidal
*Director of the United States Patent and Trademark Office*